(12) United States Patent
Liao et al.

(10) Patent No.: US 12,015,099 B2
(45) Date of Patent: Jun. 18, 2024

(54) SEMICONDUCTOR SENSOR AND METHODS THEREOF

(71) Applicant: Taiwan Semiconductor Manufacturing Co., Ltd., Hsinchu (TW)

(72) Inventors: Yin-Kai Liao, Taipei (TW); Jen-Cheng Liu, Hsin-Chu (TW); Kuan-Chieh Huang, Hsinchu (TW); Chih-Ming Hung, Changhua County (TW); Yi-Shin Chu, Hsinchu (TW); Hsiang-Lin Chen, Hsinchu (TW); Sin-Yi Jiang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 220 days.

(21) Appl. No.: 17/337,265

(22) Filed: Jun. 2, 2021

(65) Prior Publication Data

US 2022/0037552 A1 Feb. 3, 2022

Related U.S. Application Data

(60) Provisional application No. 63/060,059, filed on Aug. 1, 2020.

(51) Int. Cl.
*H01L 31/18* (2006.01)
*H01L 27/146* (2006.01)
*H01L 31/0288* (2006.01)

(52) U.S. Cl.
CPC .... *H01L 31/1804* (2013.01); *H01L 27/14643* (2013.01); *H01L 27/14689* (2013.01); *H01L 31/0288* (2013.01)

(58) Field of Classification Search
CPC ............. H01L 31/1804; H01L 31/0288; H01L 31/02005; H01L 31/105; H01L 31/1808;
(Continued)

(56) References Cited

U.S. PATENT DOCUMENTS 6,306,678 B1  10/2001  Chiang et al.
6,350,127 B1  2/2002  Chiang et al.
(Continued)

FOREIGN PATENT DOCUMENTS

CN  101022118 A  8/2007
CN  102651372 A  8/2012
(Continued)

*Primary Examiner* — Sitaramarao S Yechuri
(74) *Attorney, Agent, or Firm* — Haynes and Boone, LLP

(57) ABSTRACT

A method and structure providing an optical sensor having an optimized Ge—Si interface includes providing a substrate having a pixel region and a logic region. In some embodiments, the method further includes forming a trench within the pixel region. In various examples, and after forming the trench, the method further includes forming a doped semiconductor layer along sidewalls and along a bottom surface of the trench. In some embodiments, the method further includes forming a germanium layer within the trench and over the doped semiconductor layer. In some examples, and after forming the germanium layer, the method further includes forming an optical sensor within the germanium layer.

20 Claims, 47 Drawing Sheets

(58) Field of Classification Search
CPC ......... H01L 27/14643; H01L 27/14689; H01L 27/14636; H01L 27/14687; H01L 27/14683; H01L 27/14607; H01L 27/14692; H01L 27/1463; H01L 27/14698

See application file for complete search history.

(56) References Cited

U.S. PATENT DOCUMENTS

| | | | |
|---|---|---|---|
| 6,514,785 B1 | 2/2003 | Chiang et al. | |
| 6,627,475 B1 | 9/2003 | Yang et al. | |
| 7,061,028 B2 | 6/2006 | Yaung et al. | |
| 9,923,013 B1 | 3/2018 | Yamashita | |
| 2005/0127275 A1* | 6/2005 | Yang | H01L 31/1055 |
| | | | 250/214 R |
| 2009/0101909 A1 | 4/2009 | Chen et al. | |
| 2010/0006961 A1 | 1/2010 | Yasaitis | |
| 2010/0078680 A1* | 4/2010 | Cheng | H01L 21/02532 |
| | | | 257/292 |
| 2010/0151619 A1* | 6/2010 | Yasaitis | H01L 27/1443 |
| | | | 438/93 |
| 2011/0278436 A1* | 11/2011 | Rhodes | H01L 27/14629 |
| | | | 977/755 |
| 2012/0193692 A1* | 8/2012 | Kawahito | H01L 27/14689 |
| | | | 257/292 |
| 2017/0125413 A1* | 5/2017 | Wu | H01L 21/76224 |
| 2017/0141153 A1 | 5/2017 | Lee et al. | |
| 2019/0267498 A1* | 8/2019 | Cheng | H01L 31/0745 |
| 2020/0105812 A1 | 4/2020 | Sze | |
| 2020/0158954 A1 | 5/2020 | Coolbaugh et al. | |
| 2020/0161364 A1 | 5/2020 | Na et al. | |
| 2020/0395393 A1* | 12/2020 | Cheng | G01S 7/4914 |
| 2021/0320217 A1* | 10/2021 | Levy | H01L 31/028 |

FOREIGN PATENT DOCUMENTS

| | | |
|---|---|---|
| CN | 106206629 A | 12/2016 |
| CN | 110729233 A | 1/2020 |
| CN | 110970451 A | 4/2020 |
| JP | 2008047911 A | 2/2008 |
| KR | 20120060915 A | 6/2012 |
| TW | 201351512 A | 12/2013 |
| TW | 202013698 A | 4/2020 |

\* cited by examiner

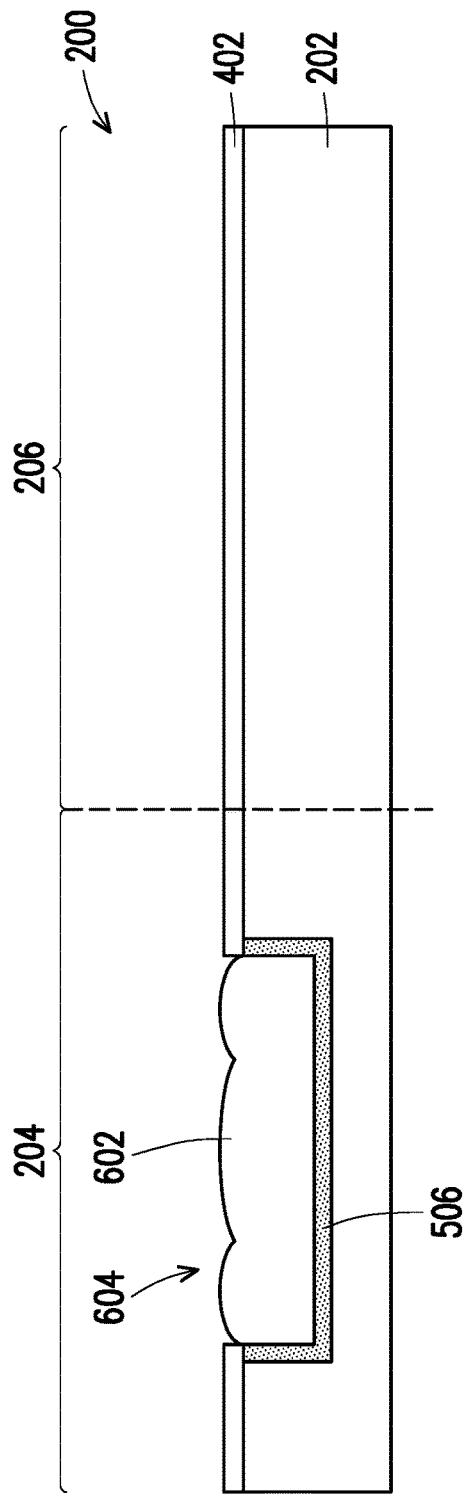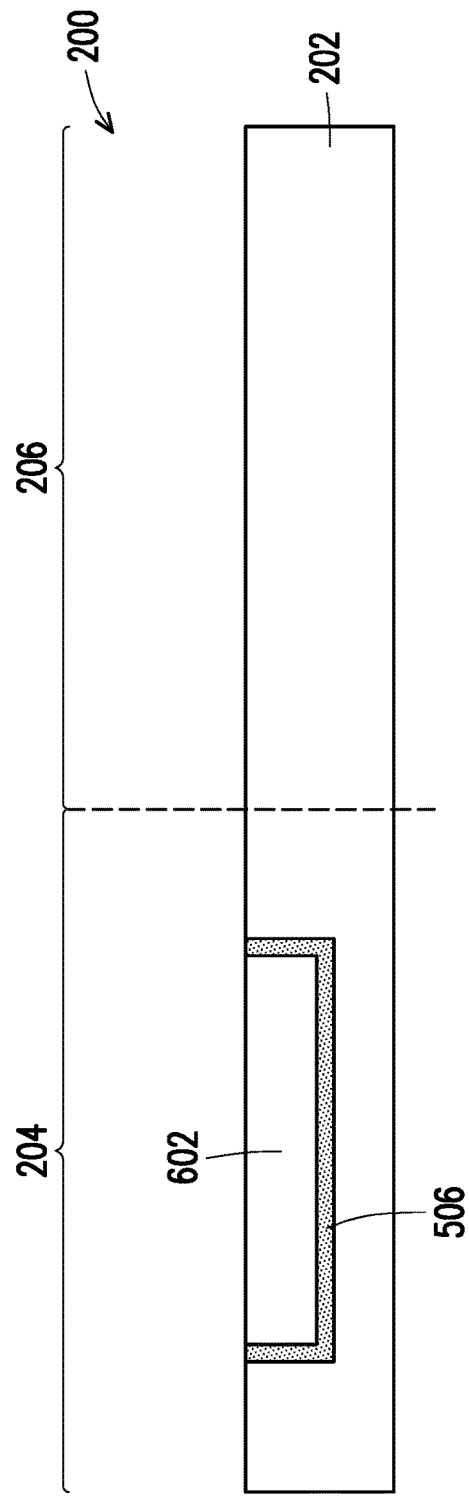

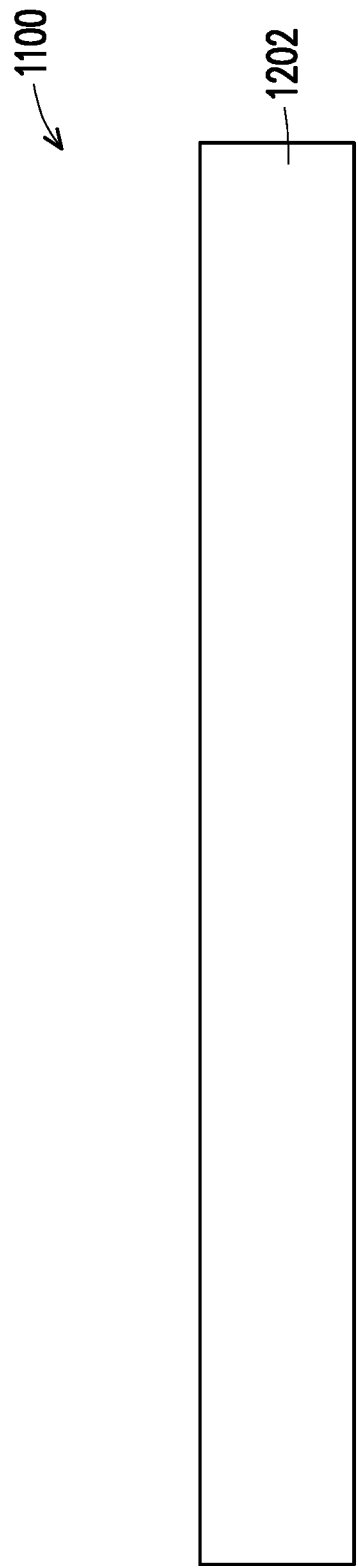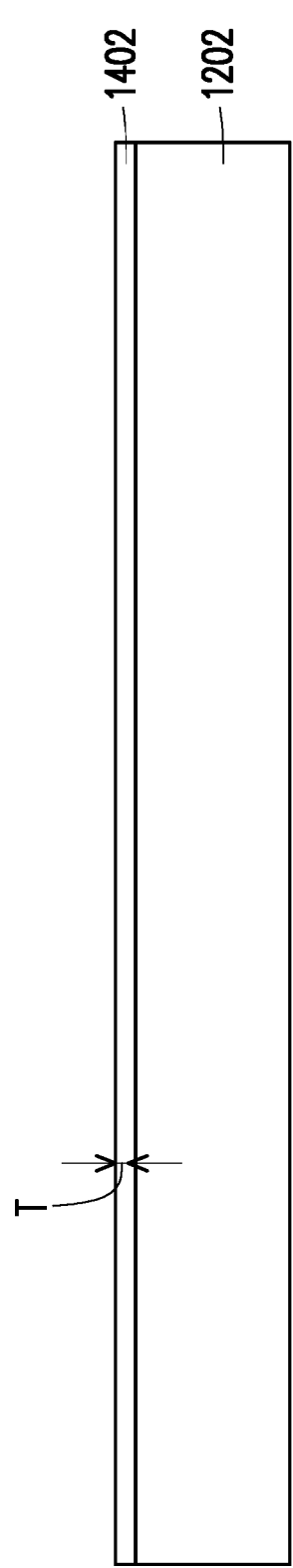
FIG. 11
FIG. 12

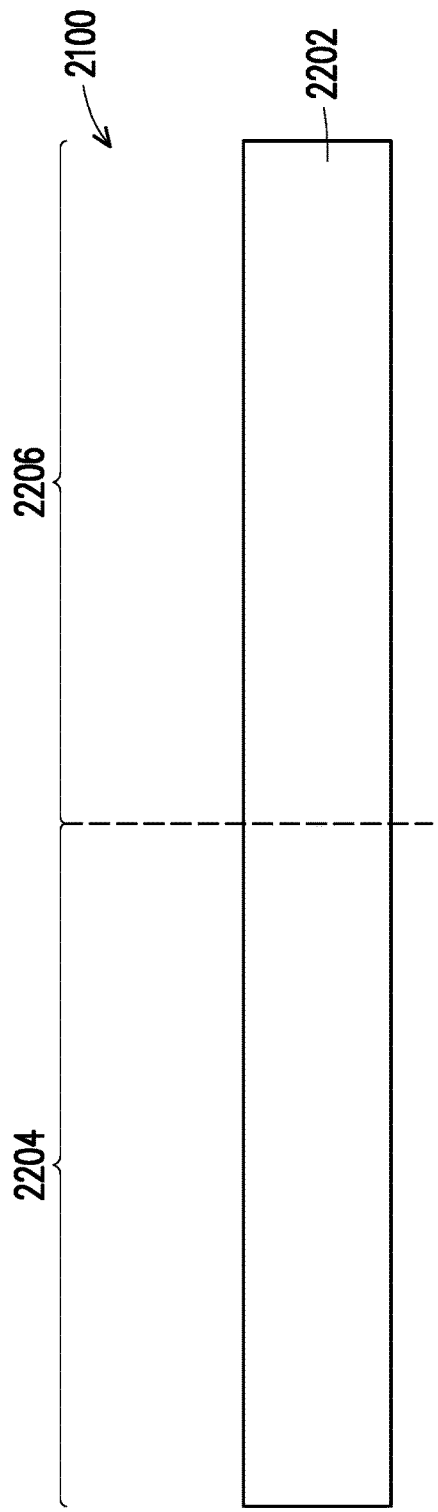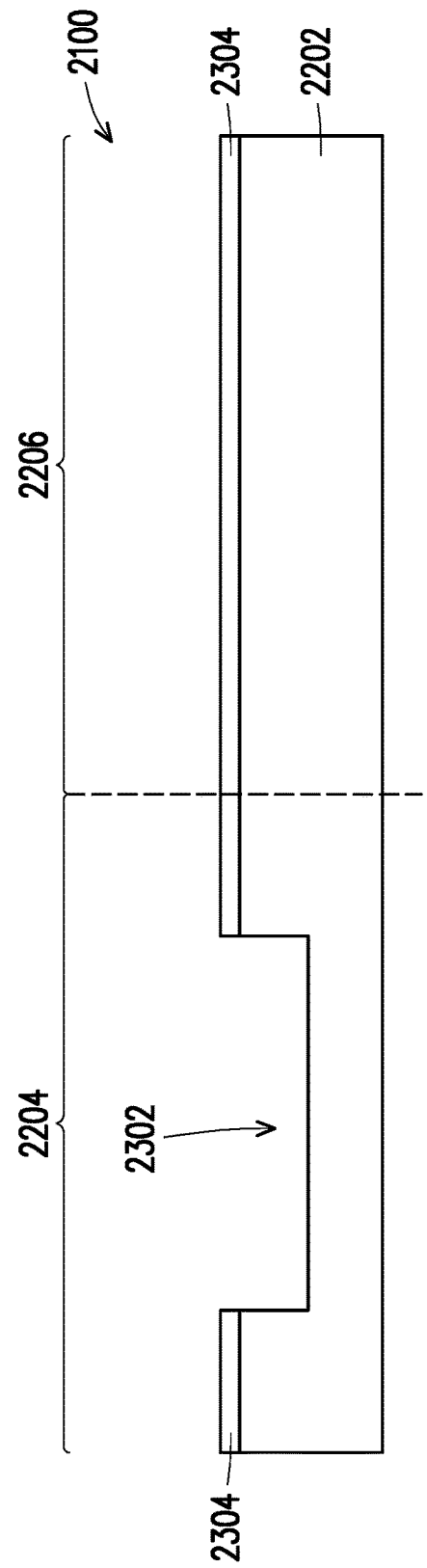

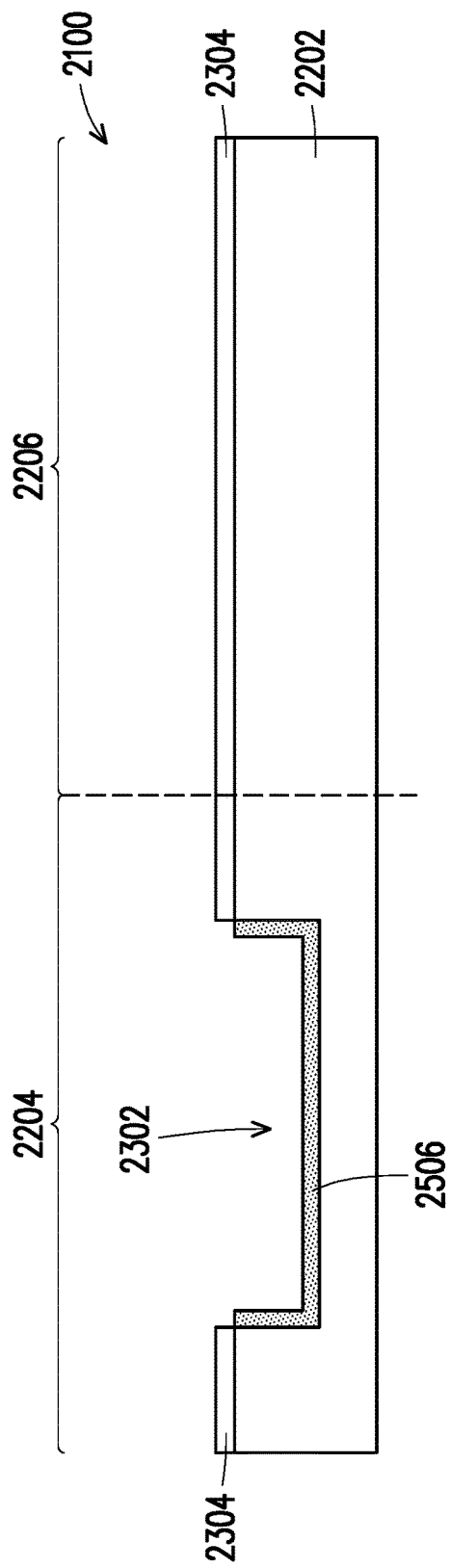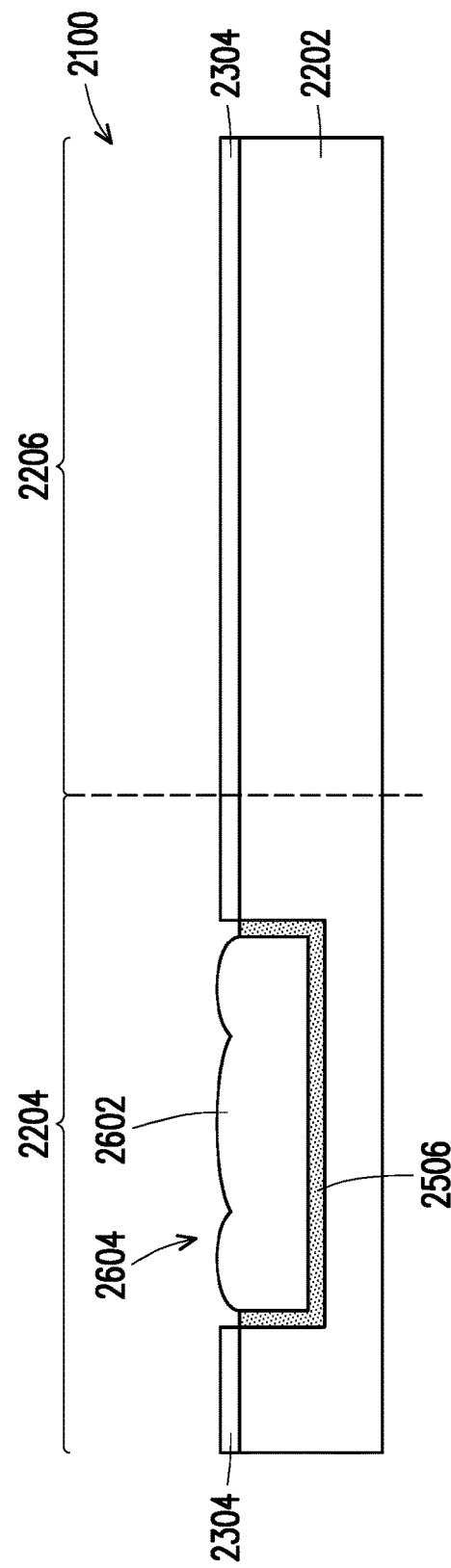

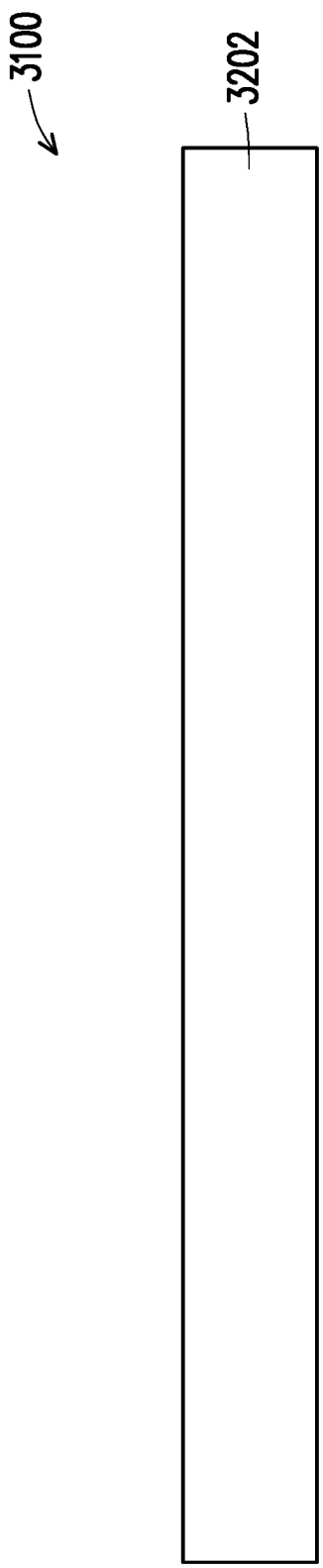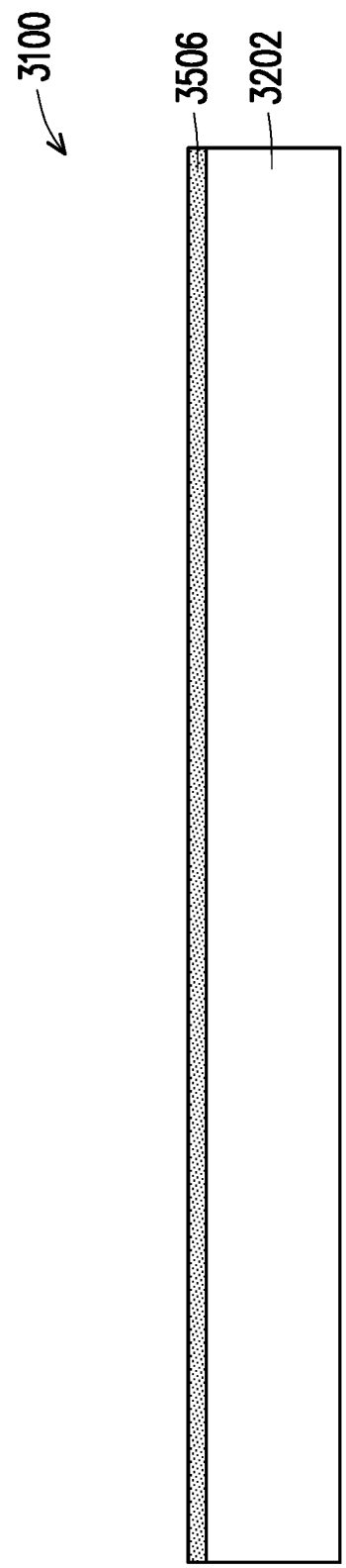

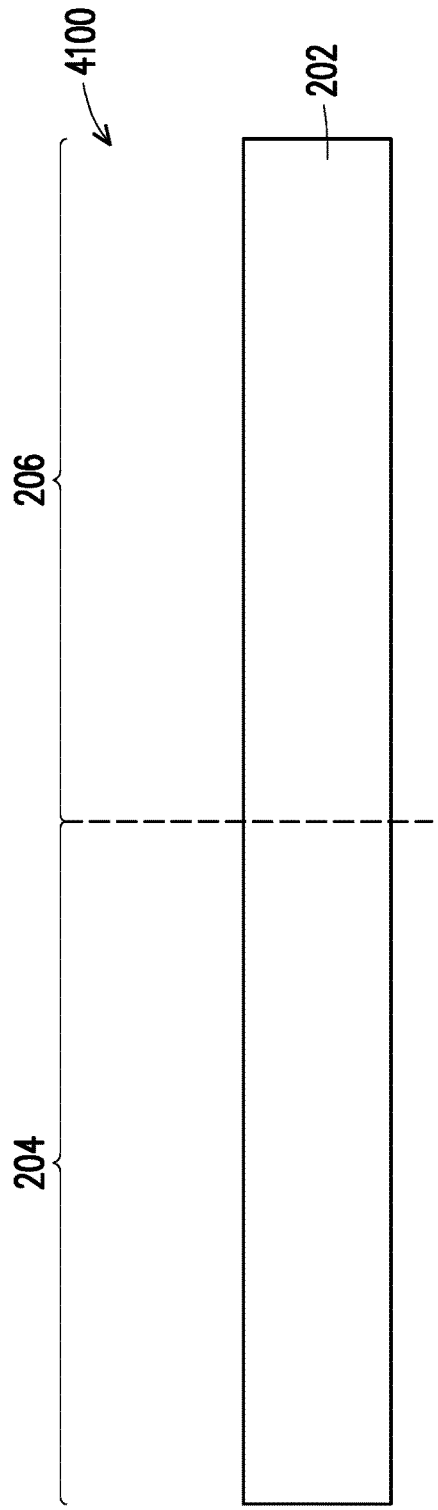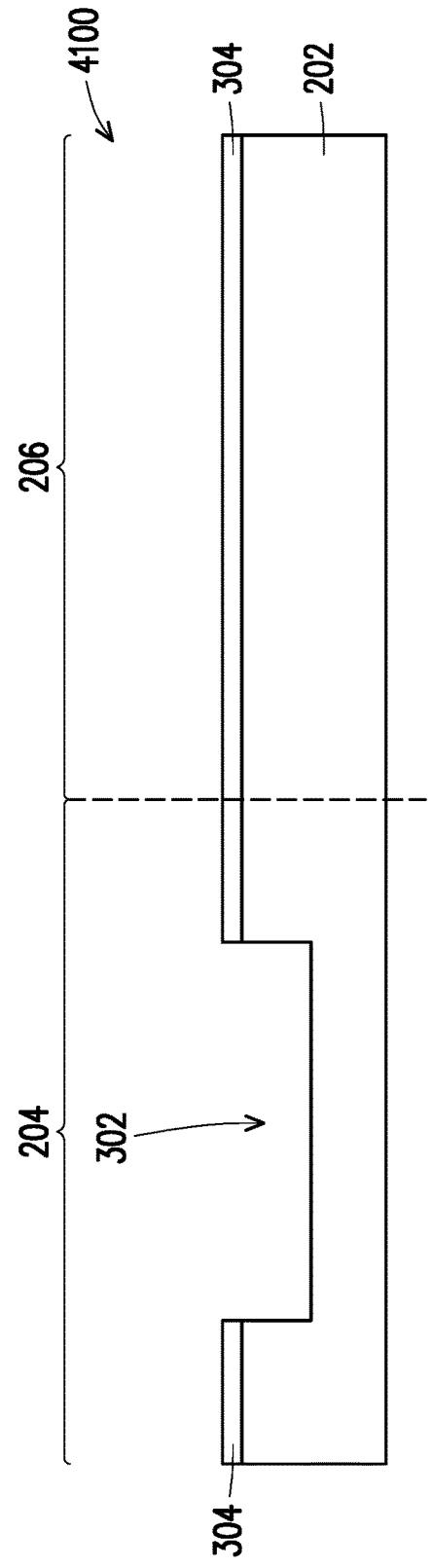

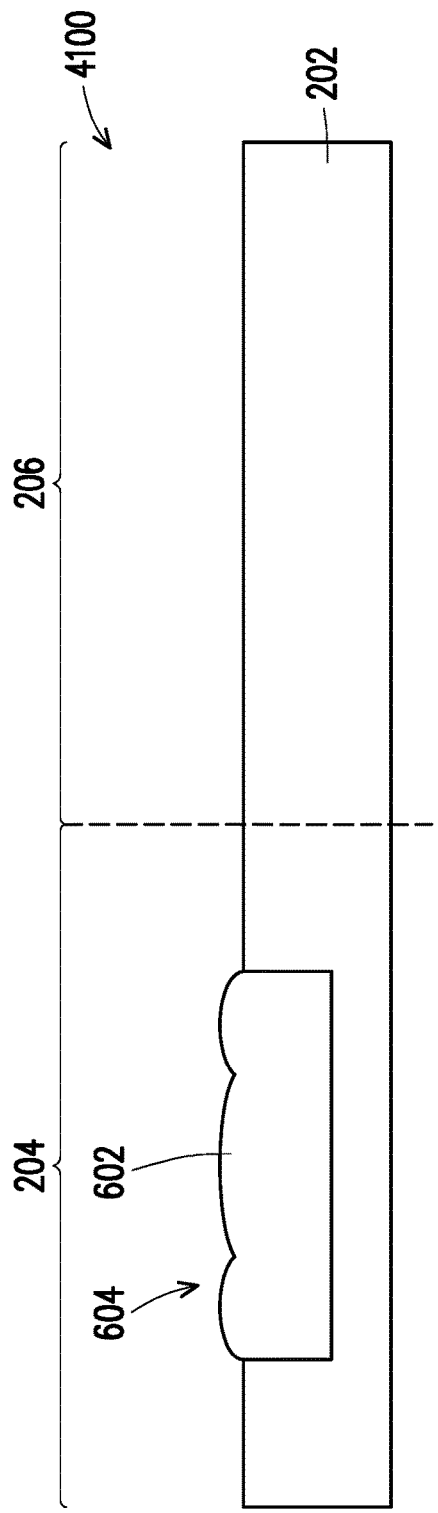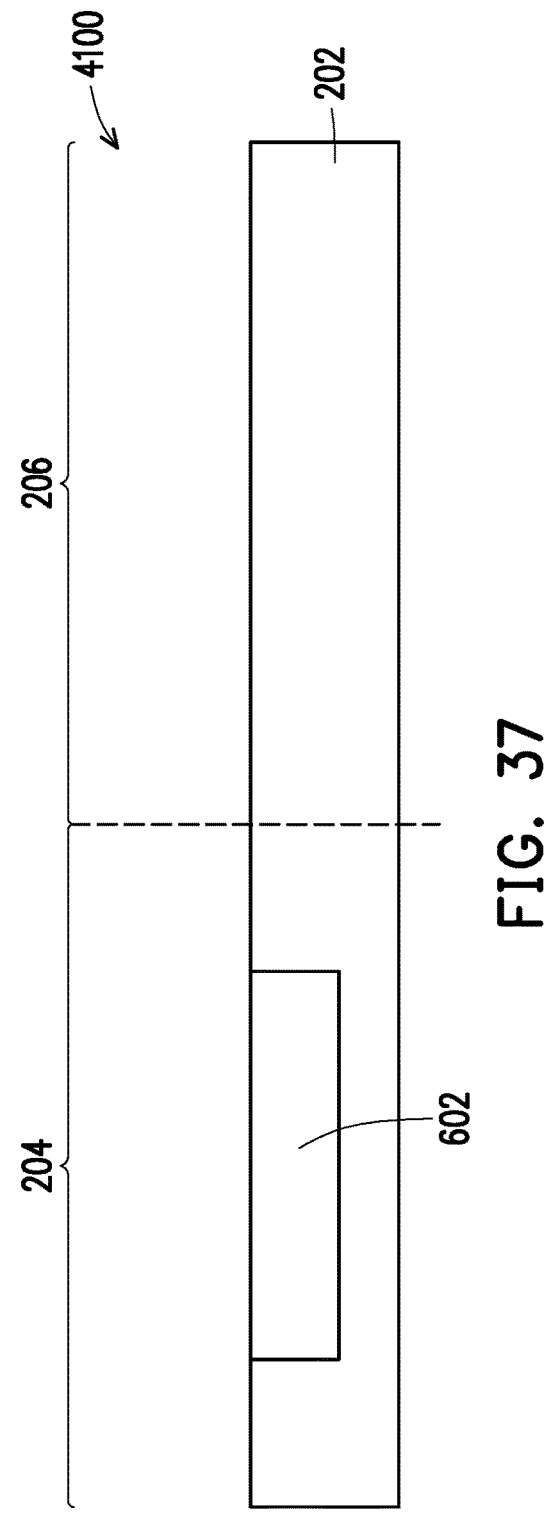

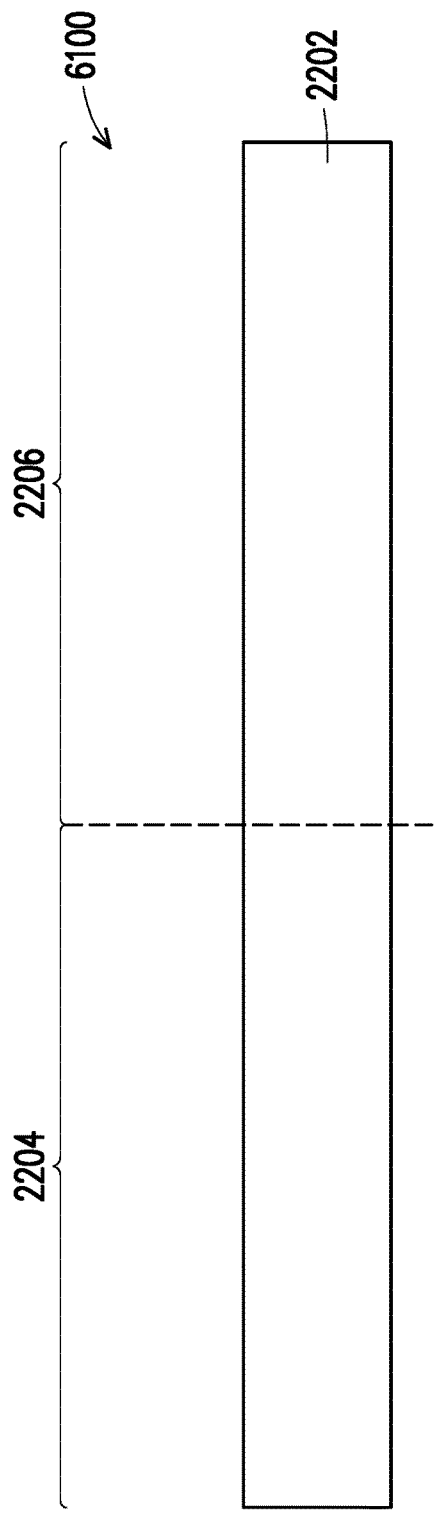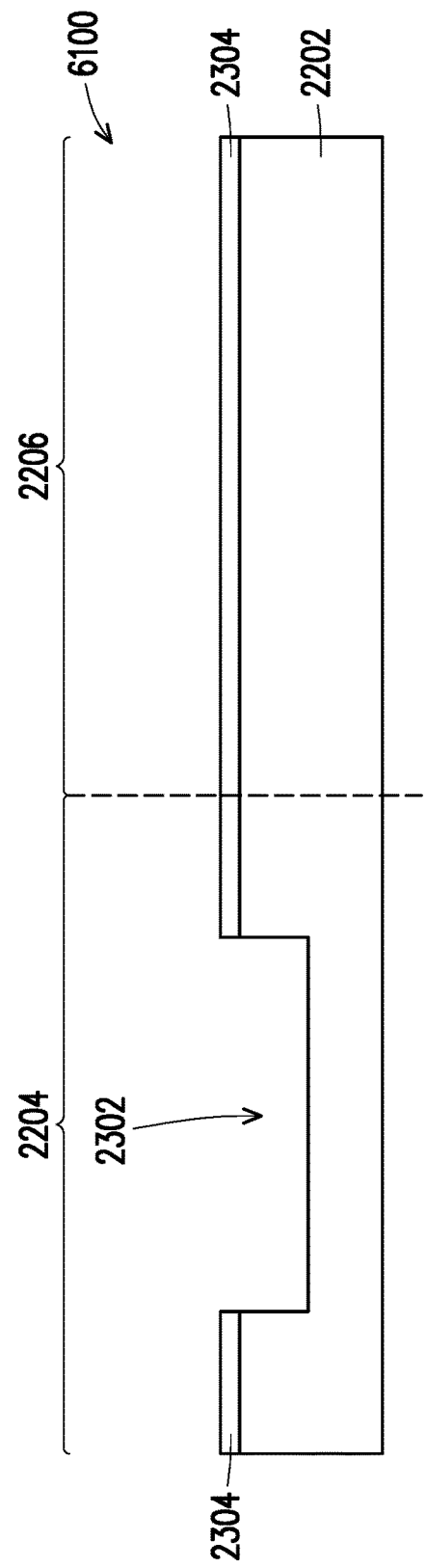

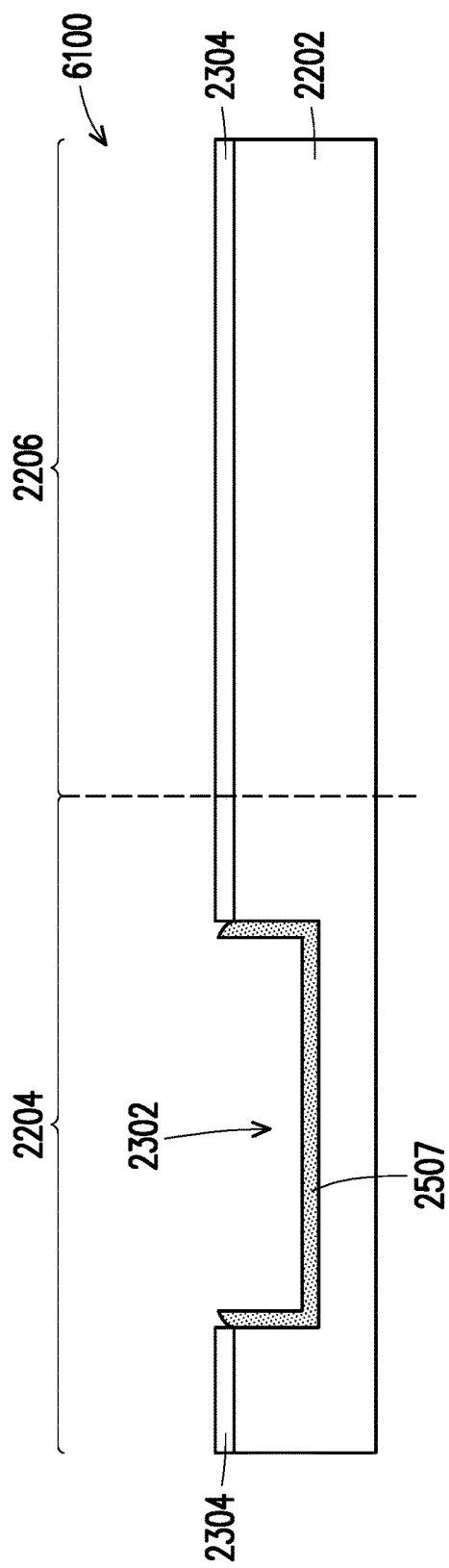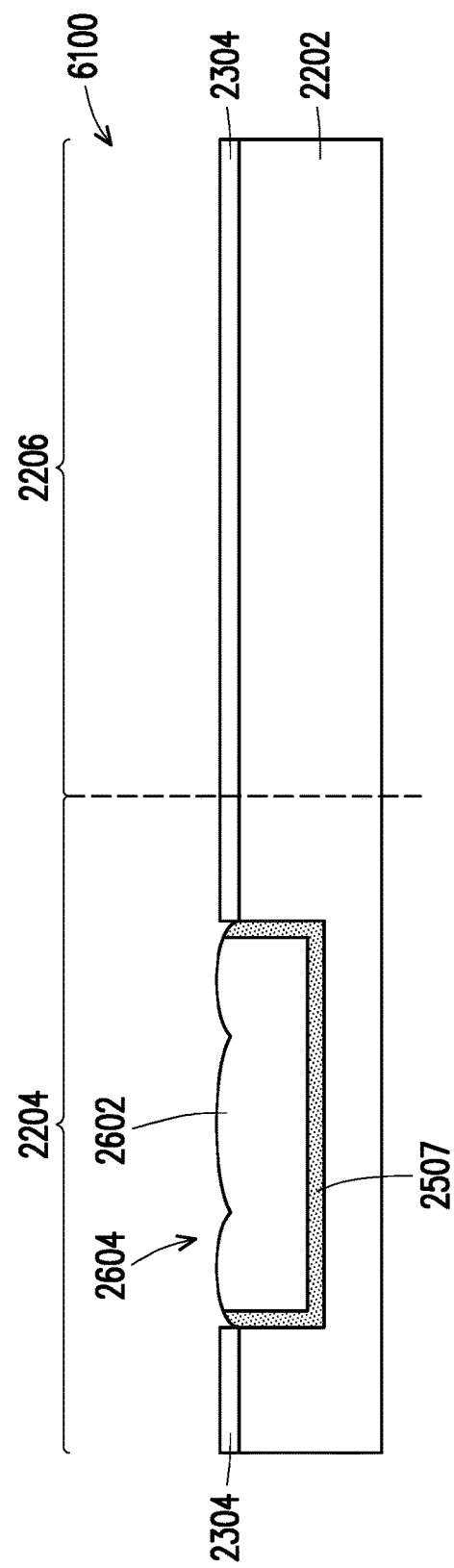

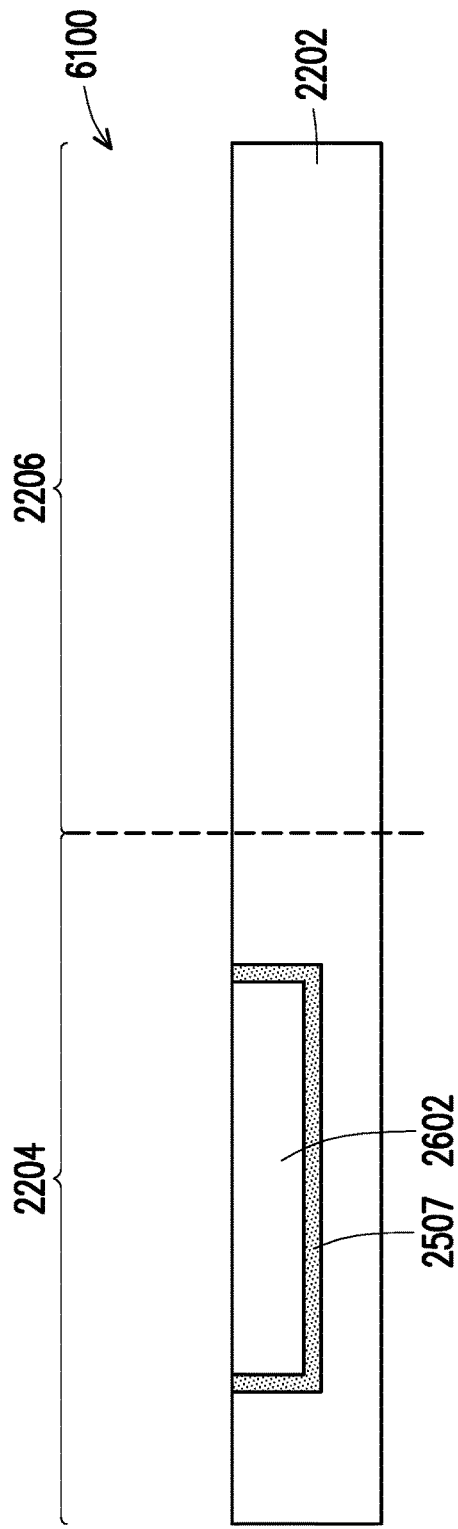
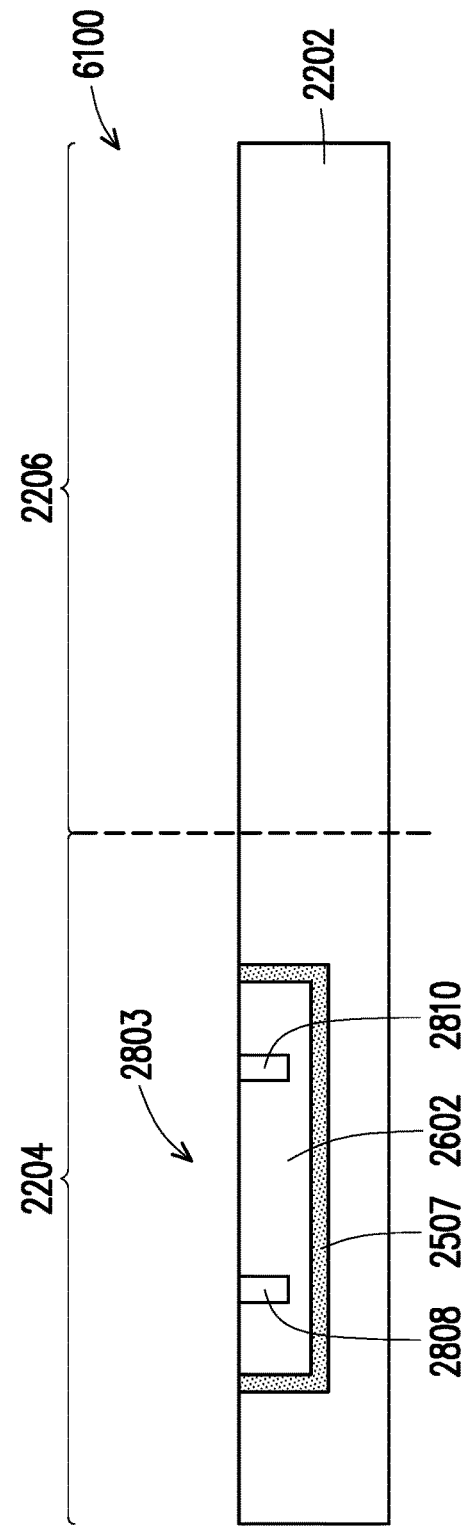
FIG. 55
FIG. 56

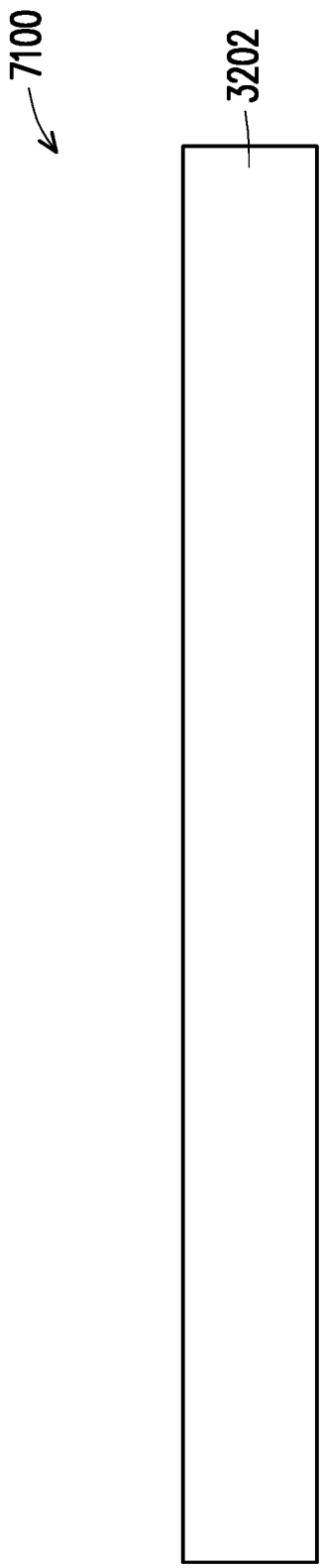
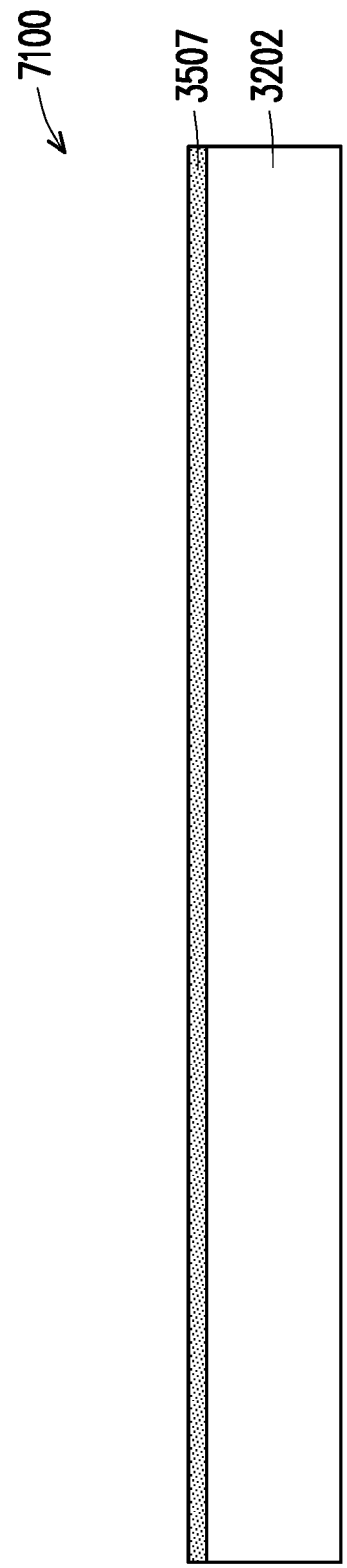

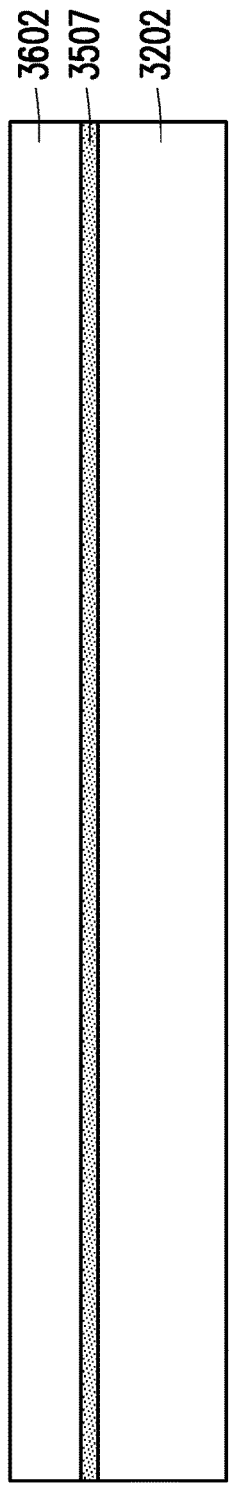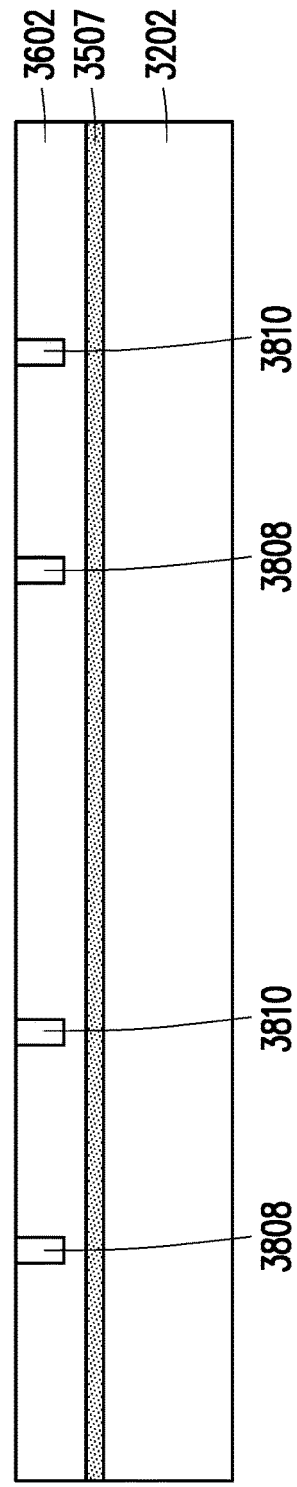

SEMICONDUCTOR SENSOR AND METHODS THEREOF

CROSS-REFERENCE TO RELATED APPLICATION

This application claims the benefit of U.S. Provisional Application No. 63/060,059, filed Aug. 1, 2020, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, semiconductor sensors are widely used for a variety of applications to measure physical, chemical, biological and environmental parameters. Some specific types of semiconductor sensors include gas sensors, pressure sensors, temperature sensors, and optical image sensors, among others. Among optical image sensors, dark current is a major concern for device performance and reliability. Dark current, which is current that flows in the absence of light, may more generally be described as leakage current present in an optical image sensor. In at least some cases, poor quality of interfaces between various semiconductor layers used in optical image sensors may result in significant dark current.

Thus, existing processes have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, and 9 are cross-section views of an exemplary device fabricated according to one or more steps of the method of FIG. 1;

FIGS. 11, 12, 13, 14, 15, 16, and 17 are cross-section views of an exemplary device fabricated according to one or more steps of the method of FIG. 10;

FIGS. 19, 20, 21, 22, 23, 24, and 25 are cross-section views of an exemplary device fabricated according to one or more steps of the method of FIG. 18;

FIGS. 27, 28, 29, 30, 31, and 32 are cross-section views of an exemplary device fabricated according to one or more steps of the method of FIG. 26;

FIGS. 34, 35, 36, 37, 38, 39, 40, and 41 are cross-section views of an exemplary device fabricated according to one or more steps of the method of FIG. 33;

FIGS. 51, 52, 53, 54, 55, 56, and 57 are cross-section views of an exemplary device fabricated according to one or more steps of the method of FIG. 50; and FIGS. 59, 60, 61, 62, 63, and 64 are cross-section views of an exemplary device fabricated according to one or more steps of the method of FIG. 58.

DETAILED DESCRIPTION

Figure 1:
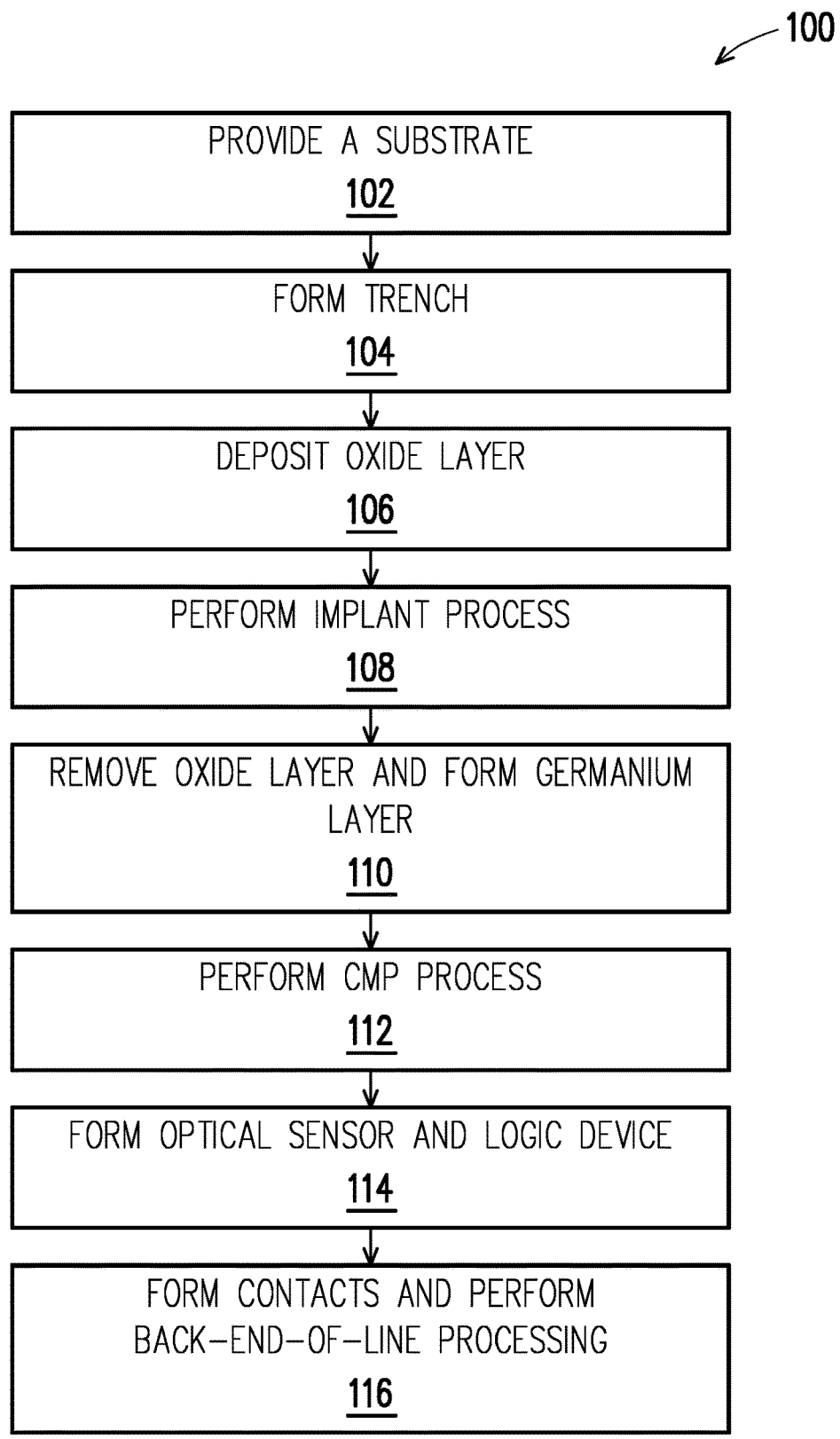
FIGS. 1, 10, 18, 26, 33, 42, 50, and 58 illustrate various methods of fabricating a semiconductor device including a Ge-based optical sensor, according to some embodiments.
Figure 2:
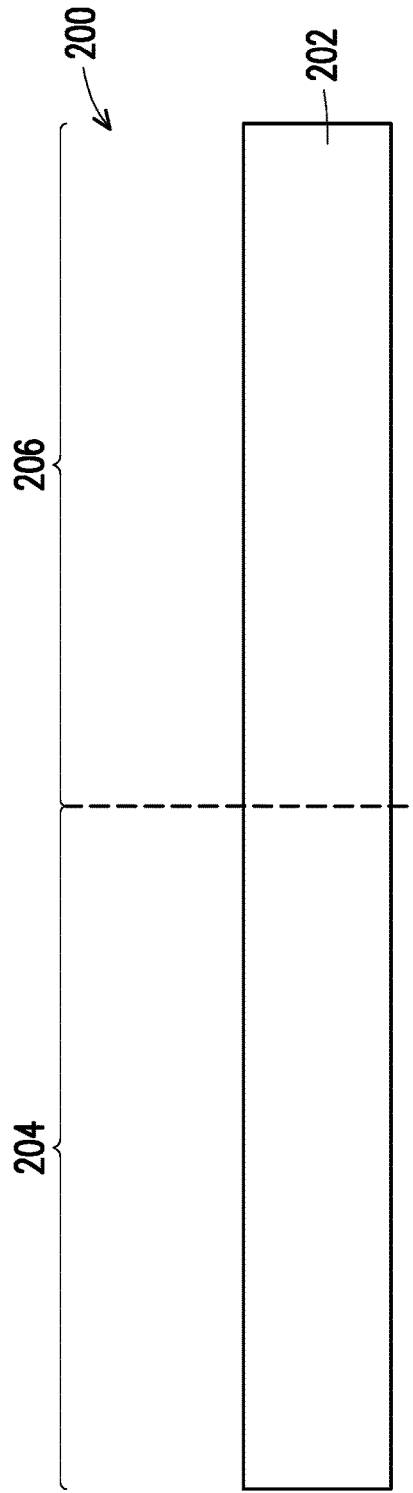
Figure 3:
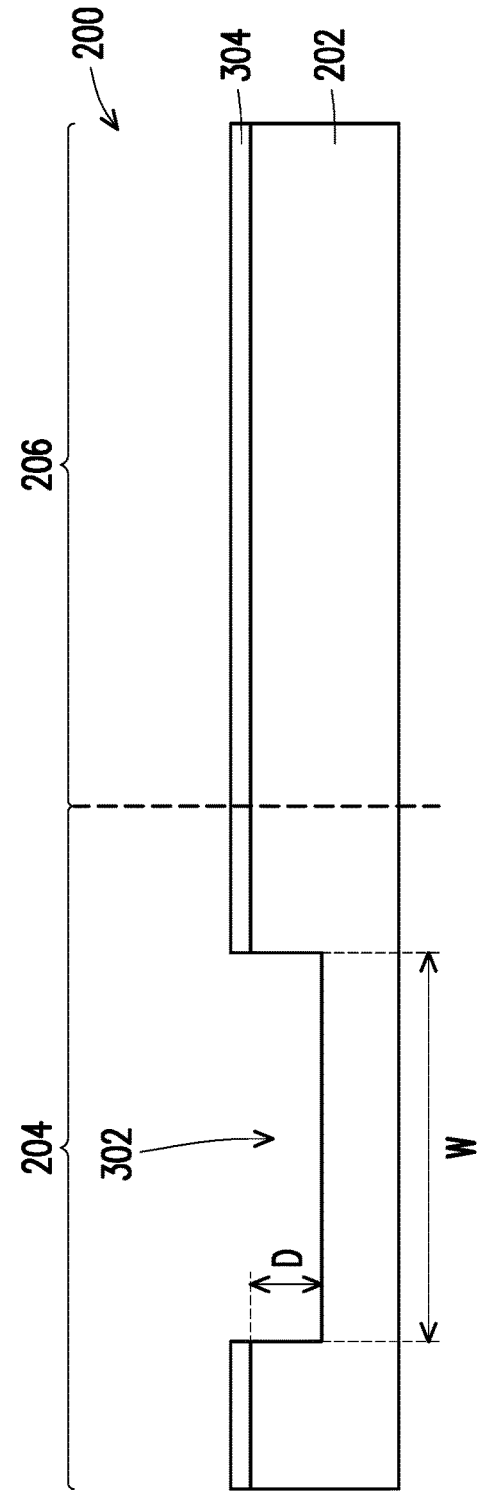
Figure 4:
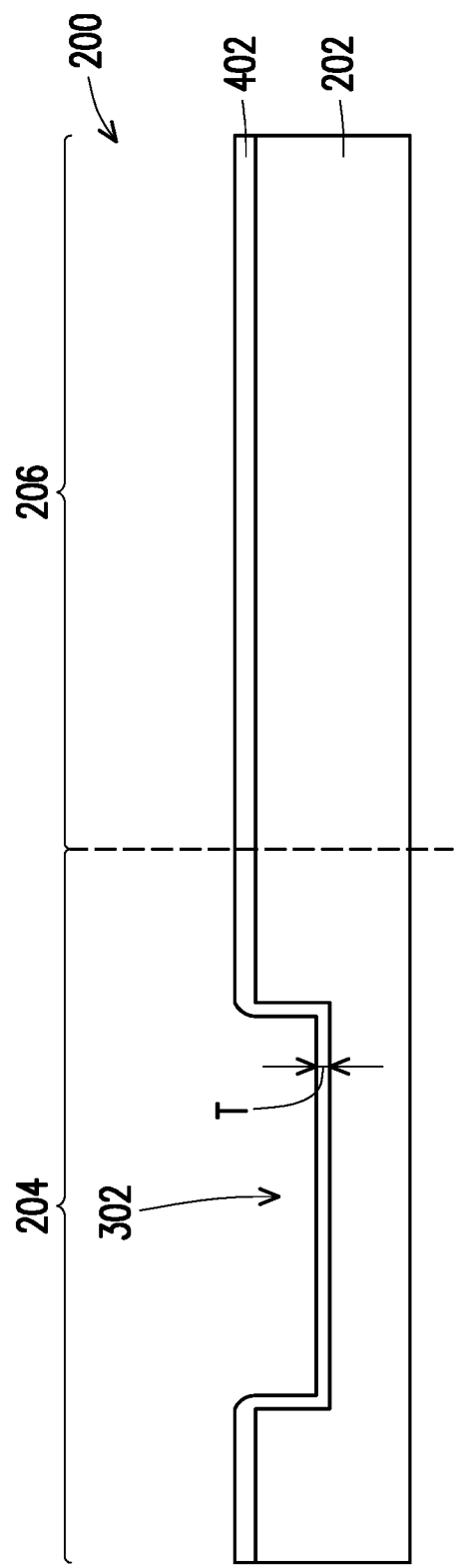
Figure 5:
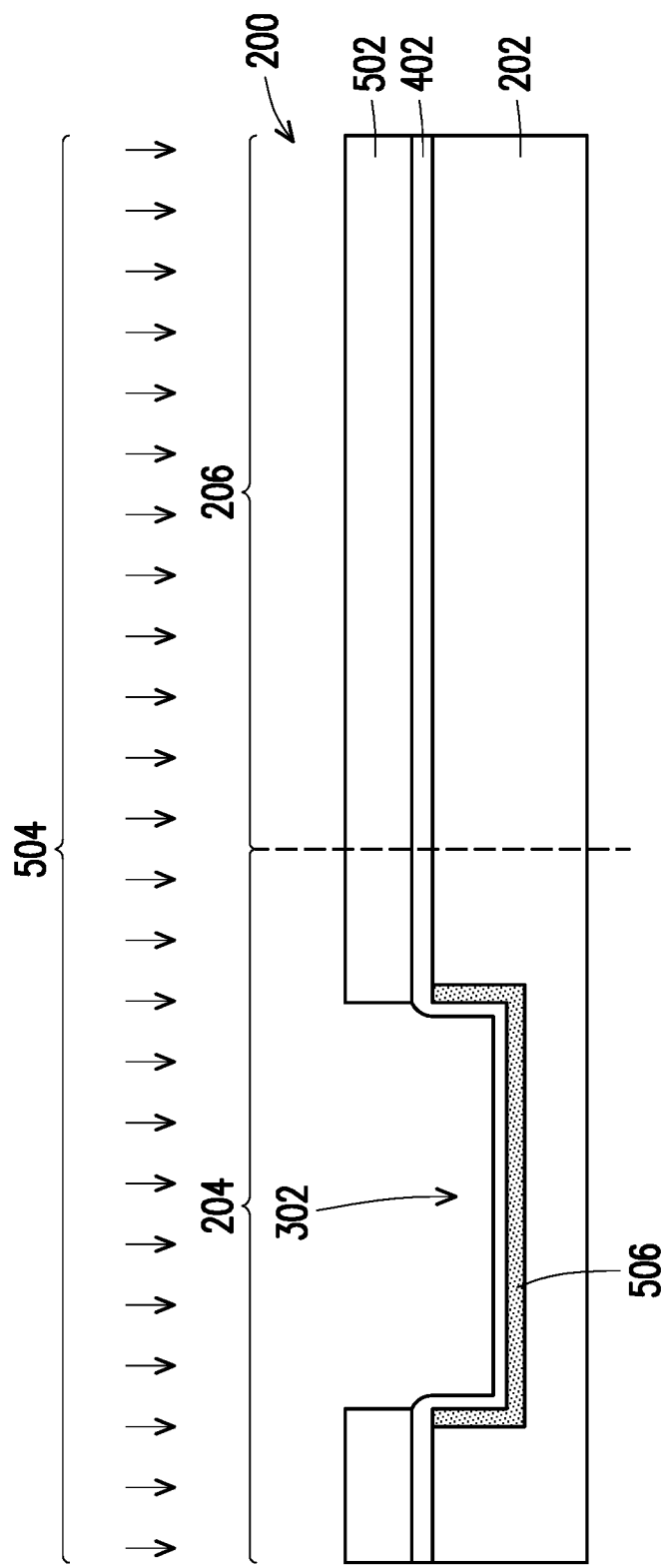
Figure 8:
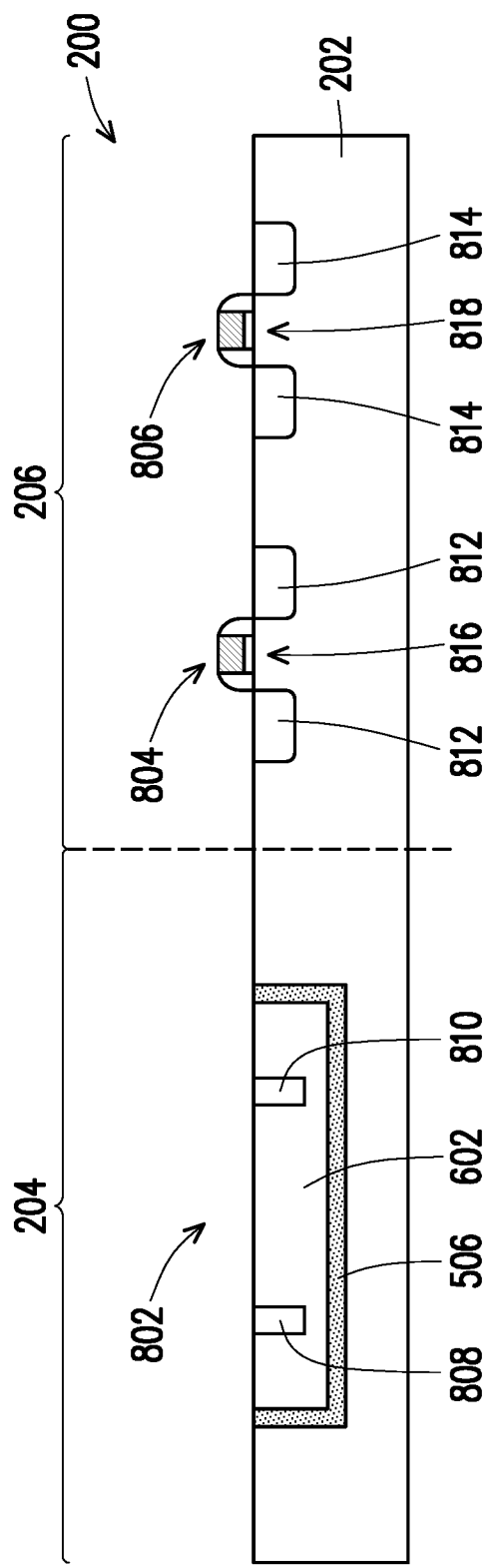

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments which may be employed in any of a variety of semiconductor device types. For example, embodiments of the present disclosure may be used in planar bulk metal-oxide-semiconductor field-effect transistors (MOSFETs), FinFETs, gate-all-around (GAA) transistors, strained-semiconductor devices, silicon-on-insulator (SOI) devices, partially-depleted SOI devices, fully-depleted SOI devices, charge-coupled devices, CMOS sensors, photodiodes, or other devices as known in the art. In addition, embodiments disclosed herein may be employed in the formation of P-type and/or N-type devices. One of ordinary skill may recognize other embodiments of semiconductor devices that may benefit from aspects of the present disclosure.

Semiconductor sensors are widely used for a variety of applications to measure physical, chemical, biological and environmental parameters. Some types of semiconductor sensors include gas sensors, pressure sensors, temperature sensors, and optical image sensors, among others. Among optical image sensors, dark current is a major concern for device performance and reliability. Dark current, which is current that flows in the absence of light, may more generally be described as leakage current present in an optical image sensor. In at least some cases, poor quality of interfaces between various semiconductor layers used in optical image sensors may result in significant dark current.

The present disclosure is generally directed to optical sensors having improved interfaces between various semiconductor layers to reduce dark current and improve device performance. More particularly, various embodiments are directed to germanium (Ge)-based sensors and fabrication processes for such sensors. While not mean to be limited to a specific application, and merely as one example, some embodiments of the Ge-based sensors disclosed herein may be particularly advantageous for mid-infrared (mid-IR) photonics owing to the wide transparency window of Ge and its strong non-linear refractive index. Mid-IR light, which has a wavelength longer than visible light but shorter than microwaves, has many important applications in remote sensing and communication technologies. For avoidance of doubt, the Ge-based sensors and processes described herein may be applicable to other types of applications as well. Additionally, in some embodiments, the Ge-based sensors disclosed herein may include a photodiode (PD), photodetector, or other type of Ge-based optical sensor. However, aspects of the present disclosure may be equally applied to other types of optical sensors without departing from the scope of the present disclosure. As noted above, poor interface quality between semiconductor layers may result in increased dark current. For Ge-based devices, semiconductor interface quality and dark current becomes even more critical at least because the energy band gap of Ge is less than the energy band gap of silicon (Si). As a result, increased dark current (leakage current) in Ge-based optical sensors is a significant concern, as it can degrade the optical performance and reliability of the device.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods for passivating interfaces between various semiconductor layers to reduce dark current and improve device performance. In some embodiments, the interface includes an interface between Ge and Si. Thus, in some examples, the structures and methods disclosed herein provide for passivating the interface between Ge and Si (or the "Ge—Si interface"). In accordance with various embodiments, passivation of the Ge—Si interface may be accomplished by doping the Ge—Si interface. By way of example, the phrase "doping the Ge—Si interface" may include introducing a dopant species at the Ge—Si interface (e.g., straddling both Ge and Si layers), in the Ge layer immediately adjacent to the Ge—Si interface, in the Si layer immediately adjacent to the Ge—Si interface, in the Ge layer spaced a distance from the Ge—Si interface, or in the Si layer spaced a distance from the Ge—Si interface. In various embodiments, doping of the Ge—Si interface may be performed by ion implantation and/or diffusion (e.g., using a gas, liquid, or solid dopant source). In some embodiments, the dopant species used for doping the Ge—Si interface may include a P-type material (e.g., Group IIIA (e.g., boron (B), aluminum (Al), gallium (Ga), indium (In)), $BF_2$) or a Group VIIA material (e.g., fluorine (F), chlorine(Cl), bromine(Br)). By introducing one or more of these dopant species into the Ge—Si interface, in accordance with one or more of the methods described herein, the Ge—Si interface can be optimized to substantially prevent electrons in the Si layer from entering the Ge layer. As a result, the issue of leakage current and dark current in Ge-based sensors is significantly mitigated.

In at least some examples, the leakage current/dark current of the Ge-based sensor is reduced/improved by about 10%. Those skilled in the art will recognize other benefits and advantages of the methods and devices as described herein, and the embodiments described are not meant to be limiting beyond what is specifically recited in the claims that follow.

Referring now to FIG. 1, illustrated is a method 100 of fabricating a semiconductor device 200 including a Ge-based optical sensor, in accordance with some embodiments. The method 100 is discussed below with reference to FIGS. 2-9, which provide cross-section views of the semiconductor device 200, at various stages of fabrication, according to one or more steps of the method 100. It is understood that the method 100, as well as the methods 1000, 2000, 3000, 4000, 5000, 6000, 7000 (discussed below), include steps having features of a complementary metal-oxide-semiconductor (CMOS) technology process flow and thus, are only described briefly herein. Also, additional steps may be performed before, after, and/or during each of the methods 100, 1000, 2000, 3000, 4000, 5000, 6000, 7000, and some process steps may be replaced or eliminated, without departing from the scope of the present disclosure.

In addition, the semiconductor device 200, as well as the semiconductor devices 1100, 2100, 3100, 4100, 5100, 6100, 7100 (discussed below), may include various other devices and features, including other types of devices such as planar MOSFETs, FinFETs, GAA transistors, strained-semiconductor devices, SOI devices, charge-coupled devices, CMOS sensors, photodiodes, other optical devices, bipolar junction transistors, resistors, capacitors, inductors, diodes, fuses, memory devices such as static random access memory (SRAM) devices, I/O transistors, other logic devices and/or circuits, etc., but is simplified for a better understanding of the inventive concepts of the present disclosure. In some embodiments, the semiconductor device 200, and the semiconductor devices 1100, 2100, 3100, 4100, 5100, 6100, 7100 (discussed below), include a plurality of semiconductor devices (e.g., transistors), including P-type transistors, N-type transistors, etc., which may be interconnected. Moreover, it is noted that the process steps of methods 100, 1000, 2000, 3000, 4000, 5000, 6000, 7000, including any descriptions given with reference to the figures are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

In some embodiments, the substrate 202 also includes an optoelectronic region 204 and a logic region 206 adjacent to the optoelectronic region 204. By way of example, the optoelectronic region 204 may include one or more optoelectronic devices (e.g., such as photodiodes) associated with one or more imaging pixels. Thus, in some cases, the optoelectronic region 204 may equivalently be referred to as a "pixel region". In some embodiments, the logic region 206 may generally include core (logic) transistors and circuits. In at least some examples, devices and/or circuits within the logic region 206 may include planar MOSFETs, FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other logic devices and/or circuits. In some cases, one or more devices within the logic region 206 may be coupled to one or more devices in the optoelectronic region 204, for example, to collectively define a pixel circuit or other optoelectronic circuit.

The method 100 then proceeds to block 104 where a trench is formed. With reference to the example of FIG. 3, in an embodiment of block 104, a trench 302 is formed within the optoelectronic region 204. In some embodiments, and prior to formation of the trench 302, a hard mask (HM) layer 304 is deposited over the substrate 202. In some examples, the HM layer 304 may include a silicon nitride layer such as $Si_3N_4$, silicon oxynitride, silicon carbide, an oxide layer, or a combination thereof. The HM layer 304 may be deposited by CVD, PVD, ALD, or by another suitable process. In various examples, a photoresist (resist) layer may be deposited (e.g., by spin-coating) over the HM layer 304. After forming the resist layer, the resist layer may be exposed and developed to pattern the resist layer. In some embodiments, the patterning of the resist layer removes a portion of the resist layer from the optoelectronic region 204, where the trench will be formed, while other portions of the resist layer remain intact. In various embodiments, after patterning the resist layer, an etching process (e.g., such as a dry etch, wet etch, or combination thereof) may be performed to etch the HM layer 304 within the optoelectronic region 204, using the patterned resist layer as a mask. After etching the HM layer 304, the patterned resist layer may be removed, for example, by way of a solvent, resist stripper, ashing, or other suitable technique. Thereafter, another etching process (e.g., such as a dry etch, wet etch, or combination thereof) may be performed to etch the substrate 202, using the patterned HM layer 304 as a mask, to form the trench 302 within the substrate 202. In some embodiments, the trench 302 may have a depth 'D' in a range of about 0.5-2 microns, a width 'W' in a range of about 0.5-2 microns, and a length 'K' (into the page) in a range of about 0.5-2 microns. In some examples, after forming the trench 302, the HM layer 304 may be removed using a wet etching process, a dry etching process, or a combination thereof.

The method 100 then proceeds to block 106 where an oxide layer is deposited. With reference to the example of FIG. 4, in an embodiment of block 106, an oxide layer 402 is deposited over the substrate 202 (e.g., within both the optoelectronic region 204 and the logic region 206), including within the trench 302. The oxide layer 402 may include $SiO_2$ or other suitable oxide layer. In various examples, the oxide layer 402 may be deposited by CVD, PVD, ALD, or by another suitable process. In some cases, the oxide layer 402 is a conformal layer having a substantially uniform thickness 'T' over the substrate 202 and within the trench 302. In some alternative embodiments, the oxide layer 402 may be formed in the optoelectronic region 204, but not in the logic region 206. Further, in some cases, the oxide layer 402 may be formed within the trench 302 (e.g., including on sidewall and bottom surfaces of the trench 302), but not within other parts of the optoelectronic region 204 or the logic region 206. The oxide layer 402, in various embodiments, may be used to control a depth (e.g., projected range) of a subsequently performed ion implantation process. For example, as the thickness of the oxide layer 402 increases, the ion implant depth may decrease. In some embodiments, the thickness of the oxide layer 402 may be in a range of about 50-5000 Angstroms.

The method 100 then proceeds to block 108 where an ion implantation process is performed. With reference to the example of FIG. 5, in an embodiment of block 108, an implant masking layer 502 may initially be formed over the substrate 202 (e.g., within both the optoelectronic region 204 and the logic region 206). In some examples, the implant masking layer 502 may include a silicon nitride layer, an oxide layer, a polysilicon layer, a resist layer, or other appropriate layer. The implant masking layer 502 may be deposited by CVD, PVD, ALD, or by another suitable process. After forming the implant masking layer 502, the implant masking layer 502 may be patterned (e.g., using a photolithography and etching process similar to the process described above for patterning the HM layer 304) to form an opening in the implant masking layer 502 that exposes the trench 302. Thereafter, in some embodiments, an ion implantation process 504 is performed into the device 200. The dopant species used for the ion implantation process 504, in some examples, may include a P-type material (e.g., Group IIIA (e.g., boron (B), aluminum (Al), gallium (Ga), indium (In)), $BF_2$) and/or a Group VIIA material (e.g., fluorine (F), chlorine(Cl), bromine(Br)). In at least some embodiments, the ion implantation process 504 includes a plurality of ion implantations, where the plurality of ion implantations implants a different dopant species, or where the plurality of ion implantations implants the same dopant species using different ion implantations parameters (e.g., such as dose and energy). As a result of the ion implantation process 504, an implant region 506 is formed within and along a top surface of the substrate 202 not covered by the implant masking layer 502 (e.g., substrate 202 surfaces proximate to the trench 302). In some cases, the implant region 506 is formed within portions of the substrate 202 along both sidewall and bottom surfaces of the trench 302. In embodiments where the substrate 202 includes Si, the implant region 506 defines an ion-implanted Si region.

As described in more detail below, the implant region 506 will be located proximate to a Ge—Si interface (e.g., after formation of a Ge layer within the trench 302). In some embodiments, the P-type material used for the ion implantation process 504 may be used to change a carrier concentration of the substrate 202 (e.g., such as a Si substrate), such that the Ge—Si interface is optimized and electrons in Si are substantially blocked from entering the Ge layer, as described below. In some cases, the Group VIIA material used for the ion implantation process 504 may be used to neutralize trapped charges within the substrate 202 (e.g., such as a Si substrate) which may be trapped by defects (e.g., dangling bonds) along the top surface of the substrate 202 and in a region near the top surface of the substrate 202. In particular, the Group VIIIA material may be used to neutralize trapped charges along a surface region of the substrate 202 (e.g., such as a Si substrate) proximate to the Ge layer (or Ge photodiode layer), such that the Ge—Si interface is optimized and electrons in Si are substantially blocked from entering the Ge layer.

The method 100 then proceeds to block 110 where the oxide layer is removed, and a germanium layer is formed. With reference to the example of FIG. 6, in an embodiment of block 110, after formation of the implant region 506 (block 108), the oxide layer 402 may be removed from the trench 302 (e.g., from both sidewall and bottom surfaces of the trench 302) using a wet etching process, a dry etching process, or a combination thereof. Removal of the oxide layer 402 thus exposes the implant region 506 along sidewall and bottom surfaces of the trench 302. After removing the oxide layer 402 from the trench 302, the implant masking layer 502 may be removed using a wet etching process, a dry etching process, or a combination thereof. It is noted that portions of the oxide layer 402 that were disposed beneath the implant masking layer 502 may remain on surfaces of the device 200, outside the trench 302, after removal of the implant masking layer 502. After removal of the oxide layer 402 (e.g., from the trench 302) and the implant masking layer 502, and in a further embodiment of block 110, a germanium (Ge) layer 602 is formed within the trench 302 and over the implant region 506 (e.g., including over the implant region 506 along sidewall and bottom surfaces of the trench 302). As shown, the Ge layer 602 may in some cases overfill the trench 302, resulting in a surface topography 604 of the Ge layer 602. In some embodiments, the Ge layer 602 is formed by ALD, CVD, molecular beam epitaxy (MBE), metalorganic (MOCVD), and/or other suitable growth processes. Additionally, in some examples, the Ge layer 602 includes an intrinsic Ge layer. Thus, in some embodiments, the Ge layer 602 may be substantially undoped (e.g., having an insignificant amount of a dopant species present). It is noted that the portions of the oxide layer 402 that remain on surfaces of the device 200 (e.g., outside the trench 302), after removal of the implant masking layer 502, may prevent growth of the Ge layer 602 on the remaining oxide layer 402 (e.g., outside the trench 302).

The method 100 then proceeds to block 112 where a chemical mechanical polishing (CMP) process is performed. With reference to the example of FIG. 7, in an embodiment of block 112, a CMP process is performed after formation of the Ge layer 602 within the trench 302. In various embodiments, the CMP process serves to remove excess portions of the Ge layer 602 (e.g., the portion of the Ge layer 602 extending outside the trench 302 and including the surface topography 604) and planarize a top surface of the device 200. In various embodiments, the CMP process may also remove the portions of the oxide layer 402 that remain on surfaces of the device 200 (e.g., outside the trench 302). As a result of the CMP process, a top surface of the substrate 202 (e.g., adjacent to the trench 302), a top surface of the Ge layer 602, and top surfaces of portions of the implant region 506 along sidewall surfaces of the trench 302 are substantially co-planar (level) with each other.

The method 100 then proceeds to block 114 where an optical sensor and a logic device are formed. With reference to the example of FIG. 8, in an embodiment of block 114, an optical sensor 802 is formed in the optoelectronic region 204 within the Ge layer 602, and logic devices 804, 806 are formed within the logic region 206. With reference first to the optoelectronic region 204, and in some embodiments, the optical sensor 802 may include a Ge optical sensor such as a Ge photodiode (PD). The optical sensor 802 may include an N-type region 808 and a P-type region 810 formed within the Ge layer 602. In some embodiments, the N-type region 808 and the P-type region 810 may be formed by ion implantation, as discussed further below. In various examples, the N-type region 808 may provide a cathode for the optical sensor 802, and the P-type region 810 may provide an anode for the optical sensor 802. Thus, the P-type region 810, the region of the (intrinsic) Ge layer 602 between the P-type region 810 and the N-type region 808, and the N-type region 808 may collectively define a P—I—N Ge PD (or simply a P—N Ge PD). In some examples, when a photon of sufficient energy strikes the optical sensor 802, an electron-hole pair is created. In some cases, if photon absorption occurs in the intrinsic (or depletion) region of the optical sensor 802, then the generated electrons are swept toward the cathode (N-type region 808) and generated holes are swept toward the anode (P-type region 810), thereby generating a photocurrent.

In various embodiments, a total current through the optical sensor 802 (Ge PD) is the sum of the dark current and the photocurrent. However, in accordance with some embodiments, the implant region 506, disposed proximate to the Ge—Si interface (e.g., within the substrate 202 proximate to the Ge layer 602), serves to effectively block current (electrons) from the substrate 202 (e.g., such as Si) from entering the Ge layer 602. As a result, the dark current component of the total current through the optical sensor 802 is reduced, and performance of the optical sensor 802 is improved. For example, as discussed above, the P-type material within the implant region 506 may be used to change a carrier concentration of the substrate 202, and/or the Group VIIA material within the implant region 506 may be used to neutralize trapped charges within the substrate 202, thereby optimizing the Ge—Si interface.

With reference now to the logic region 206, and in some embodiments, the logic device 804 may include an N-type MOS (NMOS) transistor, and the logic device 806 may include a P-type MOS (PMOS) transistor. In addition, the logic device 804 may include a gate stack 816, and the logic device 806 may include a gate stack 818. In various examples, each of the gate stacks 816, 818 may include a gate dielectric and a gate electrode over the gate dielectric, and sidewall spacers may be formed on sidewalls of the gate stacks 816, 818. Additionally, in various examples, the logic device 804 may include N-type source/drain regions 812 formed within the substrate 202, adjacent to and on either side of the gate stack 816, and the logic device 806 may include P-type source/drain regions 814 formed within the substrate 202, adjacent to and on either side of the gate stack 818.

In some embodiments, the gate dielectric of the gate stacks 816, 818 may include an interfacial layer such as silicon oxide layer ($SiO_2$) or silicon oxynitride (SiON). In some examples, the gate dielectric of the gate stacks 816, 818 includes a high-K dielectric layer such as hafnium oxide ($HfO_2$). Alternatively, the high-K dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric of the gate stacks 816, 818 may include silicon dioxide or other suitable dielectric.

In some embodiments, the gate electrode of the gate stacks 816, 818 may be deposited as part of a gate first or gate last (e.g., replacement gate) process, and the gate electrode may include a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode of the gate stacks 816, 818 may include a first metal material for the NMOS transistor (the logic device 804) and a second metal material for the PMOS transistor (the logic device 806).

Thus, the logic devices 804, 806 may include a dual work-function metal gate configuration. For example, the first metal material (e.g., for the NMOS transistor) may include metals having a work function substantially aligned with a work function of the substrate conduction band, or at least substantially aligned with a work function of the conduction band of a channel region of the logic device 804. Similarly, the second metal material (e.g., for the PMOS transistor) may include metals having a work function substantially aligned with a work function of the substrate valence band, or at least substantially aligned with a work function of the valence band of a channel region of the logic device 806. Thus, the gate electrode of the gate stacks 816, 818 may provide a gate electrode for both NMOS transistors and PMOS transistors. In some embodiments, the gate electrode of the gate stacks 816, 818 may alternately or additionally include a polysilicon layer. In some embodiments, the sidewall spacers (formed on sidewalls of the gate stacks 816, 818) may include a dielectric material such as silicon oxide, silicon nitride, silicon carbide, silicon oxynitride, or combinations thereof.

In various embodiments, the N-type source/drain regions 812 and the P-type source/drain regions 814 include diffused source/drain regions, ion implanted source/drain regions, epitaxially grown source/drain regions, or a combination thereof. A channel region of the logic device 804 is defined as the region between the N-type source/drain regions 812 under the gate stack 816, and within the substrate 202. Similarly, a channel region of the logic device 806 is defined as the region between the P-type source/drain regions 814 under the gate stack 818, and within the substrate 202. When a bias voltage greater than a threshold voltage ($V_t$) (i.e., turn-on voltage) for the logic devices 804, 806 is applied to their respective gate electrodes along with a concurrently applied bias voltage between their respective source and drain regions, an electric current (e.g., a transistor drive current) flows between the respective source and drain regions through the respective channel region. The amount of drive current developed for a given bias voltage (e.g., applied to the gate electrode or between the source and drain regions) is a function of, among others, the mobility of the material used to form the channel region within each of the logic devices 804, 806. In some examples, the channel region includes silicon (Si) and/or a high-mobility material such as germanium, which may be epitaxially grown, as well as any of the plurality of compound semiconductors or alloy semiconductors. High-mobility materials include those materials with electron and/or hole mobility greater than silicon (Si), which has an intrinsic electron mobility at room temperature (300 K) of around 1350 $cm^2$/V-s and a hole mobility of around 480 $cm^2$/V-s.

In some embodiments, the N-type region 808 and a P-type region 810 may be formed within the Ge layer 602 by ion implantation, as noted above. Similarly, in some embodiments, the N-type source/drain regions 812 and the P-type source/drain regions 814 may be formed by ion implantation, as also noted above. In particular, in some examples, an ion implantation process used to form the N-type source/drain regions 812 may simultaneously form the N-type region 808 within the Ge layer 602. Also, in some embodiments, an ion implantation process used to form the P-type source/drain regions 814 may simultaneously form the P-type region 810 within the Ge layer 602. Stated another way, the source/drain implant for the logic device 804 (NMOS transistor) may be used to simultaneously form the N-type region 808, and the source/drain implant for the logic device 806 (PMOS transistor) may be used to simultane-ously form the P-type region 810. To be sure, in some embodiments, separate ion implantation processes may be performed for the N-type source/drain regions 812 and the N-type region 808, and separate ion implantation processes may be performed for the P-type source/drain regions 814 and the P-type region 810. In various examples, the dopant species used to dope the N-type source/drain regions 812 and the N-type region 808 may include phosphorous (P), arsenic (As), antimony (Sb), a combination thereof, or another appropriate N-type dopant. In some embodiments, the dopant species used to dope the P-type source/drain regions 814 and the P-type region 810 may include boron (B), aluminum (Al), gallium (Ga), indium (In), or another appropriate P-type dopant.

It is noted that while the logic device 804 and the logic device 806 have been shown and described as including MOS transistors, these examples are not meant to be limiting, and it will be understood that a variety of other device types may equally be fabricated within the logic region 206, without departing from the scope of the present disclosure. For instance, in other embodiments, the logic region 206 may alternatively or additionally include FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other devices and/or circuits.

The method 100 then proceeds to block 116 where contacts are formed and back-end-of-line (BEOL) processing is performed. With reference to the example of FIG. 9, in an embodiment of block 116, a dielectric layer 902 is formed over the substrate 202 and over each of the optical sensor 802 within the optoelectronic region 204 and the logic devices 804, 806 within the logic region 206. In various embodiments, the dielectric layer 902 may include a plurality of dielectric layers. In some examples, the dielectric layer 902 may include an inter-layer dielectric (ILD) layer that may include materials such as tetraethyl-orthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

In various examples, the dielectric layer 902 may be patterned using a suitable combination of lithography and etching (e.g., wet or dry etching) processes to form openings within which metal layers may be deposited to provide electrical contact to underlying substrate features. In some embodiments, formation of such contacts may be part of the BEOL processing. For example, a metal layer 904 may be formed to provide electrical contact to the N-type region 808, a metal layer 906 may be formed to provide electrical contact to the P-type region 810, metal layers 908 may be formed to provide electrical contact to the N-type source/drain regions 812, a metal layer 910 may be formed to provide electrical contact to the gate electrode of the gate stack 816, metal layers 912 may be formed to provide electrical contact to the P-type source/drain regions 814, and a metal layer 914 may be formed to provide electrical contact to the gate electrode of the gate stack 818. In some examples, the metal layers 904, 906, 908, 910, 912, 914 may include W, Cu, Co, Ru, Al, Rh, Mo, Ta, Ti, TiN, TaN, WN, silicides, a combination thereof, or another suitable conductive material.

Figure 9:
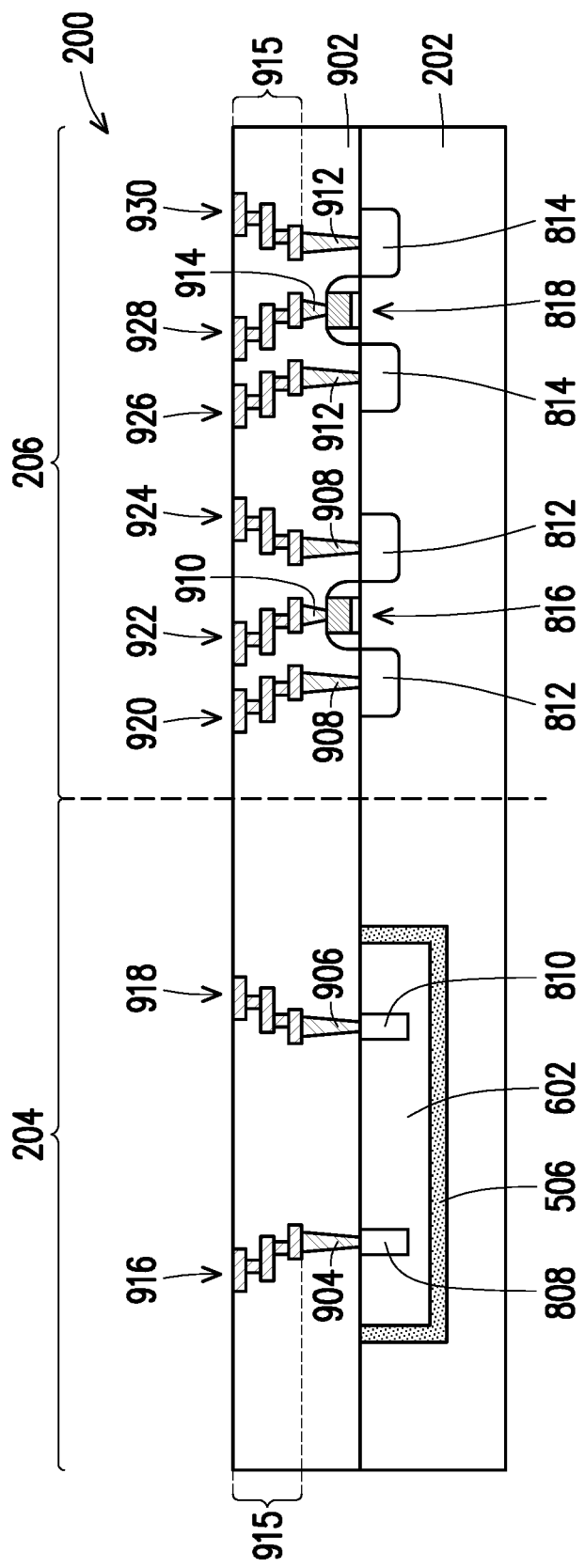

After forming the contacts to the underlying substrate features (e.g., including the metal layers 904, 906, 908, 910, 912, 914), further BEOL processing may be performed. For example, various vias/metal lines and multilayer interconnect features (e.g., metal layers and interlayer dielectrics, including portions of the dielectric layer 902) may be formed over the substrate 202, and may be configured to connect the various underlying substrate features to form a functional circuit (e.g., such as an optoelectronic circuit) that may include one or more optical sensors 802 from the optoelectronic region 204 and one or more logic devices 804, 806 from the logic region 206. As shown in the example of FIG. 9, a multilayer interconnection (MLI) region 915 may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, a portion 916 of the MLI region 915 may be formed to provide electrical contact to the metal layer 904 in contact with the N-type region 808, a portion 918 of the MLI region 915 may be formed to provide electrical contact to the metal layer 906 in contact with the P-type region 810, portions 920/924 of the MLI region 915 may be formed to provide electrical contact to the metal layers 908 in contact with the N-type source/drain regions 812, a portion 922 of the MLI region 915 may be formed to provide electrical contact to the metal layer 910 in contact with the gate electrode of the gate stack 816, portions 926/930 of the MLI region 915 may be formed to provide electrical contact to the metal layers 912 in contact with the P-type source/drain regions 814, and a portion 928 of the MLI region 915 may be formed to provide electrical contact to the metal layer 914 in contact with the gate electrode of the gate stack 818.

Figure 10:
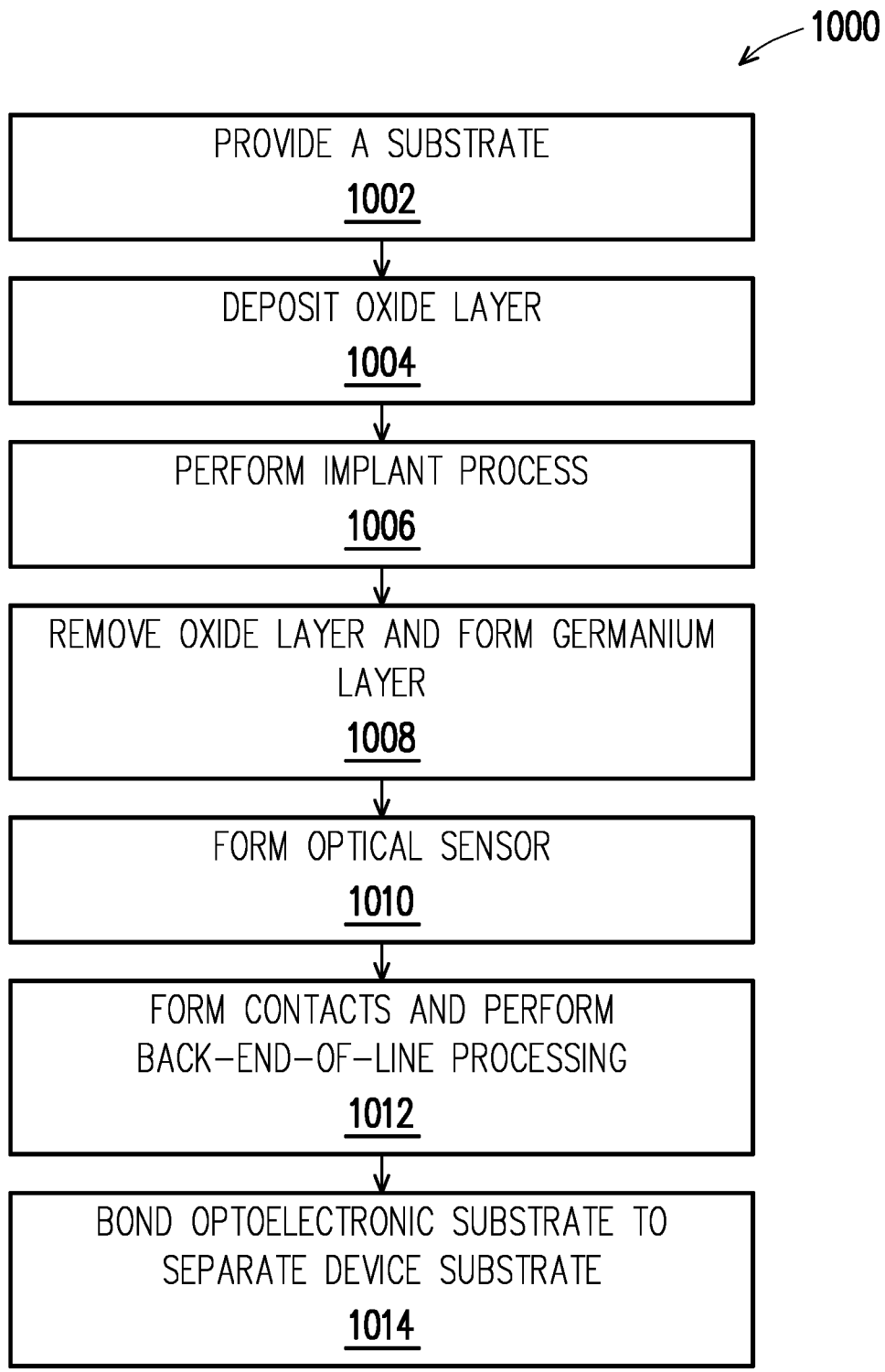
Figure 13:
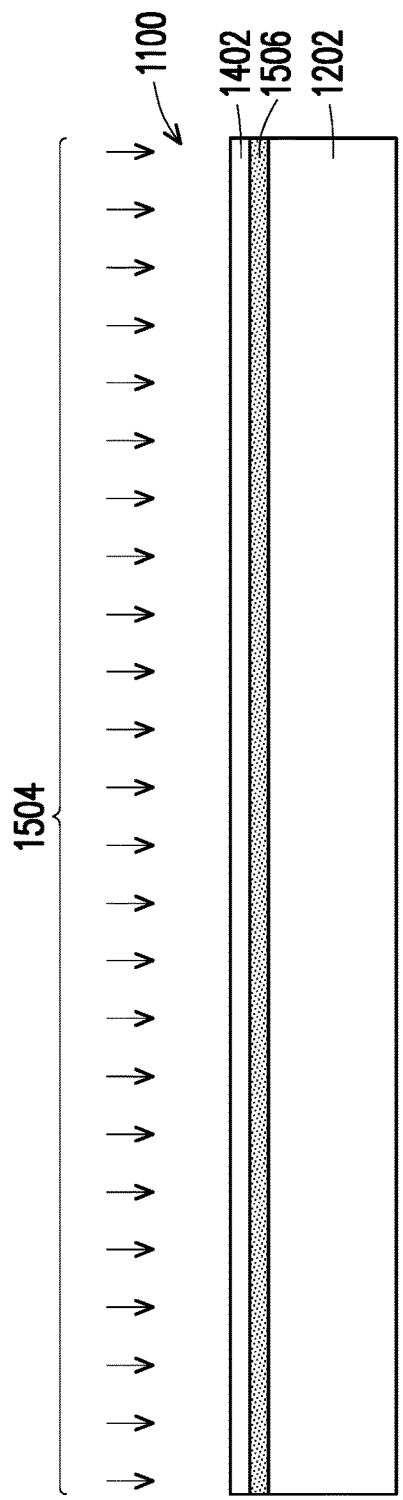
Figure 14:
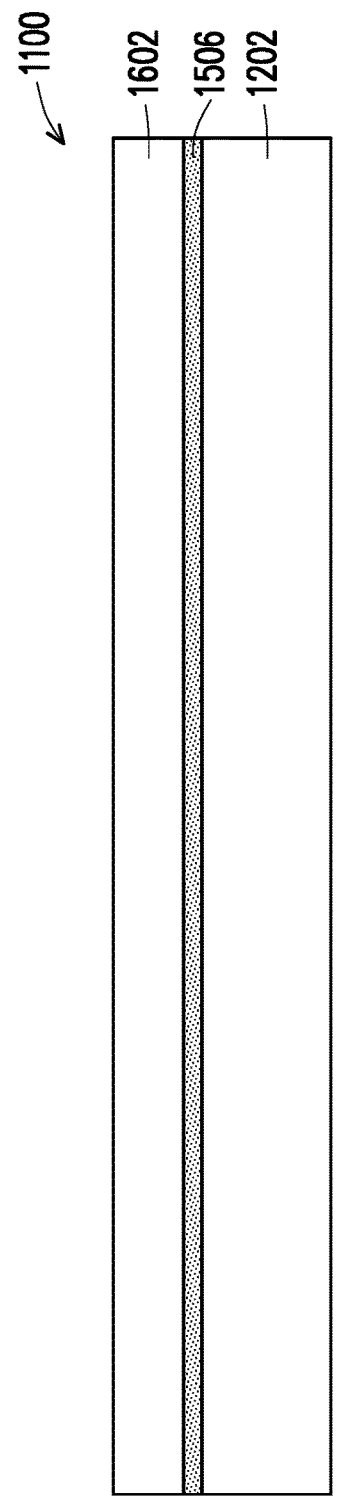
Figure 15:
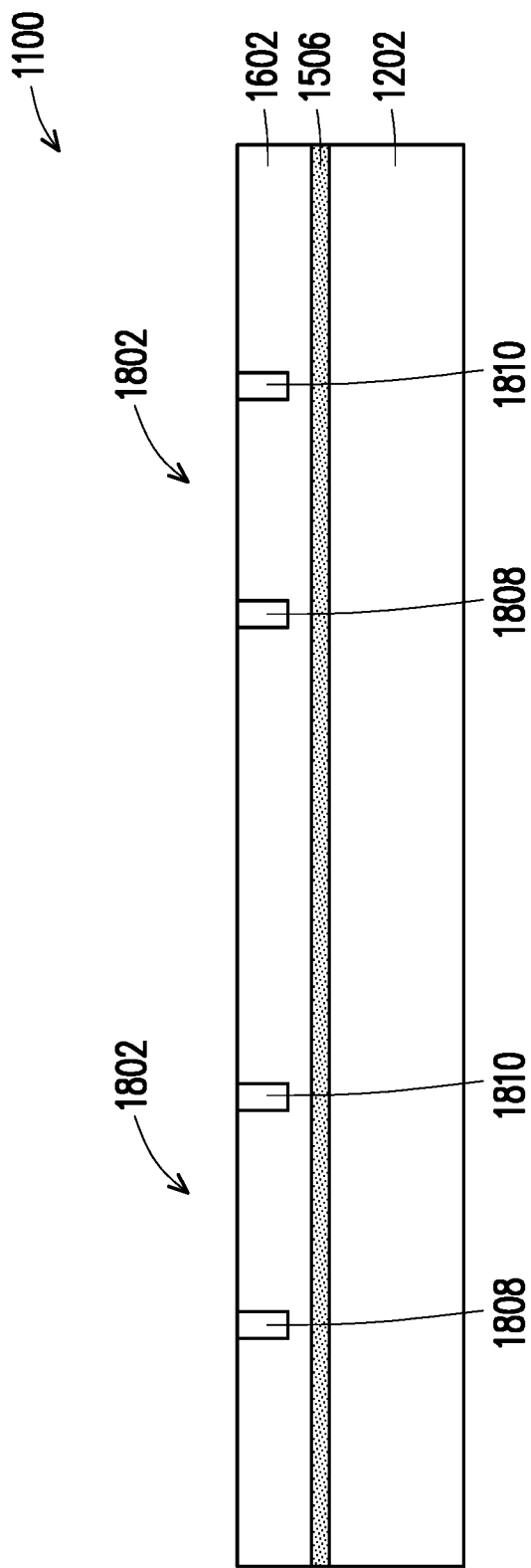

Referring now to FIG. 10, illustrated is a method 1000 of fabricating a semiconductor device 1100 including a Ge-based optical sensor, in accordance with some embodiments. The method 1000 is discussed below with reference to FIGS. 11-17, which provide cross-section views of the semiconductor device 1100, at various stages of fabrication, according to one or more steps of the method 1000. It is noted that various aspects of the method 1000 may be similar to the method 100, discussed above. Thus, for clarity of discussion, certain aspects of the method 1000 are only discussed briefly.

The method 1000 begins at block 1002 where a substrate is provided. Referring to the example of FIG. 11, in an embodiment of block 1002, a substrate 1202 is provided. In various embodiments, the substrate 1202 may be a semiconductor substrate such as a silicon substrate. More generally, the substrate 1202 may be substantially the same as the substrate 202, and may include one or more layers or features, as described above with reference to FIG. 2.

Instead of including separate optoelectronic and logic regions, as discussed above with reference to the method 100 and in some embodiments, the substrate 1202 may include a dedicated optoelectronic substrate including one or more optoelectronic devices (e.g., such as photodiodes) associated with one or more imaging pixels. To be sure, in at least some embodiments, the substrate 1202 may also include one or more logic devices and/or circuits. In some embodiments, and as described in more detail below, a separate device substrate (e.g., including core (logic) transistors and circuits, among other device) may be bonded to the optoelectronic substrate at a later stage of processing. In at least some examples, devices and/or circuits within the separate device substrate may include planar MOSFETs, FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other logic devices and/or circuits. In some embodiments, the separate device substrate may include an application-specific integrated circuit (ASIC). In some cases, one or more devices within the optoelectronic substrate may be coupled to one or more devices in the separate device substrate after the bonding process, for example, to collectively define a pixel circuit or other optoelectronic circuit.

The method 1000 then proceeds to block 1004 where an oxide layer is deposited. With reference to the example of FIG. 12, in an embodiment of block 1004, an oxide layer 1402 is deposited over the substrate 1202. The oxide layer 1402 may include $SiO_2$ or other suitable oxide layer. In various examples, the oxide layer 1402 may be deposited by CVD, PVD, ALD, or by another suitable process. In some cases, the oxide layer 1402 is a conformal layer having a substantially uniform thickness over the substrate 1202. The oxide layer 1402, in various embodiments and like the oxide layer 402 discussed above, may be used to control a depth (e.g., projected range) of a subsequently performed ion implantation process. For example, as a thickness of the oxide layer 1402 increases, the ion implant depth may decrease. In some embodiments, and like the oxide layer 402, the oxide layer 1402 may have the thickness 'T' which is in the range of about 50-5000 Angstroms.

The method 1000 then proceeds to block 1006 where an ion implantation process is performed. With reference to the example of FIG. 13, in an embodiment of block 1006, an ion implantation process 1504 is performed into the device 1100. The dopant species used for the ion implantation process 1504, in some examples, may include a P-type material (e.g., Group IIIA (e.g., boron (B), aluminum (Al), gallium (Ga), indium (In)), $BF_2$) and/or a Group VIIA material (e.g., fluorine (F), chlorine(Cl), bromine(Br)). In at least some embodiments, the ion implantation process 1504 includes a plurality of ion implantations, where the plurality of ion implantations implants a different dopant species, or where the plurality of ion implantations implants the same dopant species using different ion implantations parameters (e.g., such as dose and energy). As a result of the ion implantation process 1504, an implant region 1506 is formed within and along a top surface of the substrate 1202. In embodiments where the substrate 1202 includes Si, the implant region 1506 defines an ion-implanted Si region.

After subsequent formation of a Ge layer over the implant region 506, as described below, the implant region 506 will be located proximate to a Ge—Si interface. In some embodiments, the P-type material used for the ion implantation process 1504 may be used to change a carrier concentration of the substrate 1202 (e.g., such as a Si substrate), such that the Ge—Si interface is optimized and electrons in Si are substantially blocked from entering the Ge layer. In some cases, the Group VIIA material used for the ion implantation process 1504 may be used to neutralize trapped charges within the substrate 1202 (e.g., such as a Si substrate) which may be trapped by defects (e.g., dangling bonds) along the top surface of the substrate 1202 and in a region near the top surface of the substrate 1202. In particular, the Group VIIIA material may be used to neutralize trapped charges along a surface region of the substrate 1202 (e.g., such as a Si substrate) proximate to the Ge layer (or Ge photodiode layer), such that the Ge—Si interface is optimized and electrons in Si are substantially blocked from entering the Ge layer.

The method 1000 then proceeds to block 1008 where the oxide layer is removed, and a germanium layer is formed. With reference to the example of FIG. 14, in an embodiment of block 1008, after formation of the implant region 1506, the oxide layer 1402 is removed to expose the implant region 1506. In some embodiments, the oxide layer 1402 may be removed using a wet etching process, a dry etching process, or a combination thereof. After removal of the oxide layer 1402, and in a further embodiment of block 1008, a germanium (Ge) layer 1602 is formed over the substrate 1202 (e.g., including over the implant region 1506). In some embodiments, the Ge layer 1602 is formed by ALD, CVD, molecular beam epitaxy (MBE), metalorganic (MOCVD), and/or other suitable growth processes. Additionally, in some examples, the Ge layer 1602 includes an intrinsic Ge layer. Thus, in some embodiments, the Ge layer 1602 may be substantially undoped (e.g., having an insignificant amount of a dopant species present). In some embodiments, a CMP process may be optionally performed to planarize and/or thin the Ge layer 1602.

The method 1000 then proceeds to block 1010 where an optical sensor is formed. With reference to the example of FIG. 15, in an embodiment of block 1010, one or more optical sensors 1802 are formed within the Ge layer 1602. In some embodiments, the one or more optical sensors 1802 may include Ge optical sensors such as a Ge photodiodes (PDs). Each of the one or more optical sensors 1802 may include an N-type region 1808 and a P-type region 1810 formed within the Ge layer 1602. In some embodiments, the N-type regions 1808 and the P-type regions 1810 may be formed by ion implantation. In various examples, the dopant species used to dope the N-type regions 1808 may include phosphorous (P), arsenic (As), antimony (Sb), a combination thereof, or another appropriate N-type dopant. In some embodiments, the dopant species used to dope the P-type regions 1810 may include boron (B), aluminum (Al), gallium (Ga), indium (In), or another appropriate P-type dopant. In various examples, the N-type regions 1808 may provide cathodes for respective optical sensors 1802, and the P-type regions 1810 may provide anodes for respective optical sensors 1802. Thus, for each of the optical sensors 1802, the P-type region 1810, the region of the (intrinsic) Ge layer 1602 between the P-type region 1810 and the N-type region 1808, and the N-type region 1808 may collectively define a P—I—N Ge PD (or simply a P—N Ge PD). In some examples, when a photon of sufficient energy strikes the one or more optical sensors 1802, electron-hole pairs are created. In some cases, if photon absorption occurs in the intrinsic (or depletion) region of the one or more optical sensors 1802, then the generated electrons are swept toward the cathode (N-type regions 1808) and generated holes are swept toward the anode (P-type regions 1810), thereby generating a photocurrent.

As previously discussed, a total current through an optical sensor (e.g., such as the one or more optical sensors 1802) is the sum of the dark current and the photocurrent. However, in accordance with some embodiments, the implant region 1506, disposed proximate to the Ge—Si interface (e.g., within the substrate 1202 proximate to the Ge layer 1602), serves to effectively block current (electrons) from the substrate 1202 (e.g., such as Si) from entering the Ge layer 1602. As a result, the dark current component of the total current through the one or more optical sensors 1802 is reduced, and performance of the one or more optical sensors 1802 is improved. For example, as discussed above, the P-type material within the implant region 1506 may be used to change a carrier concentration of the substrate 1202, and/or the Group VIIA material within the implant region 1506 may be used to neutralize trapped charges within the substrate 1202, thereby optimizing the Ge—Si interface.

The method 1000 then proceeds to block 1012 where contacts are formed and BEOL processing is performed. With reference to the example of FIG. 16, in an embodiment of block 1012, a dielectric layer 1902 is formed over the substrate 1202 and over of the one or more optical sensors 1802. In various embodiments, the dielectric layer 1902 may include a plurality of dielectric layers. In some examples, the dielectric layer 1902 may include an ILD layer that may include materials such as TEOS oxide, un-doped silicate glass, or doped silicon oxide such as BPSG, FSG, PSG, BSG, and/or other suitable dielectric materials.

In various examples, the dielectric layer 1902 may be patterned using a suitable combination of lithography and etching (e.g., wet or dry etching) processes to form openings within which metal layers may be deposited to provide electrical contact to underlying substrate features. In some embodiments, formation of such contacts may be part of the BEOL processing. For example, a metal layer 1904 may be formed to provide electrical contact to the N-type regions 1808, and a metal layer 1906 may be formed to provide electrical contact to the P-type regions 1810. In some examples, the metal layers 1904, 1906 may include W, Cu, Co, Ru, Al, Rh, Mo, Ta, Ti, TiN, TaN, WN, silicides, a combination thereof, or another suitable conductive material.

Figure 16:
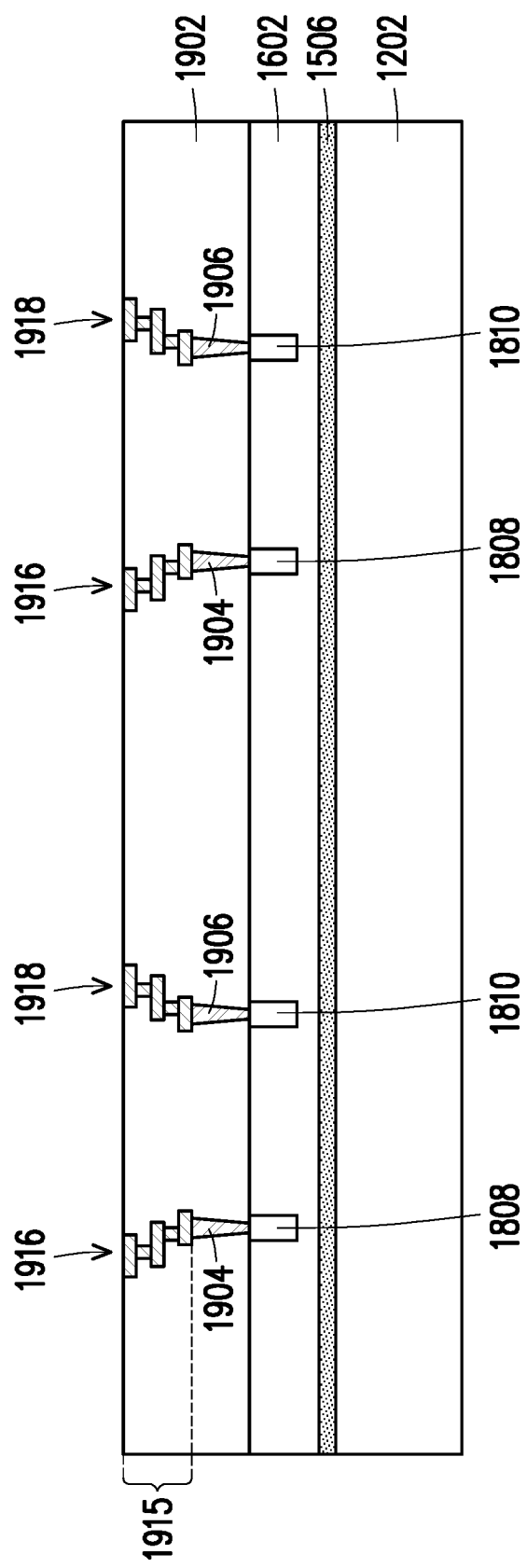
Figure 17:
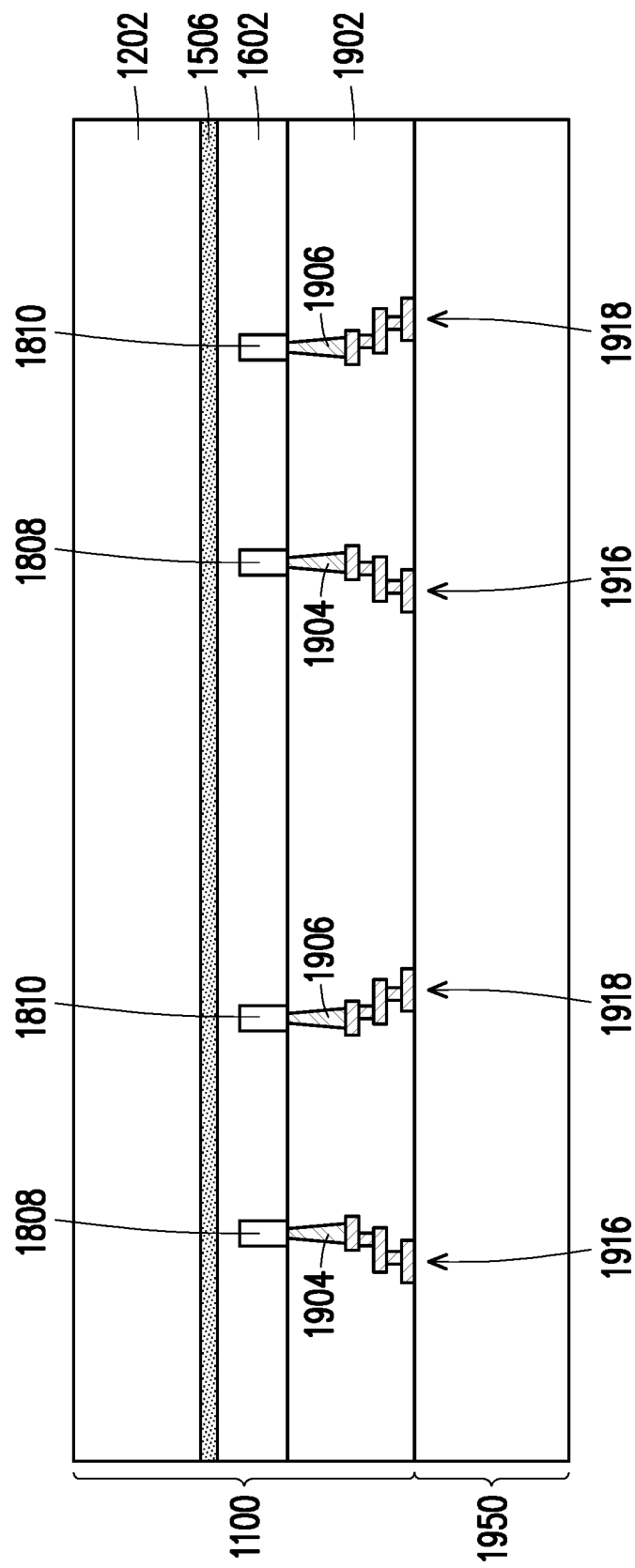

After forming the contacts to the underlying substrate features (e.g., including the metal layers 1904, 1906), further BEOL processing may be performed. For example, various vias/metal lines and multilayer interconnect features (e.g., metal layers and interlayer dielectrics, including portions of the dielectric layer 1902) may be formed over the substrate 1202, and may be configured to connect the various underlying substrate features (both to each other as well as to one or more devices on a separate device substrate subsequently bonded to the substrate 1202) to form a functional circuit (e.g., such as an optoelectronic circuit) that may include the one or more optical sensors 1802 and in some cases one or more devices (e.g., such as logic devices or other devices) from the separate device substrate. As shown in the example of FIG. 16, a multilayer interconnection (MLI) region 1915 may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, portions 1916 of the MLI region 1915 may be formed to provide electrical contact to the metal layers 1904 in contact with the N-type regions 1808, and portions 1918 of the MLI region 1915 may be formed to provide electrical contact to the metal layers 1906 in contact with the P-type regions 1810.

The method 1000 then proceeds to block 1014 where the optoelectronic substrate is bonded to a separate device substrate. With reference to the example of FIG. 17, in an embodiment of block 1014, the device 1100 (which includes the optoelectronic substrate) is bonded to a separate device substrate 1950. As previously noted, the separate device substrate 1950 may include core (logic) transistors and circuits, among other devices. In at least some examples, the devices and/or circuits within the separate device substrate 1950 may include planar MOSFETs, FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other logic devices and/or circuits. In some embodiments, the separate device substrate 1950 may include an application-specific integrated circuit (ASIC). In some cases, one or more devices within the optoelectronic substrate (the device 1100) may be coupled to one or more devices in the separate device substrate 1950 after the bonding process of block 1014, for example, to collectively define a pixel circuit or other optoelectronic circuit. In some examples, the device 1100 (including the optoelectronic substrate) may be bonded to the separate device substrate 1950 using a variety of structures and/or methods such as copper-to-copper hybrid bonding, interposers, through-silicon vias (TSVs), redistribution layers (RDLs), bond pads, copper microbumps and pillars, wirebonding, flip-chip, wafer-level packaging (WLP), or other appropriate wafer bonding technologies, including 2.5D and 3D integrated circuit (IC) packaging techniques.

Figure 18:
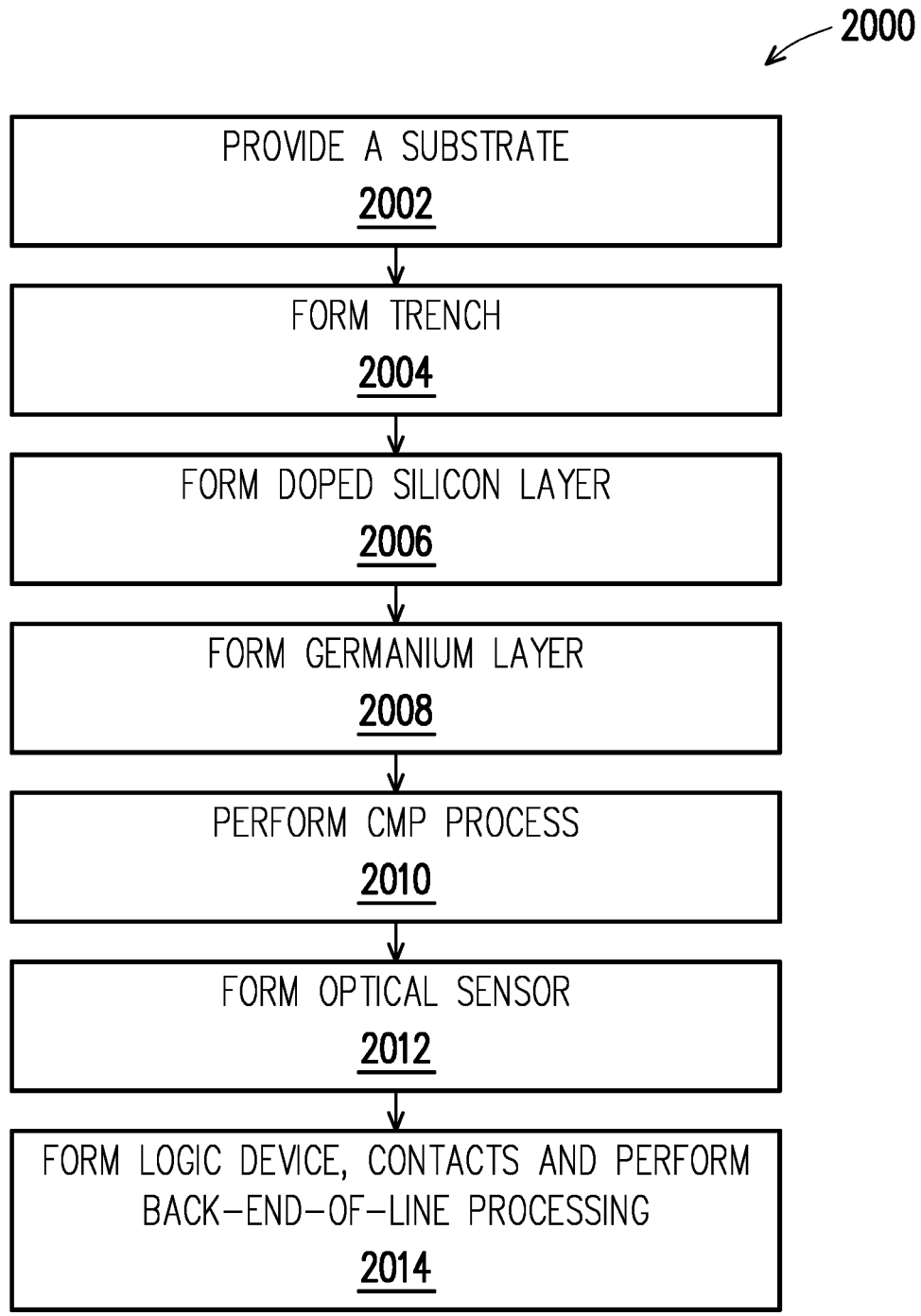
Figure 23:
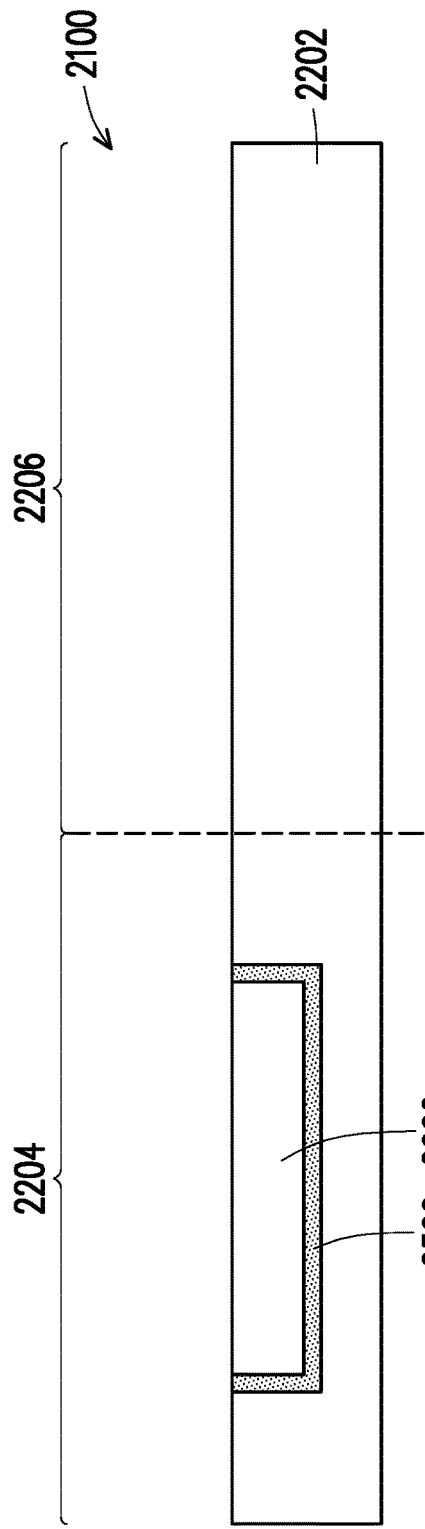
Figure 24:
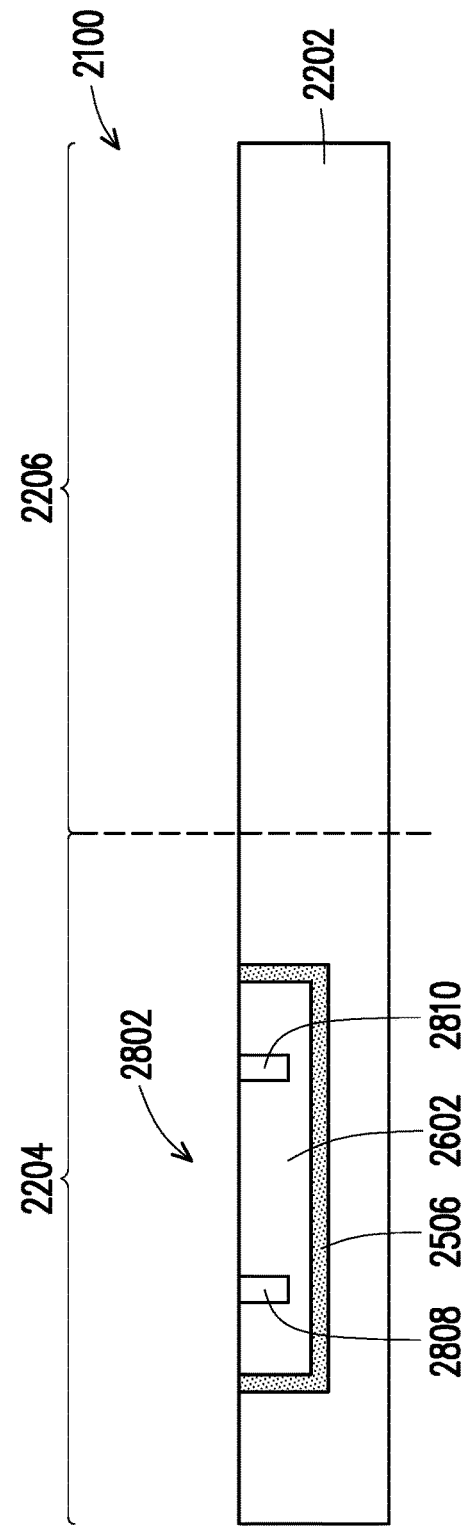

Referring now to FIG. 18, illustrated is a method 2000 of fabricating a semiconductor device 2100 including a Ge-based optical sensor, in accordance with some embodiments. The method 2000 is discussed below with reference to FIGS. 19-25, which provide cross-section views of the semiconductor device 2100, at various stages of fabrication, according to one or more steps of the method 2000. It is noted that various aspects of the method 2000 may be similar to the method 100, discussed above. Thus, for clarity of discussion, certain aspects of the method 2000 are only discussed briefly. Generally, and as discussed below, while the method 100 forms a doped-Si region in the trench using ion implantation, the method 2000, in some embodiments, forms a doped-Si region in the trench by way of doped epitaxial growth of a Si layer.

The method 2000 begins at block 2002 where a substrate is provided. Referring to the example of FIG. 19, in an embodiment of block 2002, a substrate 2202 is provided. In some embodiments, the substrate 2202 may be a semiconductor substrate such as a silicon substrate. More generally, the substrate 2202 may be substantially the same as the substrate 202, and may include one or more layers or features, as described above with reference to FIG. 2.

Like the device 200, discussed above, the substrate 2202 also includes an optoelectronic region 2204 (pixel region) and a logic region 2206. In some embodiments, the optoelectronic region 2204 and the logic region 2206 include various features and/or devices and circuits as discussed above with reference to the optoelectronic region 204 and the logic region 206 of the device 200. Additionally, in some embodiments, one or more devices within the logic region 2206 may be coupled to one or more devices in the optoelectronic region 2204, for example, to collectively define a pixel circuit or other optoelectronic circuit.

The method 2000 then proceeds to block 2004 where a trench is formed. With reference to the example of FIG. 20, in an embodiment of block 2004, a trench 2302 is formed within the optoelectronic region 2204. In some embodiments, and prior to formation of the trench 2302, a hard mask (HM) layer 2304 is deposited over the substrate 2202. The HM layer 2304 may include a silicon nitride layer such as $Si_3N_4$, silicon oxynitride, silicon carbide, an oxide layer, or a combination thereof. In various examples, the HM layer 2304 may initially be patterned, as described above with reference to the device 200, using a photolithography and etching process. Thereafter, an etching process (e.g., such as a dry etch, wet etch, or combination thereof) may be performed to etch the substrate 2202, using the patterned HM layer 2304 as a mask, to form the trench 2302 within the substrate 2202.

The method 2000 then proceeds to block 2006 where a doped silicon layer is formed. With reference to the example of FIG. 21, in an embodiment of block 2006, a doped silicon (Si) layer 2506 is formed within the trench 2302 (e.g., including along sidewall and bottom surfaces of the trench 2302). The doped Si layer 2506, in some examples, may include an epitaxially grown Si layer. More generally, in some embodiments, the doped Si layer 2506 is formed by ALD, CVD, molecular beam epitaxy (MBE), metalorganic (MOCVD), and/or other suitable growth processes. To provide the doping for the doped Si layer 2506, an appropriate dopant species may be introduced into a process chamber during growth of the Si layer (e.g., such as in an in situ doping process) to provide the doped Si layer 2506. In some examples, the dopant species may include a P-type material (e.g., Group IIIA (e.g., boron (B), aluminum (Al), gallium (Ga), indium (In)), $BF_2$) and/or a Group VIIA material (e.g., fluorine (F), chlorine(Cl), bromine(Br)).

As described in more detail below, the doped Si layer 2506 will be located proximate to a Ge—Si interface (e.g., after formation of a Ge layer within the trench 2302). In some embodiments, the P-type material used to form the doped Si layer 2506 may be used to change a carrier concentration of the substrate 2202 (e.g., such as a Si substrate), such that the Ge—Si interface is optimized and electrons in Si are substantially blocked from entering the Ge layer. In some cases, the Group VIIA material used to form the doped Si layer 2506 may be used to neutralize trapped charges within the substrate 2202 (e.g., such as a Si substrate) which may be trapped by defects (e.g., dangling bonds) along the top surface of the substrate 2202 and in a region near the top surface of the substrate 2202. In particular, the Group VIIA material may be used to neutralize trapped charges along a surface region of the substrate 2202 (e.g., such as a Si substrate) proximate to the Ge layer (or Ge photodiode layer), such that the Ge—Si interface is optimized and electrons in Si are substantially blocked from entering the Ge layer.

The method 2000 then proceeds to block 2008 where a germanium layer is formed. With reference to the example of FIG. 22, in an embodiment of block 2008, after formation of the doped Si layer 2506 along sidewall and bottom surfaces of the trench 2302, a germanium (Ge) layer 2602 is formed within the trench 2302 and over the implant region doped Si layer 2506. As shown, the Ge layer 2602 may in some cases overfill the trench 2302, resulting in a surface topography 2604 of the Ge layer 2602. In some embodiments, the Ge layer 2602 is formed by ALD, CVD, molecular beam epitaxy (MBE), metalorganic (MOCVD), and/or other suitable growth processes. Additionally, in some examples, the Ge layer 2602 includes an intrinsic Ge layer. Thus, in some embodiments, the Ge layer 2602 may be substantially undoped (e.g., having an insignificant amount of a dopant species present). It is noted that the portions of the HM layer 2304 that remain on surfaces of the device 2100 (e.g., outside the trench 2302) may prevent growth of the Ge layer 2602 on the HM layer 2304 (e.g., outside the trench 2302).

The method 2000 then proceeds to block 2010 where a chemical mechanical polishing (CMP) process is performed. With reference to the example of FIG. 23, in an embodiment of block 2010, a CMP process is performed after formation of the Ge layer 2602. In various embodiments, the CMP process serves to remove excess portions of the Ge layer 2602 (e.g., the portion of the Ge layer 2602 extending outside the trench 2302 and including the surface topography 2604) and planarize a top surface of the device 2100. In some embodiments, the CMP process of block 2010 may also serve to remove the HM layer 2304, as shown. As a result of the CMP process, a top surface of the substrate 2202 (e.g., adjacent to the trench 2302), a top surface of the Ge layer 2602, and top surfaces of portions of the doped Si layer 2506 along sidewall surfaces of the trench 2302 are substantially co-planar (level) with each other.

The method 2000 then proceeds to block 2012 where an optical sensor is formed. With reference to the example of FIG. 24, in an embodiment of block 2012, an optical sensor 2802 is formed in the optoelectronic region 2204 within the Ge layer 2602. In some embodiments, the optical sensor 2802 may include a Ge optical sensor such as a Ge photodiode (PD). The optical sensor 2802 may include an N-type region 2808 and a P-type region 2810 formed within the Ge layer 2602. In some embodiments, the N-type region 2808 and the P-type region 2810 may be formed by ion implantation. In various examples, the dopant species used to dope the N-type region 2808 may include phosphorous (P), arsenic (As), antimony (Sb), a combination thereof, or another appropriate N-type dopant. In some embodiments, the dopant species used to dope the P-type region 2810 may include boron (B), aluminum (Al), gallium (Ga), indium (In), or another appropriate P-type dopant. In various examples, the N-type region 2808 may provide a cathode for the optical sensor 2802, and the P-type region 2810 may provide an anode for the optical sensor 2802. Thus, the P-type region 2810, the region of the (intrinsic) Ge layer 2602 between the P-type region 2810 and the N-type region 2808, and the N-type region 2808 may collectively define a P—I—N Ge PD (or simply a P—N Ge PD). In some examples, when a photon of sufficient energy strikes the optical sensor 2802, an electron-hole pair is created. In some cases, if photon absorption occurs in the intrinsic (or depletion) region of the optical sensor 2802, then the generated electrons are swept toward the cathode (N-type region 2808) and generated holes are swept toward the anode (P-type region 2810), thereby generating a photocurrent.

In various embodiments, a total current through the optical sensor 2802 (Ge PD) is the sum of the dark current and the photocurrent. However, in accordance with some embodiments, the doped Si layer 2506, disposed proximate to the Ge—Si interface (e.g., proximate to the Ge layer 2602), serves to effectively block current (electrons) from the substrate 2202 (e.g., such as Si) from entering the Ge layer 2602. As a result, the dark current component of the total current through the optical sensor 2802 is reduced, and performance of the optical sensor 2802 is improved. For example, as discussed above, the P-type material within the doped Si layer 2506 may be used to change a carrier concentration of the substrate 2202, and/or the Group VIIA material within the doped Si layer 2506 may be used to neutralize trapped charges within the substrate 2202, thereby optimizing the Ge—Si interface.

The method 2000 then proceeds to block 2014 where a logic device is formed, contacts are formed, and BEOL processing is performed. With reference to the example of FIG. 25, in an embodiment of block 2014, logic devices 2804, 2806 are formed within the logic region 2206. In some embodiments, the logic device 2804 may include an NMOS transistor, and the logic device 2806 may include a PMOS transistor. In addition, the logic device 2804 may include a gate stack 2816, and the logic device 2806 may include a gate stack 2818. In various examples, each of the gate stacks 2816, 2818 may include a gate dielectric and a gate electrode over the gate dielectric, and sidewall spacers may be formed on sidewalls of the gate stacks 2816, 2818. Additionally, in various examples, the logic device 2804 may include N-type source/drain regions 2812 formed within the substrate 2202, adjacent to and on either side of the gate stack 2816, and the logic device 2806 may include P-type source/drain regions 2814 formed within the substrate 2202, adjacent to and on either side of the gate stack 2818.

In various embodiments, the gate dielectric of the gate stacks 2816, 2818 may be substantially the same as the gate dielectric of the gate stacks 816, 818, described above with reference to FIG. 8. In some embodiments, the gate electrode of the gate stacks 2816, 2818 may be substantially the same as the gate electrode of the gate stacks 816, 818, described above with reference to FIG. 8. In some examples, the sidewall spacers formed on sidewalls of the gate stacks 2816, 2818 may be substantially the same as the sidewall spacers formed on sidewalls of the gate stacks 816, 818, described above with reference to FIG. 8. Further, in some embodiments, the N-type source/drain regions 2812 and the P-type source/drain regions 2814 may be substantially the same as the N-type source/drain regions 812 and the P-type source/drain regions 814, described above with reference to FIG. 8. A channel region of the logic device 2804 is defined as the region between the N-type source/drain regions 2812 under the gate stack 2816, and within the substrate 2202. Similarly, a channel region of the logic device 2806 is defined as the region between the P-type source/drain regions 2814 under the gate stack 2818, and within the substrate 2202. In some examples, the channel region includes silicon (Si) and/or a high-mobility material such as germanium, which may be epitaxially grown, as well as any of the plurality of compound semiconductors or alloy semiconductors.

In at least some examples, an ion implantation process used to form the N-type source/drain regions 2812 may simultaneously form the N-type region 2808 within the Ge layer 2602. Also, in some embodiments, an ion implantation process used to form the P-type source/drain regions 2814 may simultaneously form the P-type region 2810 within the Ge layer 2602. In some examples, separate ion implantation processes may be performed for the N-type source/drain regions 2812 and the N-type region 2808, and separate ion implantation processes may be performed for the P-type source/drain regions 2814 and the P-type region 2810. In various examples, the dopant species used to dope the N-type source/drain regions 2812 may include phosphorous (P), arsenic (As), antimony (Sb), a combination thereof, or another appropriate N-type dopant. In some embodiments, the dopant species used to dope the P-type source/drain regions 2814 may include boron (B), aluminum (Al), gallium (Ga), indium (In), or another appropriate P-type dopant.

It is noted that while the logic device 2804 and the logic device 2806 have been shown and described as including MOS transistors, these examples are not meant to be limiting, and it will be understood that a variety of other device types may equally be fabricated within the logic region 2206, without departing from the scope of the present disclosure. For instance, in other embodiments, the logic region 2206 may alternatively or additionally include FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other devices and/or circuits.

Figure 25:
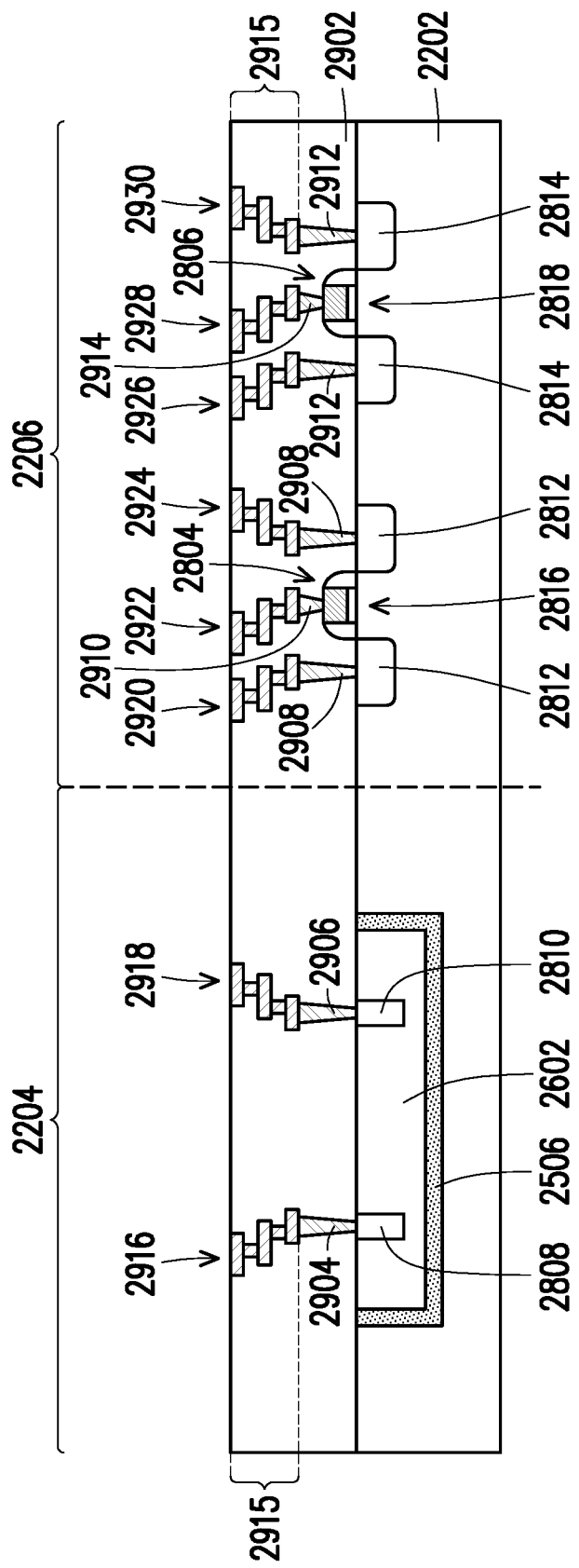

In a further embodiment of block 2014, and still with reference to the example of FIG. 25, a dielectric layer 2902 is formed over the substrate 2202 and over each of the optical sensor 2802 within the optoelectronic region 2204 and the logic devices 2804, 2806 within the logic region 2206. In various embodiments, the dielectric layer 2902 may be substantially the same as the dielectric layer 902, described above with reference to FIG. 9.

Like the dielectric layer 902, the dielectric layer 2902 may be patterned to form openings within which metal layers may be deposited to provide electrical contact to underlying substrate features. For example, a metal layer 2904 may be formed to provide electrical contact to the N-type region 2808, a metal layer 2906 may be formed to provide electrical contact to the P-type region 2810, metal layers 2908 may be formed to provide electrical contact to the N-type source/drain regions 2812, a metal layer 2910 may be formed to provide electrical contact to the gate electrode of the gate stack 2816, metal layers 2912 may be formed to provide electrical contact to the P-type source/drain regions 2814, and a metal layer 2914 may be formed to provide electrical contact to the gate electrode of the gate stack 2818. In some examples, the metal layers 2904, 2906, 2908, 2910, 2912, 2914 may include W, Cu, Co, Ru, Al, Rh, Mo, Ta, Ti, TiN, TaN, WN, silicides, a combination thereof, or another suitable conductive material.

After forming the contacts to the underlying substrate features (e.g., including the metal layers 2904, 2906, 2908, 2910, 2912, 2914), further BEOL processing may be performed. For example, various vias/metal lines and multilayer interconnect features (e.g., metal layers and interlayer dielectrics, including portions of the dielectric layer 2902) may be formed over the substrate 2202, and may be configured to connect the various underlying substrate features to form a functional circuit (e.g., such as an optoelectronic circuit) that may include one or more optical sensors 2802 from the optoelectronic region 2204 and one or more logic devices 2804, 2806 from the logic region 2206. As shown in FIG. 25, a multilayer interconnection (MLI) region 2915 may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, a portion 2916 of the MLI region 2915 may be formed to provide electrical contact to the metal layer 2904 in contact with the N-type region 2808, a portion 2918 of the MLI region 2915 may be formed to provide electrical contact to the metal layer 2906 in contact with the P-type region 2810, portions 2920/2924 of the MLI region 2915 may be formed to provide electrical contact to the metal layers 2908 in contact with the N-type source/drain regions 2812, a portion 2922 of the MLI region 2915 may be formed to provide electrical contact to the metal layer 2910 in contact with the gate electrode of the gate stack 2816, portions 2926/2930 of the MLI region 2915 may be formed to provide electrical contact to the metal layers 2912 in contact with the P-type source/drain regions 2814, and a portion 2928 of the MLI region 2915 may be formed to provide electrical contact to the metal layer 2914 in contact with the gate electrode of the gate stack 2818.

Figure 26:
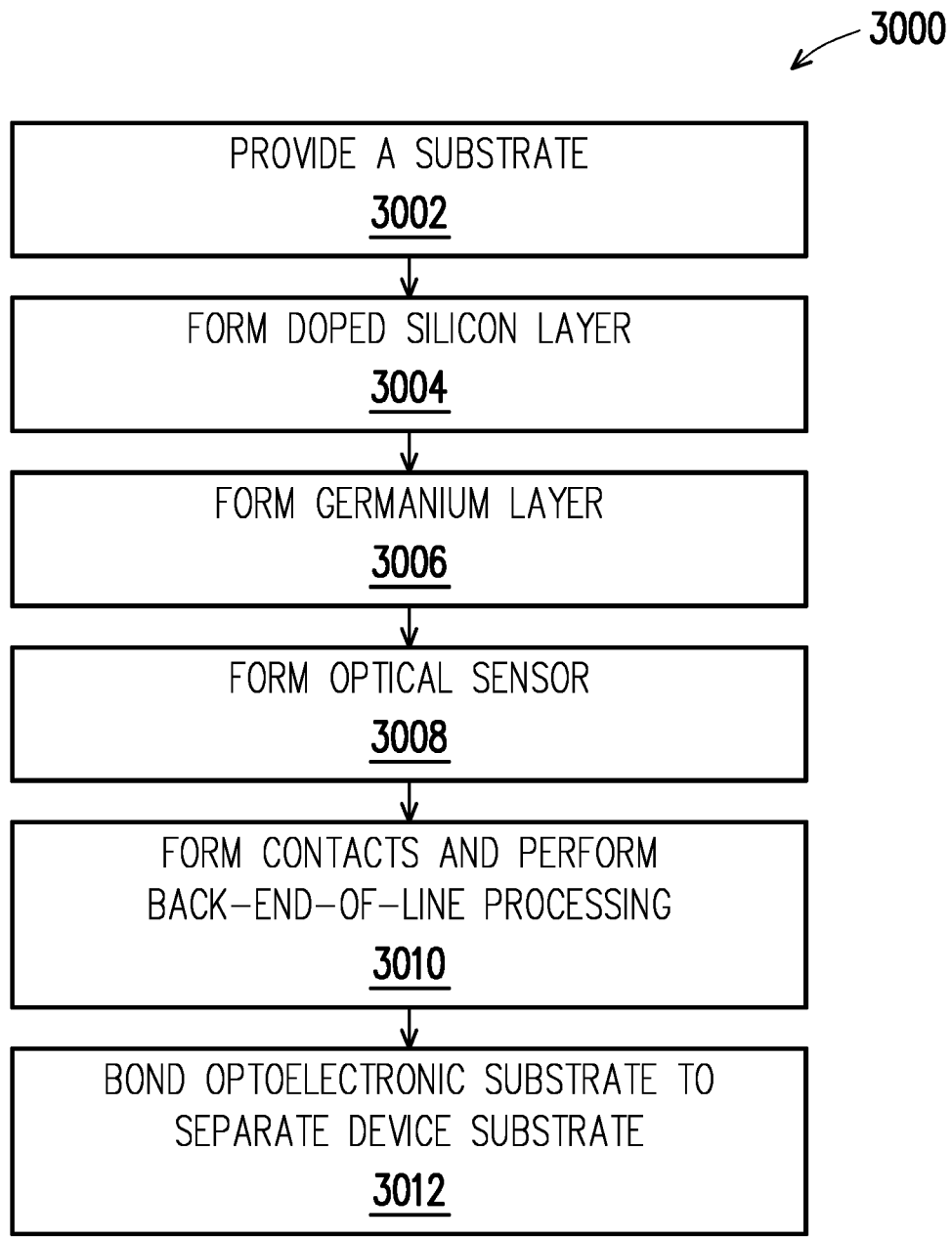
Figure 29:
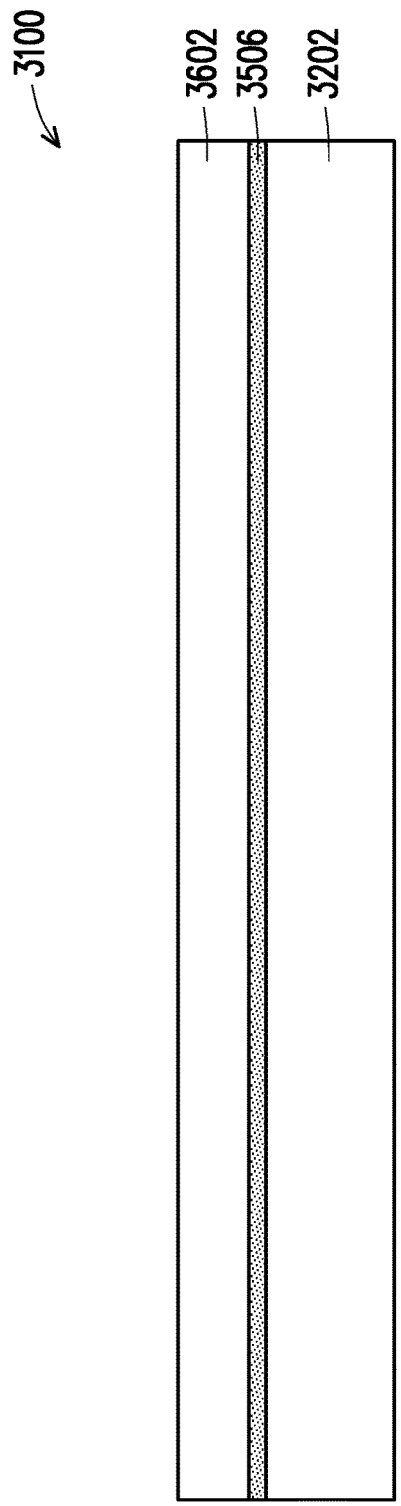
Figure 30:
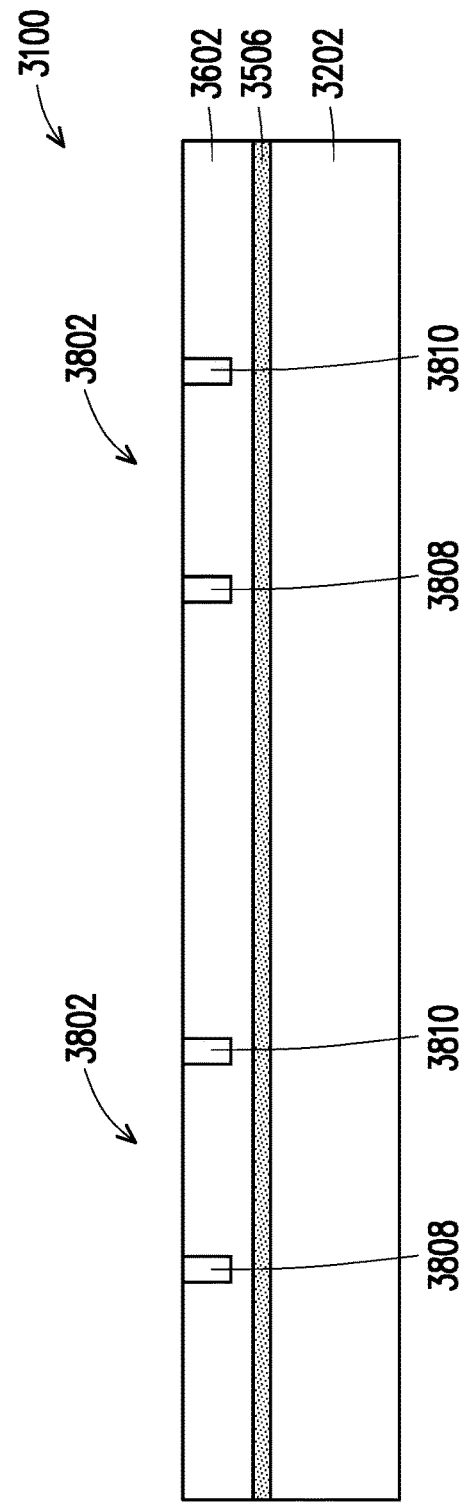

Referring now to FIG. 26, illustrated is a method 3000 of fabricating a semiconductor device 3100 including a Ge-based optical sensor, in accordance with some embodiments. The method 3000 is discussed below with reference to FIGS. 27-32, which provide cross-section views of the semiconductor device 3100, at various stages of fabrication, according to one or more steps of the method 3000. It is noted that various aspects of the method 3000 may be similar to the methods 1000 and 2000, discussed above. Thus, for clarity of discussion, certain aspects of the methods 1000 and 2000 are only discussed briefly. Generally, the method 3000, in some embodiments, forms a doped-Si region by way of doped epitaxial growth of a Si layer (similar to the method 2000), and the method 3000 provides a dedicated optoelectronic substrate bonded to a separate device substrate (similar to the method 1000).

The method 3000 begins at block 3002 where a substrate is provided. Referring to the example of FIG. 27, in an embodiment of block 3002, a substrate 3202 is provided. In various embodiments, the substrate 3202 may be a semiconductor substrate such as a silicon substrate. More generally, the substrate 3202 may be substantially the same as the substrate 202, and may include one or more layers or features, as described above with reference to FIG. 2.

Like the device 1100, discussed above, the substrate 3202 of the device 3100 may include a dedicated optoelectronic substrate including one or more optoelectronic devices (e.g., such as photodiodes) associated with one or more imaging pixels. To be sure, in at least some embodiments, the substrate 3202 may also include one or more logic devices and/or circuits. In some embodiments, and as described in more detail below, a separate device substrate (e.g., including core (logic) transistors and circuits, among other device) may be bonded to the optoelectronic substrate at a later stage of processing.

The method 3000 then proceeds to block 3004 where a doped silicon layer is formed. With reference to the example of FIG. 28, in an embodiment of block 3004, a doped silicon (Si) layer 3506 is formed over the substrate 3202. The doped Si layer 3506, in some examples, may include an epitaxially grown Si layer. More generally, in some embodiments, the doped Si layer 3506 is formed by ALD, CVD, MBE, MOCVD, and/or other suitable growth processes. To provide the doping for the doped Si layer 3506, an appropriate dopant species may be introduced into a process chamber during growth of the Si layer (e.g., such as in an in situ doping process) to provide the doped Si layer 3506. In some examples, the dopant species may include a P-type material (e.g., Group IIIA (e.g., boron (B), aluminum (Al), gallium (Ga), indium (In)), $BF_2$) and/or a Group VIIA material (e.g., fluorine (F), chlorine(Cl), bromine(Br)).

After subsequent formation of a Ge layer, as described below, the doped Si layer 3506 will be located proximate to a Ge—Si interface. In some embodiments, the P-type material used to form the doped Si layer 3506 may be used to change a carrier concentration of the substrate 3202 (e.g., such as a Si substrate), such that the Ge—Si interface is optimized and electrons in Si are substantially blocked from entering the Ge layer. In some cases, the Group VIIA material used to form the doped Si layer 3506 may be used to neutralize trapped charges within the substrate 3202 (e.g., such as a Si substrate) which may be trapped by defects (e.g., dangling bonds) along the top surface of the substrate 3202 and in a region near the top surface of the substrate 3202. In particular, the Group VIIIA material may be used to neutralize trapped charges along a surface region of the substrate 3202 (e.g., such as a Si substrate) proximate to the Ge layer (or Ge photodiode layer), such that the Ge—Si interface is optimized and electrons in Si are substantially blocked from entering the Ge layer.

The method 3000 then proceeds to block 3006 where a germanium layer is formed. With reference to the example of FIG. 29, in an embodiment of block 3006, after formation of the doped Si layer 3506 over the substrate 3202, a germanium (Ge) layer 3602 is formed over the doped Si layer 3506. In some embodiments, the Ge layer 3602 is formed by ALD, CVD, MBE, MOCVD, and/or other suitable growth processes. Additionally, in some examples, the Ge layer 3602 includes an intrinsic Ge layer. Thus, in some embodiments, the Ge layer 3602 may be substantially undoped (e.g., having an insignificant amount of a dopant species present). In some embodiments, a CMP process may be optionally performed to planarize and/or thin the Ge layer 3602.

The method 3000 then proceeds to block 3008 where an optical sensor is formed. With reference to the example of FIG. 30, in an embodiment of block 3008, one or more optical sensors 3802 are formed within the Ge layer 3602. In some embodiments, the one or more optical sensors 3802 may include Ge optical sensors such as a Ge photodiodes (PDs). Each of the one or more optical sensors 3802 may include an N-type region 3808 and a P-type region 3810 formed within the Ge layer 3602. In some embodiments, the N-type regions 3808 and the P-type regions 3810 may be formed by ion implantation. In various examples, the dopant species used to dope the N-type regions 3808 may include phosphorous (P), arsenic (As), antimony (Sb), a combination thereof, or another appropriate N-type dopant. In some embodiments, the dopant species used to dope the P-type regions 3810 may include boron (B), aluminum (Al), gallium (Ga), indium (In), or another appropriate P-type dopant. In various examples, the N-type regions 3808 may provide cathodes for respective optical sensors 3802, and the P-type regions 3810 may provide anodes for respective optical sensors 3802. Thus, for each of the optical sensors 3802, the P-type region 3810, the region of the (intrinsic) Ge layer 3602 between the P-type region 3810 and the N-type region 3808, and the N-type region 3808 may collectively define a P—I—N Ge PD (or simply a P—N Ge PD). In some examples, when a photon of sufficient energy strikes the one or more optical sensors 3802, electron-hole pairs are created. In some cases, if photon absorption occurs in the intrinsic (or depletion) region of the one or more optical sensors 3802, then the generated electrons are swept toward the cathode (N-type regions 3808) and generated holes are swept toward the anode (P-type regions 3810), thereby generating a photocurrent.

As previously discussed, a total current through an optical sensor (e.g., such as the one or more optical sensors 3802) is the sum of the dark current and the photocurrent. However, in accordance with some embodiments, the doped Si layer 3506, disposed proximate to the Ge—Si interface (e.g., proximate to the Ge layer 3602), serves to effectively block current (electrons) from the substrate 3202 (e.g., such as Si) from entering the Ge layer 3602. As a result, the dark current component of the total current through the one or more optical sensors 3802 is reduced, and performance of the one or more optical sensors 3802 is improved. For example, as discussed above, the P-type material within the doped Si layer 3506 may be used to change a carrier concentration of the substrate 3202, and/or the Group VIIA material within the doped Si layer 3506 may be used to neutralize trapped charges within the substrate 3202, thereby optimizing the Ge—Si interface.

The method 3000 then proceeds to block 3010 where contacts are formed and BEOL processing is performed. With reference to the example of FIG. 31, in an embodiment of block 3010, a dielectric layer 3902 is formed over the substrate 3202 and over of the one or more optical sensors 3802. In various embodiments, the dielectric layer 2902 may be substantially the same as the dielectric layer 902, described above with reference to FIG. 9.

Like the dielectric layer 902, the dielectric layer 3902 may be patterned to form openings within which metal layers may be deposited to provide electrical contact to underlying substrate features. For example, a metal layer 3904 may be formed to provide electrical contact to the N-type regions 3808, and a metal layer 3906 may be formed to provide electrical contact to the P-type regions 3810. In some examples, the metal layers 3904, 3906 may include W, Cu, Co, Ru, Al, Rh, Mo, Ta, Ti, TiN, TaN, WN, silicides, a combination thereof, or another suitable conductive material.

Figure 31:
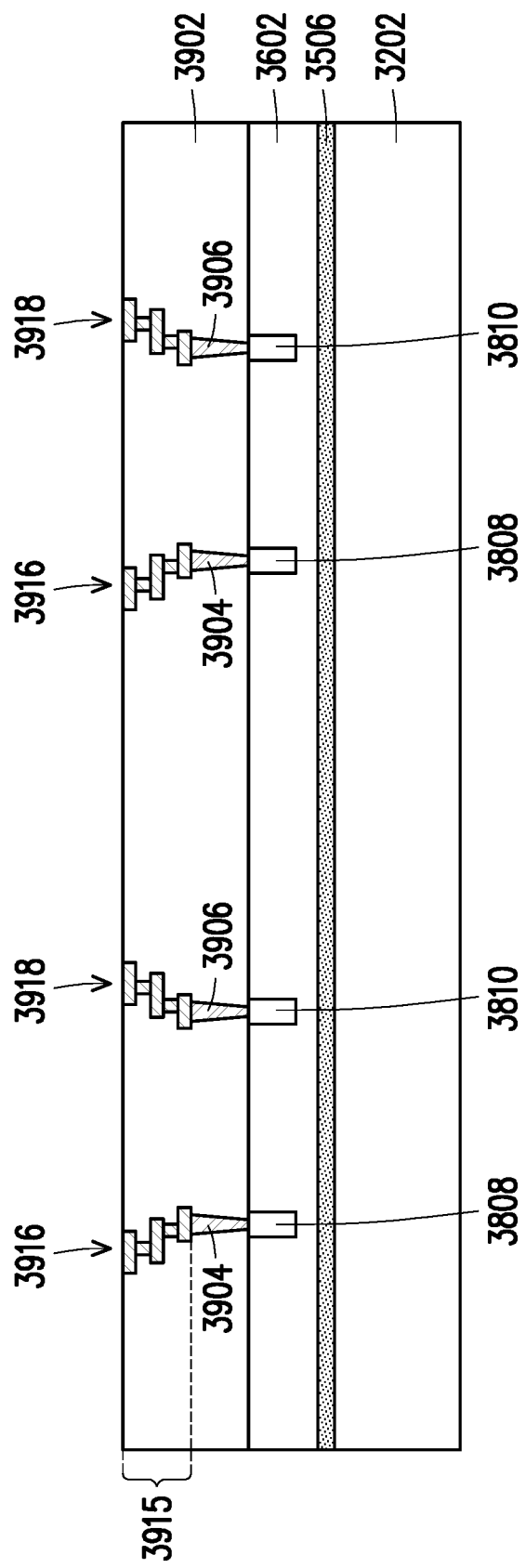
Figure 32:
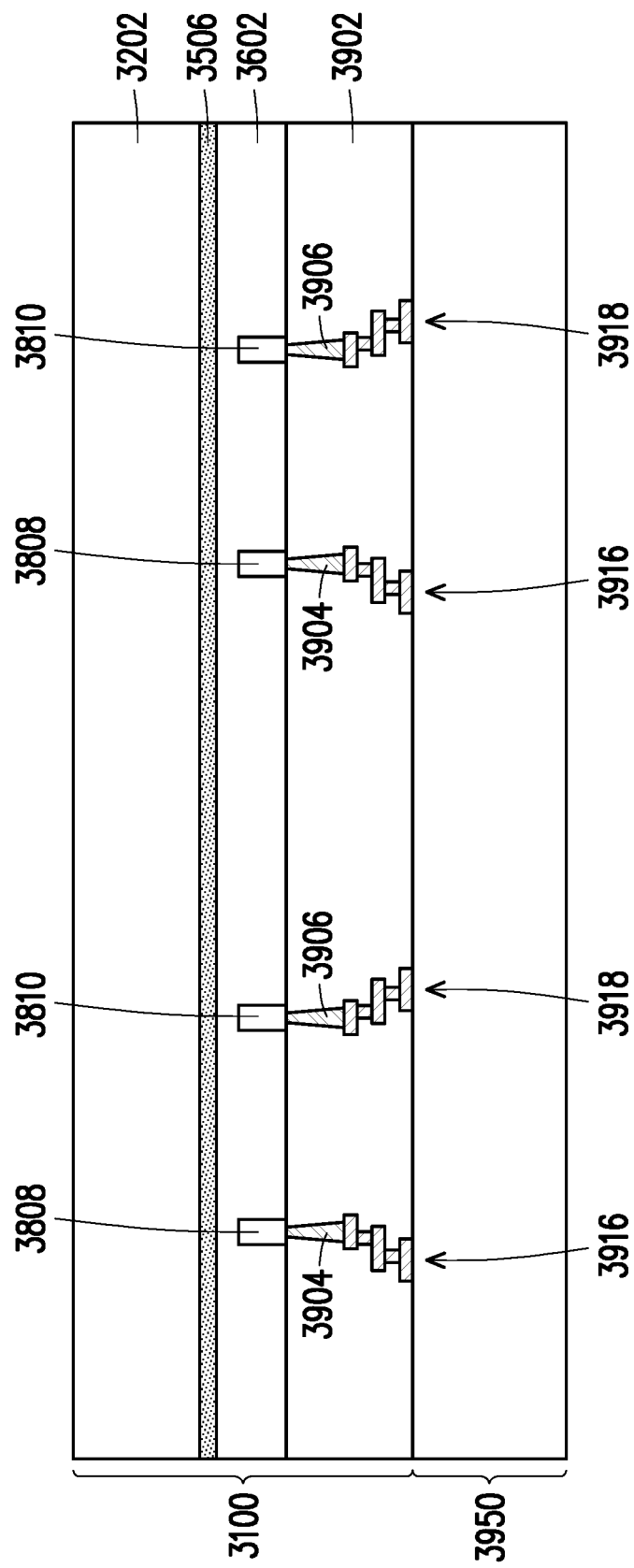

After forming the contacts to the underlying substrate features (e.g., including the metal layers 3904, 3906), further BEOL processing may be performed. For example, various vias/metal lines and multilayer interconnect features (e.g., metal layers and interlayer dielectrics, including portions of the dielectric layer 3902) may be formed over the substrate 3202, and may be configured to connect the various underlying substrate features (both to each other as well as to one or more devices on a separate device substrate subsequently bonded to the substrate 3202) to form a functional circuit (e.g., such as an optoelectronic circuit) that may include the one or more optical sensors 3802 and in some cases one or more devices (e.g., such as logic devices or other devices) from the separate device substrate. As shown in FIG. 31, a multilayer interconnection (MLI) region 3915 may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. In some embodiments, portions 3916 of the MLI region 3915 may be formed to provide electrical contact to the metal layers 3904 in contact with the N-type regions 3808, and portions 3918 of the MLI region 3915 may be formed to provide electrical contact to the metal layers 3906 in contact with the P-type regions 3810.

The method 3000 then proceeds to block 3012 where the optoelectronic substrate is bonded to a separate device substrate. With reference to the example of FIG. 32, in an embodiment of block 3012, the device 3100 (which includes the optoelectronic substrate) is bonded to a separate device substrate 3950. As previously noted, the separate device substrate 3950 may include core (logic) transistors and circuits, among other devices. In at least some examples, the devices and/or circuits within the separate device substrate 3950 may include planar MOSFETs, FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other logic devices and/or circuits. In some embodiments, the separate device substrate 3950 may include an application-specific integrated circuit (ASIC). In some cases, one or more devices within the optoelectronic substrate (the device 3100) may be coupled to one or more devices in the separate device substrate 3950 after the bonding process of block 3012, for example, to collectively define a pixel circuit or other optoelectronic circuit. In some examples, the device 3100 (including the optoelectronic substrate) may be bonded to the separate device substrate 3950 using a variety of structures and/or methods such as copper-to-copper hybrid bonding, interposers, through-silicon vias (TSVs), redistribution layers (RDLs), bond pads, copper microbumps and pillars, wirebonding, flip-chip, wafer-level packaging (WLP), or other appropriate wafer bonding technologies, including 2.5D and 3D integrated circuit (IC) packaging techniques.

In the methods 100, 1000, 2000, and 3000, discussed above, passivation of the Ge—Si interface was described as being accomplished generally by forming an ion-implanted Si region within a trench proximate to a Ge layer formed in the trench (as in the method 100), by forming an ion-implanted Si layer within a dedicated optoelectronic substrate proximate to a Ge layer formed over the optoelectronic substrate (as in the method 1000), by epitaxial growth of a doped Si layer within a trench proximate to a Ge layer formed in the trench (as in the method 2000), or by epitaxial growth of a doped Si layer over a dedicated optoelectronic substrate proximate to a Ge layer formed over the optoelectronic substrate (as in the method 3000).

In some alternative embodiments, the methods 100, 1000, 2000, 3000 may be modified such that the Ge layer (rather than Si) is ion-implanted or such that a doped epitaxial Ge layer is formed (instead of a doped epitaxial Si layer). These alternative embodiments are described below with reference to the methods 4000, 5000, 6000, and 7000. It is noted that methods 4000, 5000, 6000, 7000 are substantially similar to the methods 100, 1000, 2000, 3000, respectively. For example, in the method 4000, which mirrors the method 100, passivation of the Ge—Si interface may be accomplished generally by forming an ion-implanted Ge region within a Ge layer disposed in a trench and proximate to the Ge—Si interface. In the method 5000, which mirrors the method 1000, passivation of the Ge—Si interface may be accomplished generally by forming an ion-implanted Ge region (within a Ge layer formed over a Si layer) proximate to the Ge—Si interface. In the method 6000, which mirrors the method 2000, passivation of the Ge—Si interface may be accomplished generally by epitaxial growth of a doped Ge layer within a trench and proximate to the Ge—Si interface. In the method 7000, which mirrors the method 3000, passivation of the Ge—Si interface may be accomplished generally by epitaxial growth of a doped Ge layer (over a dedicated optoelectronic substrate) proximate to the Ge—Si interface.

It is also noted that various aspects discussed above with reference to the methods 100, 1000, 2000, 3000 may be equally applicable to the methods 4000, 5000, 6000, 7000, discussed below. For example, various layers, features, or process steps discussed above may be equally applicable to the discussion below. In addition, the discussion of the methods 4000, 5000, 6000, 7000 may repeat reference numerals and/or letters used above in respective methods 100, 1000, 2000, 3000. This repetition is for the purpose of simplicity and clarity and does not in itself dictate a relationship between the various embodiments and/or configurations discussed. Further, in view of the similarities between the methods 4000, 5000, 6000, 7000 and the methods 100, 1000, 2000, 3000, respectively, the methods 4000, 5000, 6000, 7000 are only briefly discussed below for the sake of clarity, with special attention given to those features and/or method steps that are substantially different.

Figure 33:
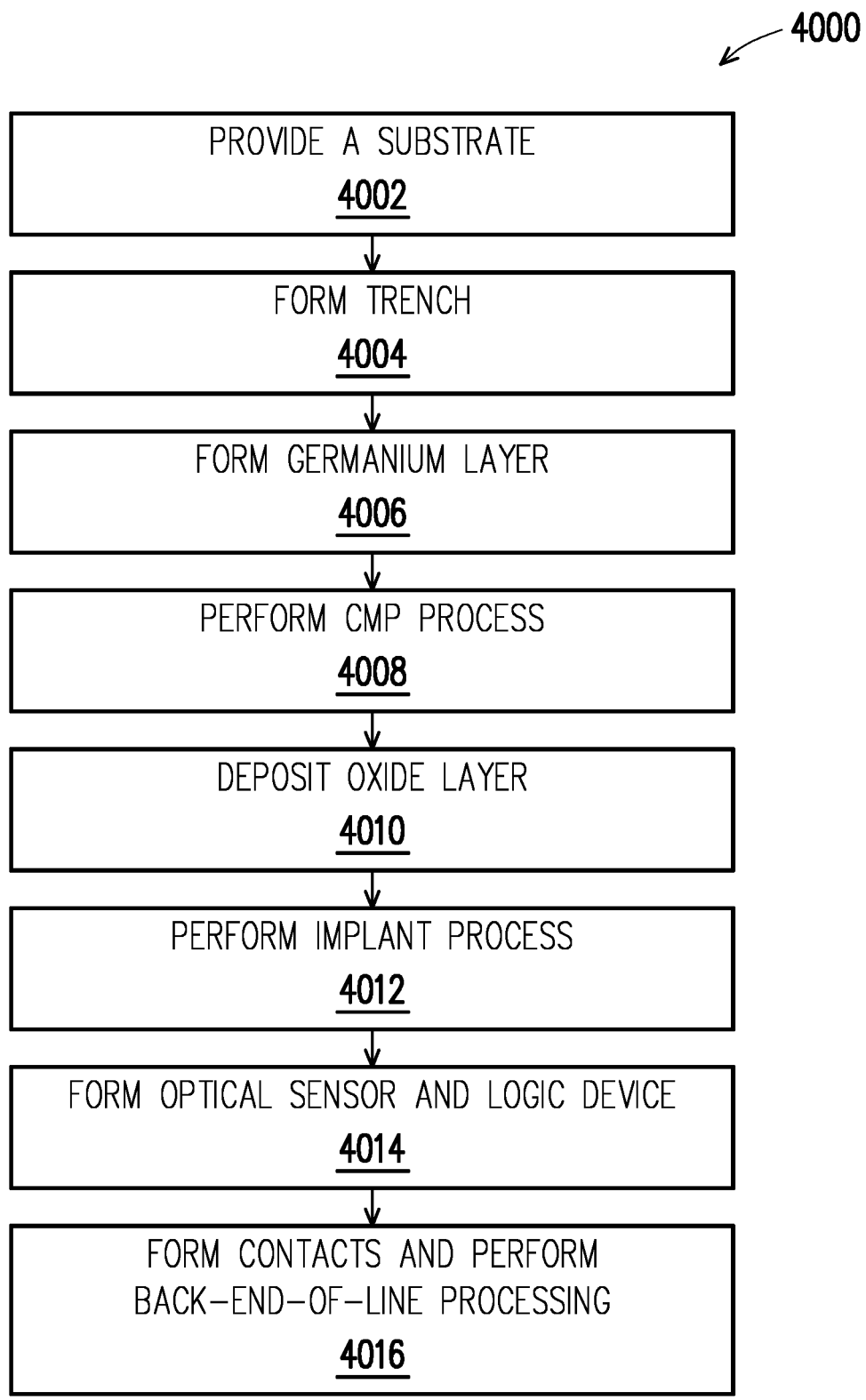
Figure 38:
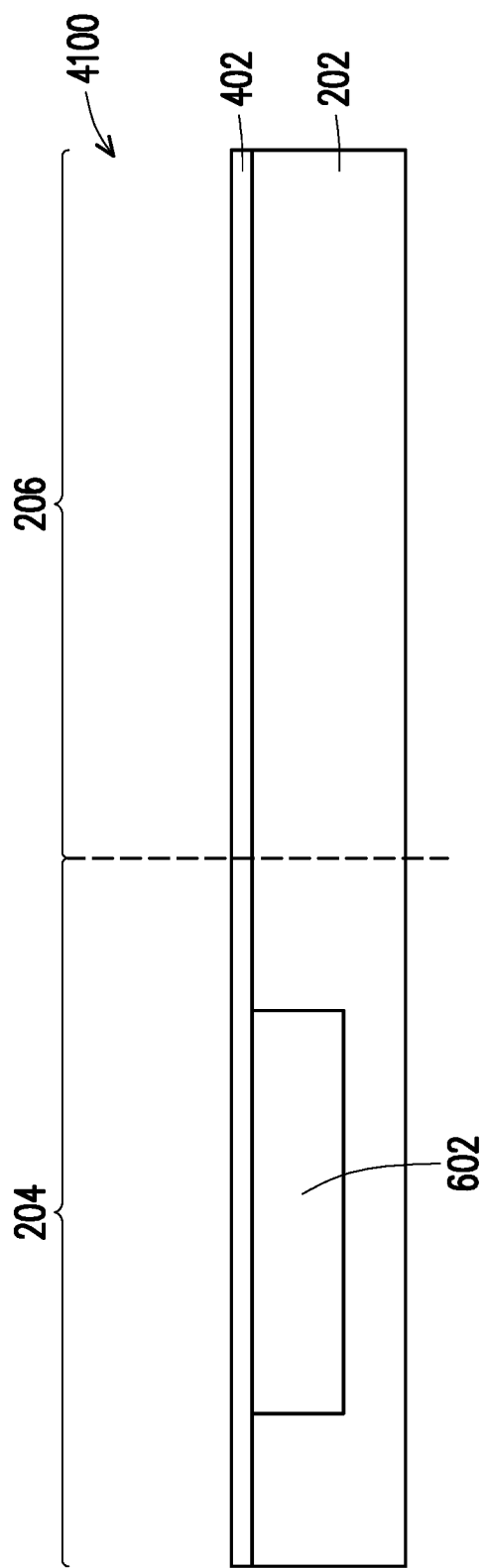
Figure 39:
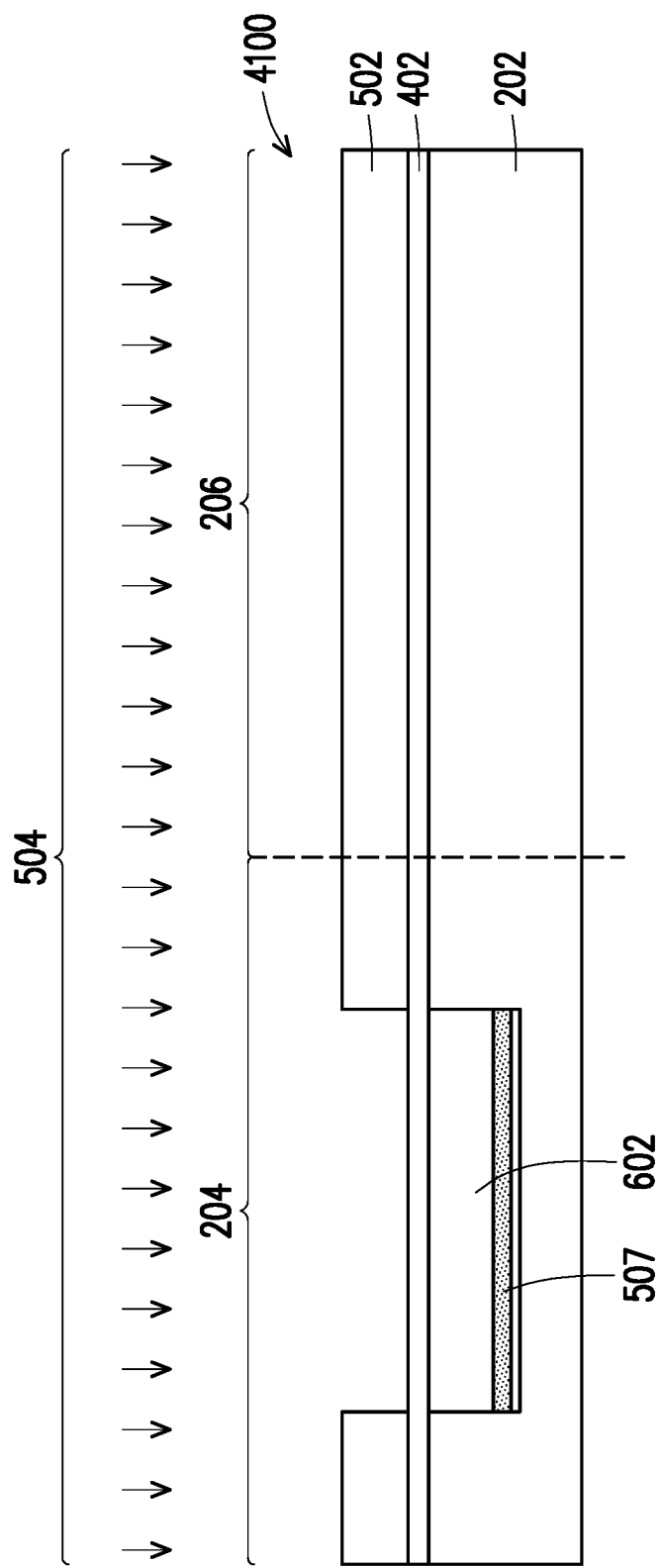
Figure 40:
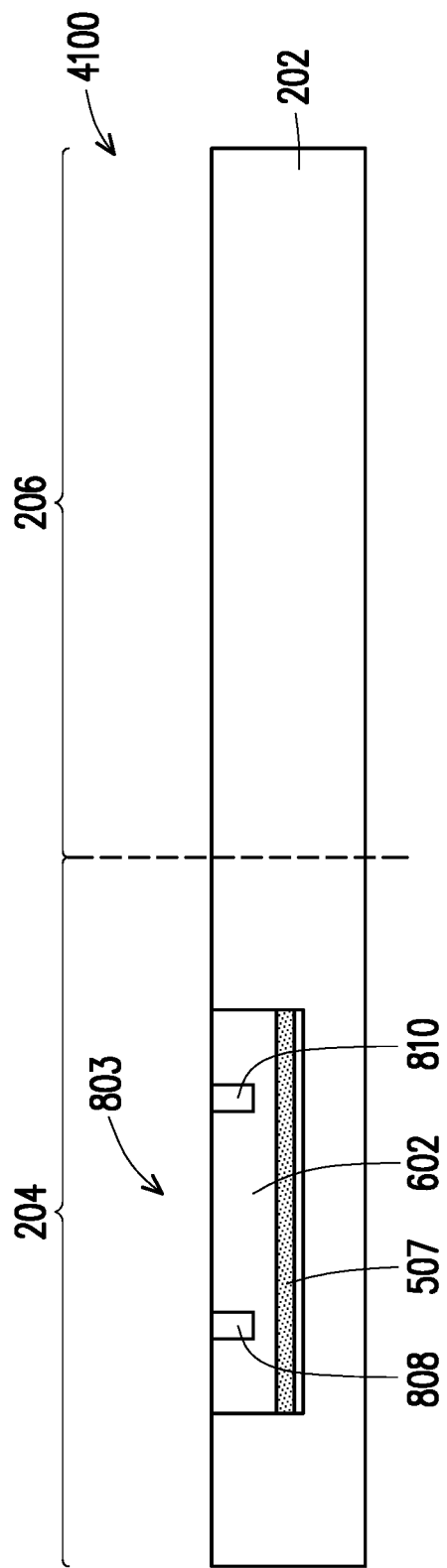
Figure 41:
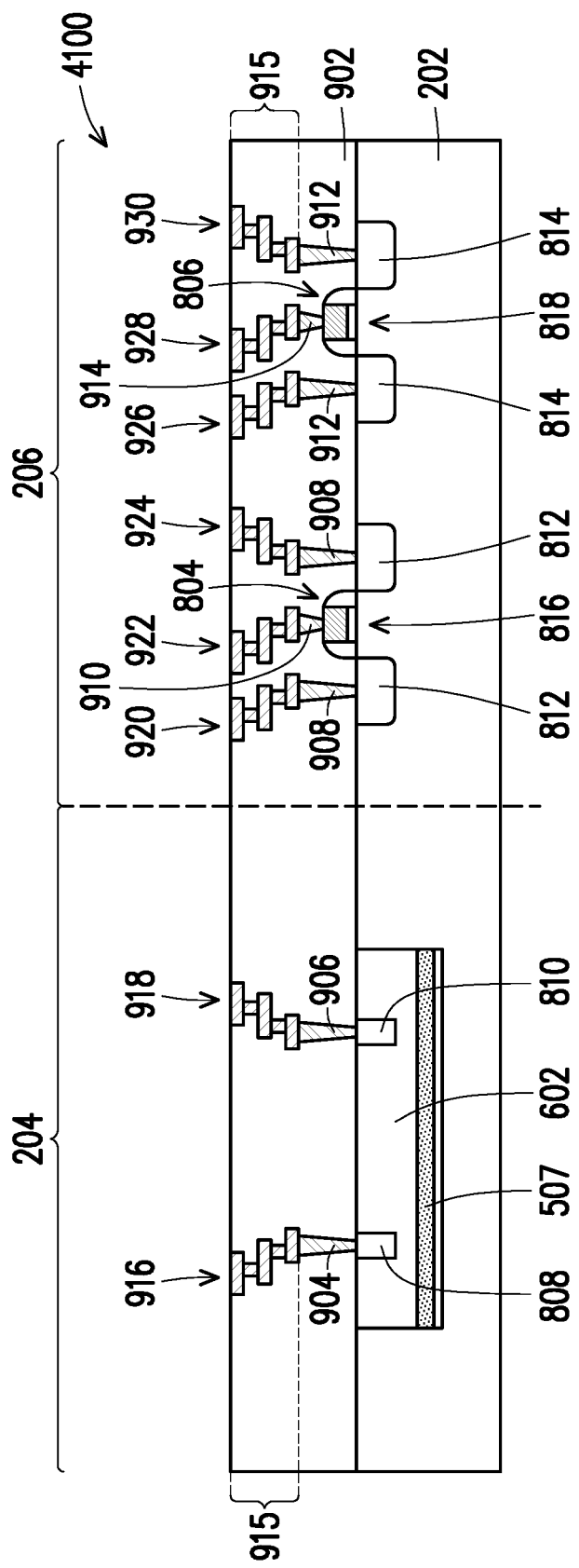

Referring now to FIG. 33, illustrated is a method 4000 of fabricating a semiconductor device 4100 including a Ge-based optical sensor, in accordance with some embodiments. The method 4000 is discussed below with reference to FIGS. 34-41, which provide cross-section views of the semiconductor device 4100, at various stages of fabrication, according to one or more steps of the method 4000. As previously noted, the method 4000 in certain respects mirrors the method 100, discussed above. Thus, for clarity of discussion, certain aspects of the method 4000 are only discussed briefly. Also, for the sake of clarity of discussion, various reference numerals and/or letters used above in the discussion of the method 100 are repeated in the discussion of the method 4000, when referring to similar features.

The method 4000 begins at block 4002 where a substrate is provided. In some embodiments, block 4002 of the method 4000 is substantially the same as block 102 of the method 100. Thus, with reference to the example of FIG. 34, in an embodiment of block 4002, the substrate 202 is provided. The substrate 202 may be a silicon substrate or other substrate as described above, and the substrate 202 also includes an optoelectronic region 204 and a logic region 206, as previously discussed.

The method 4000 then proceeds to block 4004 where a trench is formed. In some embodiments, block 4004 of the method 4000 is substantially the same as block 104 of the method 100. Thus, with reference to the example of FIG. 35, in an embodiment of block 4004, the trench 302 is formed within the optoelectronic region 204. The HM layer 304, discussed above, is also illustrated.

The method 4000 then proceeds to block 4006 where a germanium layer is formed. In some embodiments, block 4006 of the method 4000 is similar to block 110 of the method 100. With reference to the example of FIG. 36, in an embodiment of block 4006, the germanium (Ge) layer 602 is formed within the trench 302. As shown, the Ge layer 602 may in some cases overfill the trench 302, resulting in a surface topography 604 of the Ge layer 602. In some examples, the Ge layer 602 includes an intrinsic Ge layer. Thus, in contrast to the method 100, the method 4000 forms the Ge layer 602 prior to formation of an implant region at the Ge—Si interface, as described below.

The method 4000 then proceeds to block 4008 where CMP process is performed. In some embodiments, block 4008 of the method 4000 is similar to block 112 of the method 100. With reference to the example of FIG. 37, in an embodiment of block 4008, a CMP process is performed to remove excess portions of the Ge layer 602 and planarize a top surface of the device 4100. As a result of the CMP process, a top surface of the substrate 202 (e.g., adjacent to the trench 302) and a top surface of the Ge layer 602 are substantially co-planar (level) with each other.

The method 4000 then proceeds to block 4010 where an oxide layer is deposited. In some embodiments, block 4010 of the method 4000 is similar to block 106 of the method 100. With reference to the example of FIG. 38, in an embodiment of block 4010, the oxide layer 402 is deposited over the substrate 202 (e.g., within both the optoelectronic region 204 and the logic region 206), including over the Ge layer 602 deposited within the trench 302. As noted above, the oxide layer 402, in various embodiments, may be used to control a depth (e.g., projected range) of a subsequently performed ion implantation process.

The method 4000 then proceeds to block 4012 where an ion implantation process is performed. In some embodiments, block 4012 of the method 4000 is similar to block 108 of the method 100. With reference to the example of FIG. 39, in an embodiment of block 4012, the patterned implant masking layer 502 is formed over the substrate 202 and the ion implantation process 504 is performed into the device 4100. The dopant species used for the ion implantation process 504, in some examples, may include a P-type material (e.g., Group IIIA (e.g., boron (B), aluminum (Al), gallium (Ga), indium (In)), $BF_2$) and/or a Group VIIA material (e.g., fluorine (F), chlorine(Cl), bromine(Br)). As a result of the ion implantation process 504, an implant region 507 is formed within and along a bottom portion of the Ge layer 602 proximate to the Ge—Si interface. Thus, the implant region 507 defines an ion-implanted Ge region. After forming the implant region 507, the implant masking layer 502 and the oxide layer 402 may be removed.

In some embodiments, the P-type material used to form the implant region 507 may be used to change a carrier concentration of the Ge layer 602 (e.g., at least the bottom portion of the Ge layer 602), such that the Ge—Si interface is optimized and electrons in Si are substantially blocked from entering the Ge layer. In some cases, the Group VIIA material used to form the implant region 507 may be used to neutralize trapped charges within the Ge layer 602 which may be trapped by defects (e.g., dangling bonds) along the bottom surface of the Ge layer 602 proximate to the Ge—Si interface such that the Ge—Si interface is optimized and electrons in Si are substantially blocked from entering the Ge layer.

The method 4000 then proceeds to block 4014 where an optical sensor and a logic device are formed. In some embodiments, block 4014 of the method 4000 is similar to block 114 of the method 100. With reference to the example of FIGS. 40/41, in an embodiment of block 4014, an optical sensor 803 is formed in the optoelectronic region 204 within the Ge layer 602, and logic devices 804, 806 are formed within the logic region 206. The optical sensor 803 may include a Ge optical sensor such as a Ge photodiode (PD), and may include the N-type region 808 (cathode) and the P-type region 810 (anode) formed within the Ge layer 602. The optical sensor 803 may include a P—I—N Ge PD (or simply a P—N Ge PD).

In various embodiments, a total current through the optical sensor 803 (Ge PD) is the sum of the dark current and the photocurrent. However, in accordance with some embodiments, the implant region 507, disposed proximate to the Ge—Si interface (e.g., within the Ge layer 602), serves to effectively block current (electrons) from the substrate 202 (e.g., such as Si) from entering the Ge layer 602. As a result, the dark current component of the total current through the optical sensor 803 is reduced, and performance of the optical sensor 803 is improved.

As described above, the logic region 206 includes the logic device 804 (NMOS transistor) and the logic device 806 (PMOS transistor). The logic device 804 includes the gate stack 816, and the logic device 806 includes gate stack 818, described above. Sidewall spacers may be formed on sidewalls of the gate stacks 816, 818. Additionally, the logic device 804 may include N-type source/drain regions 812 formed within the substrate 202, adjacent to and on either side of the gate stack 816, and the logic device 806 may include P-type source/drain regions 814 formed within the substrate 202, adjacent to and on either side of the gate stack 818.

In some examples, an ion implantation process used to form the N-type source/drain regions 812 may simultaneously form the N-type region 808 within the Ge layer 602. Also, in some embodiments, an ion implantation process used to form the P-type source/drain regions 814 may simultaneously form the P-type region 810 within the Ge layer 602. Alternatively, in some embodiments, separate ion implantation processes may be performed for the N-type source/drain regions 812 and the N-type region 808, and separate ion implantation processes may be performed for the P-type source/drain regions 814 and the P-type region 810. In various examples, the dopant species used to dope the N-type source/drain regions 812 and the N-type region 808 may include phosphorous (P), arsenic (As), antimony (Sb), a combination thereof, or another appropriate N-type dopant. In some embodiments, the dopant species used to dope the P-type source/drain regions 814 and the P-type region 810 may include boron (B), aluminum (Al), gallium (Ga), indium (In), or another appropriate P-type dopant.

The method 4000 then proceeds to block 4016 where contacts are formed and BEOL processing is performed. In some embodiments, block 4016 of the method 4000 is similar to block 116 of the method 100. With reference to the example of FIG. 41, in an embodiment of block 4016, the dielectric layer 902 is formed over the substrate 202 and over each of the optical sensor 803 within the optoelectronic region 204 and the logic devices 804, 806 within the logic region 206.

In various examples, the dielectric layer 902 may be patterned to form openings within which metal layers may be deposited to provide electrical contact to underlying substrate features. For example, the metal layer 904 may be formed to provide electrical contact to the N-type region 808, the metal layer 906 may be formed to provide electrical contact to the P-type region 810, metal layers 908 may be formed to provide electrical contact to the N-type source/drain regions 812, the metal layer 910 may be formed to provide electrical contact to the gate electrode of the gate stack 816, metal layers 912 may be formed to provide electrical contact to the P-type source/drain regions 814, and the metal layer 914 may be formed to provide electrical contact to the gate electrode of the gate stack 818.

Thereafter, multilayer interconnect features may be formed. As discussed above, the portion 916 of the MLI region 915 may be formed to provide electrical contact to the metal layer 904 in contact with the N-type region 808, the portion 918 of the MLI region 915 may be formed to provide electrical contact to the metal layer 906 in contact with the P-type region 810, portions 920/924 of the MLI region 915 may be formed to provide electrical contact to the metal layers 908 in contact with the N-type source/drain regions 812, the portion 922 of the MLI region 915 may be formed to provide electrical contact to the metal layer 910 in contact with the gate electrode of the gate stack 816, portions 926/930 of the MLI region 915 may be formed to provide electrical contact to the metal layers 912 in contact with the P-type source/drain regions 814, and the portion 928 of the MLI region 915 may be formed to provide electrical contact to the metal layer 914 in contact with the gate electrode of the gate stack 818.

Figure 42:
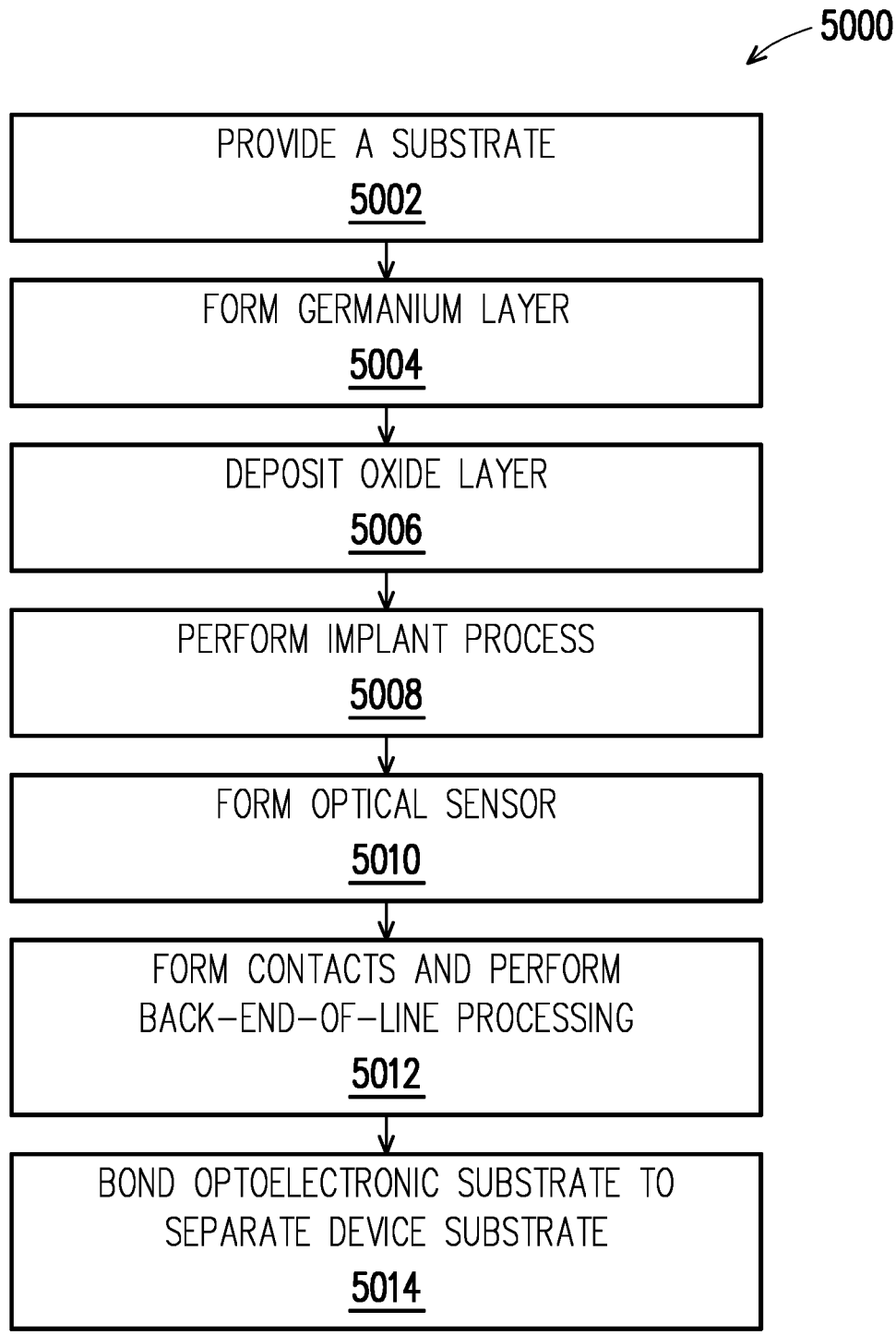
Figure 43:
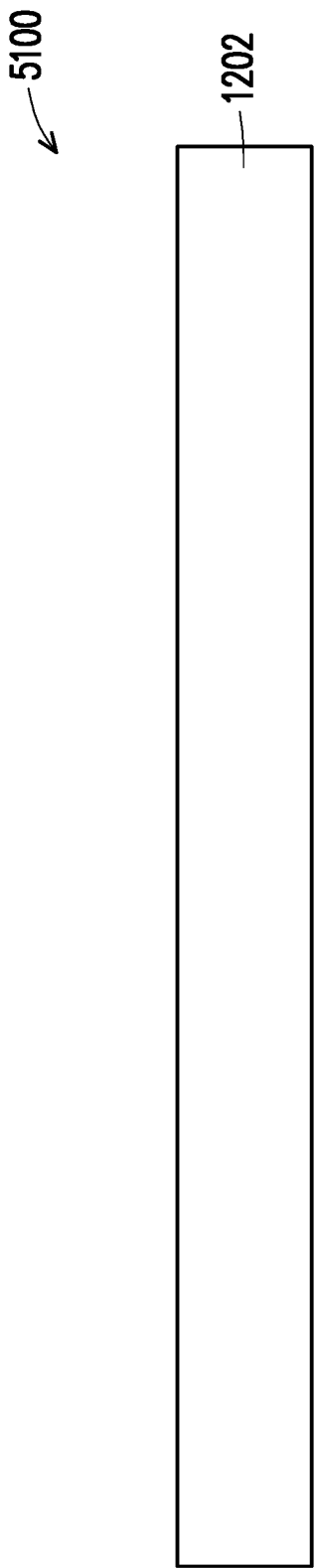
FIGS. 43, 44, 45, 46, 47, 48, and 49 are cross-section views of an exemplary device fabricated according to one or more steps of the method of FIG. 42.
Figure 44:
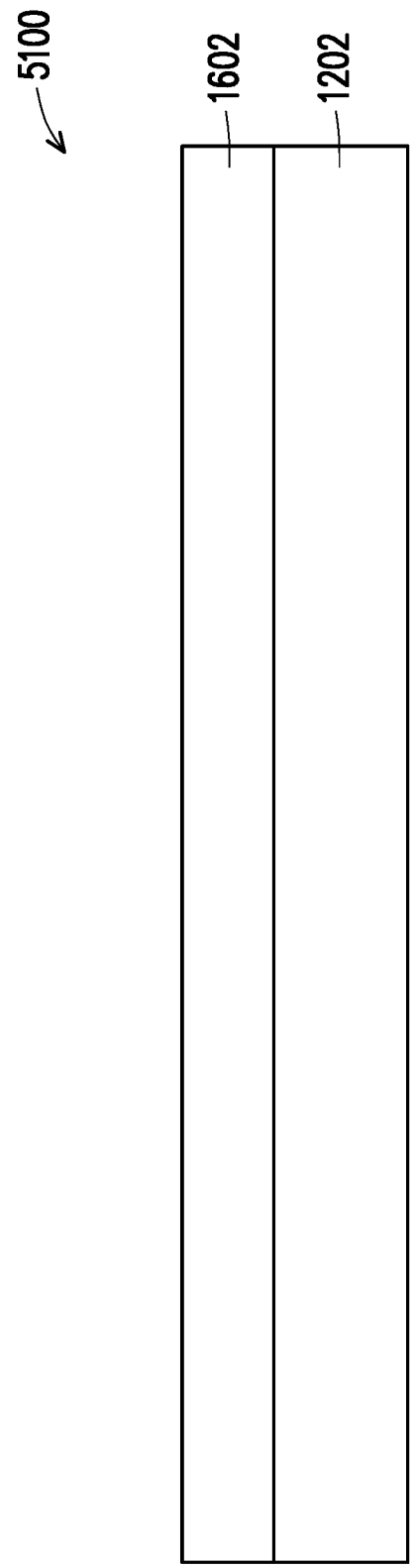
Figure 45:
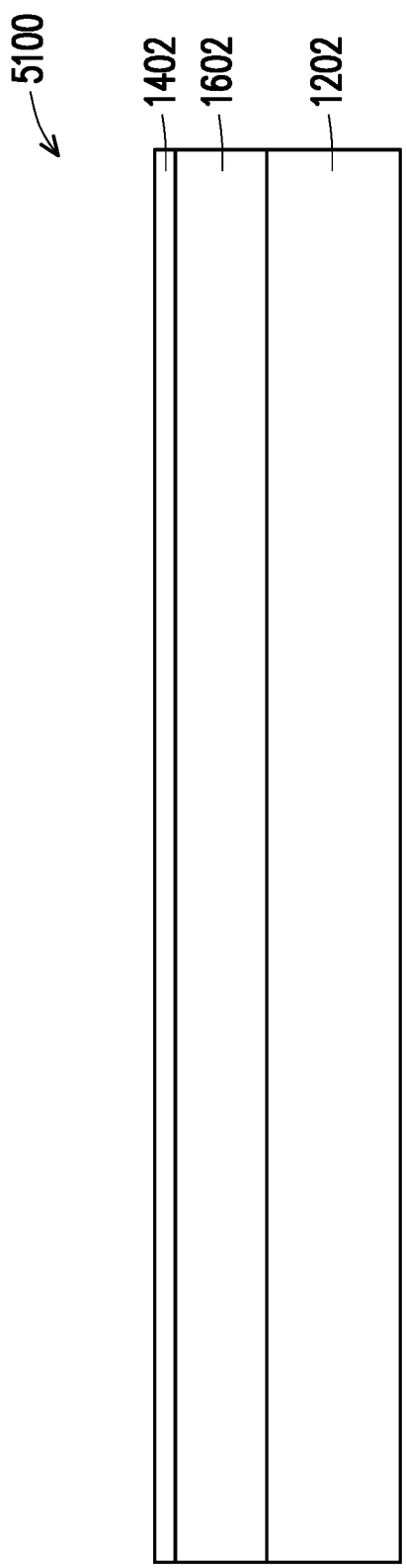
Figure 46:
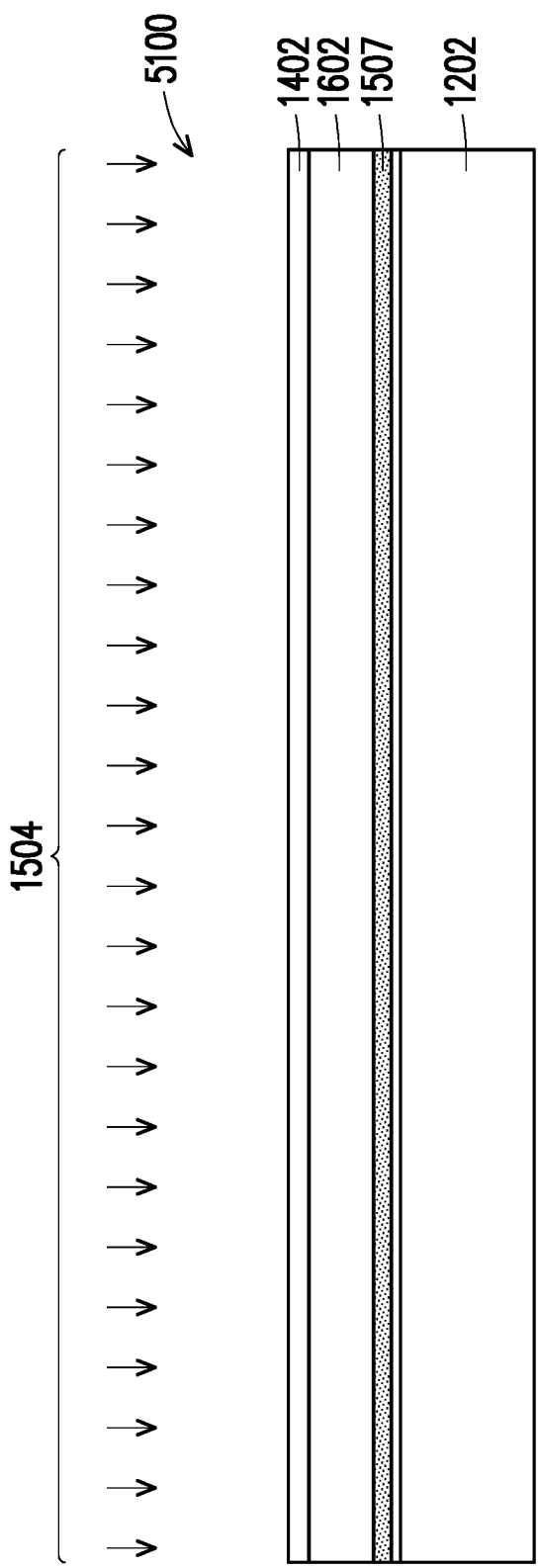
Figure 47:
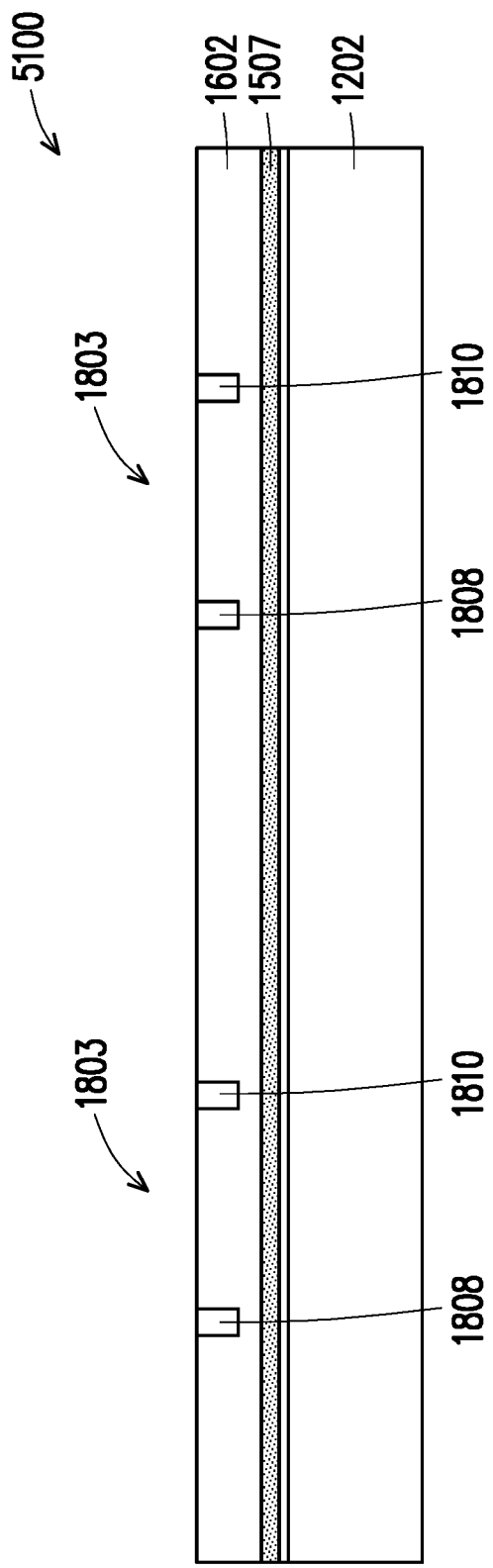
Figure 48:
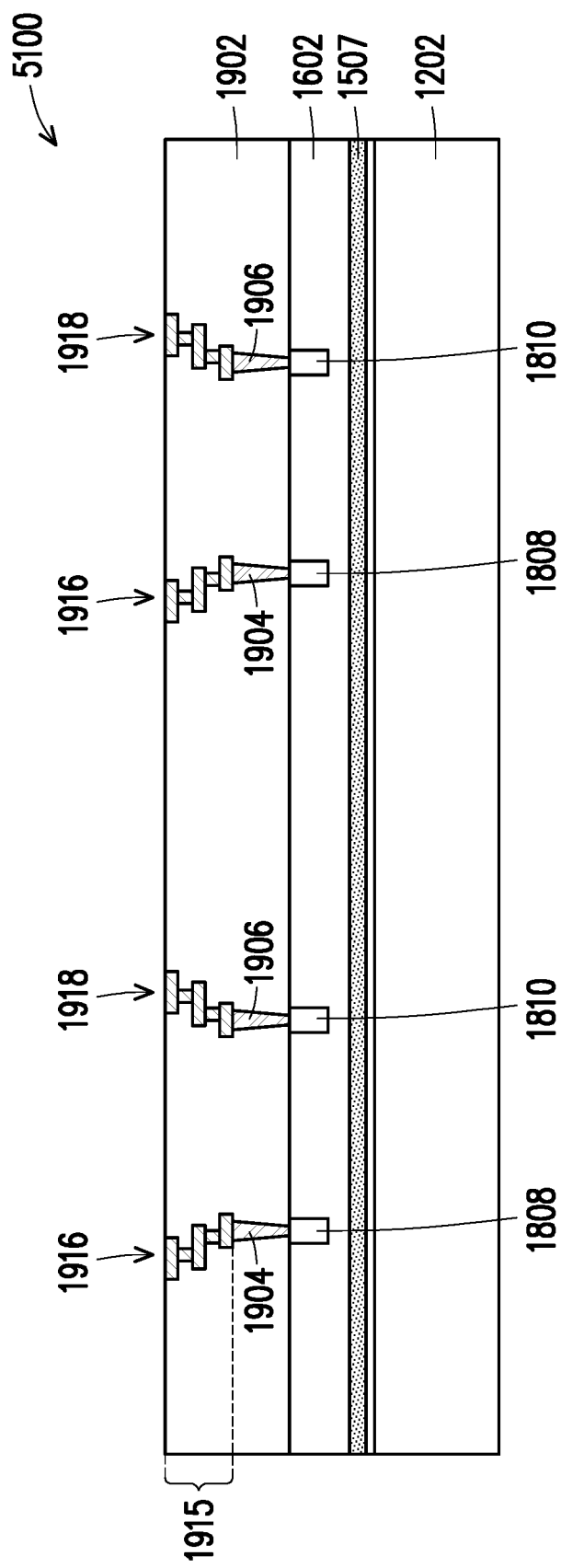
Figure 49:
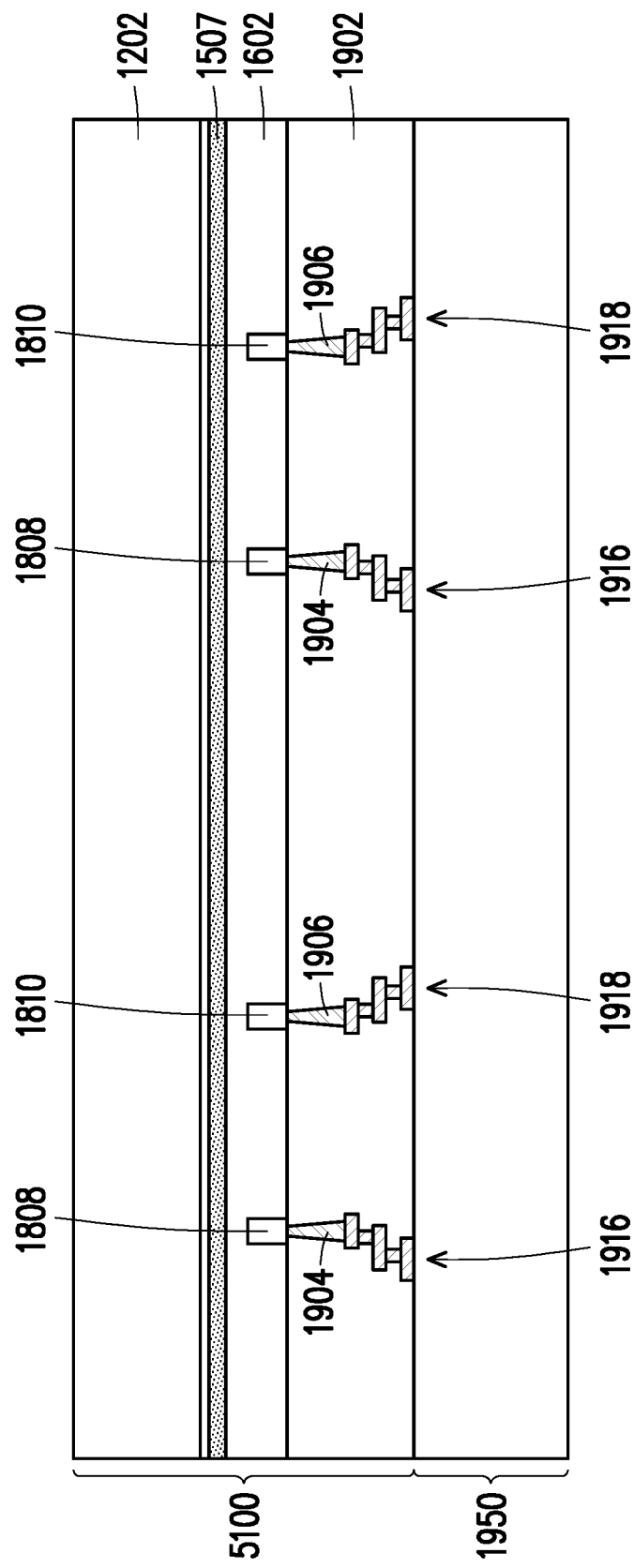

Referring now to FIG. 42, illustrated is a method 5000 of fabricating a semiconductor device 5100 including a Ge-based optical sensor, in accordance with some embodiments. The method 5000 is discussed below with reference to FIGS. 43-49, which provide cross-section views of the semiconductor device 5100, at various stages of fabrication, according to one or more steps of the method 5000. As previously noted, the method 5000 in certain respects mirrors the method 1000, discussed above. Thus, for clarity of discussion, certain aspects of the method 5000 are only discussed briefly. Also, for the sake of clarity of discussion, various reference numerals and/or letters used above in the discussion of the method 1000 are repeated in the discussion of the method 5000, when referring to similar features.

The method 5000 begins at block 5002 where a substrate is provided. In some embodiments, block 5002 of the method 5000 is substantially the same as block 1002 of the method 1000. Thus, with reference to the example of FIG. 43, in an embodiment of block 5002, the substrate 1202 is provided. The substrate 1202 may be a silicon substrate or other substrate, as described above. Further, the substrate 1202 may include a dedicated optoelectronic substrate including one or more optoelectronic devices (e.g., such as photodiodes) associated with one or more imaging pixels, as described above. In at least some embodiments, the substrate 1202 may also include one or more logic devices and/or circuits. In some embodiments, a separate device substrate may be bonded to the optoelectronic substrate at a later stage of processing.

The method 5000 then proceeds to block 5004 where a germanium layer is formed. In some embodiments, block 5004 of the method 5000 is similar to block 1008 of the method 1000. With reference to the example of FIG. 44, in an embodiment of block 5004, the germanium (Ge) layer 1602 is formed over the substrate 1202. In some examples, the Ge layer 1602 includes an intrinsic Ge layer. In some embodiments, a CMP process may be optionally performed to planarize and/or thin the Ge layer 1602. Thus, in contrast to the method 1000, the method 5000 forms the Ge layer 1602 prior to formation of an implant region at the Ge—Si interface, as described below.

The method 5000 then proceeds to block 5006 where an oxide layer is deposited. In some embodiments, block 5006 of the method 5000 is similar to block 1004 of the method 1000. With reference to the example of FIG. 45, in an embodiment of block 5006, the oxide layer 1402 is deposited over the Ge layer 1602. The oxide layer 1402 may be used to control a depth (e.g., projected range) of a subsequently performed ion implantation process.

The method 5000 then proceeds to block 5008 where an ion implantation process is performed. In some embodiments, block 5008 of the method 5000 is similar to block 1006 of the method 1000. With reference to the example of FIG. 46, in an embodiment of block 5008, the ion implantation process 1504 is performed into the device 5100. The dopant species used for the ion implantation process 1504, in some examples, may include a P-type material (e.g., Group IIIA (e.g., boron (B), aluminum (Al), gallium (Ga), indium (In)), BF$_2$) and/or a Group VIIA material (e.g., fluorine (F), chlorine(Cl), bromine(Br)). As a result of the ion implantation process 1504, an implant region 1507 is formed within and along a bottom portion of the Ge layer 1602 proximate to the Ge—Si interface. Thus, the implant region 15070 defines an ion-implanted Ge region. After forming the implant region 1507, the oxide layer 1402 may be removed.

In some embodiments, the P-type material used to form the implant region 1507 may be used to change a carrier concentration of the Ge layer 1602 (e.g., at least the bottom portion of the Ge layer 1602, such that the Ge—Si interface is optimized and electrons in Si are substantially blocked from entering the Ge layer. In some cases, the Group VIIA material used to form the implant region 1507 may be used to neutralize trapped charges within the Ge layer 1602 which may be trapped by defects (e.g., dangling bonds) along the bottom surface of the Ge layer 1602 proximate to the Ge—Si interface such that the Ge—Si interface is optimized and electrons in Si are substantially blocked from entering the Ge layer.

The method 5000 then proceeds to block 5010 where an optical sensor is formed. In some embodiments, block 5010 of the method 5000 is similar to block 1010 of the method 1000. With reference to the example of FIG. 47, in an embodiment of block 5010, one or more optical sensors 1803 are formed within the Ge layer 1602. In some embodiments, the one or more optical sensors 1803 may include Ge optical sensors such as a Ge photodiodes (PDs). Each of the one or more optical sensors 1803 may include an N-type region 1808 (cathode) and a P-type region 1810 (anode) formed within the Ge layer 1602. The one or more optical sensors 1803 may include a P—I—N Ge PD (or simply a P—N Ge PD).

In various embodiments, a total current through the one or more optical sensors 1803 is the sum of the dark current and the photocurrent. However, in accordance with some embodiments, the implant region 1507, disposed proximate to the Ge—Si interface (e.g., within the Ge layer 1602), serves to effectively block current (electrons) from the substrate 1202 (e.g., such as Si) from entering the Ge layer 1602. As a result, the dark current component of the total current through the one or more optical sensors 1803 is reduced, and performance of the one or more optical sensors 1803 is improved.

The method 5000 then proceeds to block 5012 where contacts are formed and BEOL processing is performed. In some embodiments, block 5012 of the method 5000 is similar to block 1012 of the method 1000. With reference to the example of FIG. 48, in an embodiment of block 5012, the dielectric layer 1902 is formed over the substrate 1202 and over of the one or more optical sensors 1803.

In various examples, the dielectric layer 1902 may be patterned to form openings within which metal layers may be deposited to provide electrical contact to underlying substrate features. For example, the metal layer 1904 may be formed to provide electrical contact to the N-type regions 1808, and the metal layer 1906 may be formed to provide electrical contact to the P-type regions 1810.

Thereafter, multilayer interconnect features may be formed. As discussed above, portions 1916 of the MLI region 1915 may be formed to provide electrical contact to the metal layers 1904 in contact with the N-type regions 1808, and portions 1918 of the MLI region 1915 may be formed to provide electrical contact to the metal layers 1906 in contact with the P-type regions 1810.

The method 5000 then proceeds to block 5014 where the optoelectronic substrate is bonded to a separate device substrate. In some embodiments, block 5014 of the method 5000 is similar to block 1014 of the method 1000. With reference to the example of FIG. 49, in an embodiment of block 5014, the device 5100 (which includes the optoelectronic substrate) is bonded to the separate device substrate 1950, as described above, which may include core (logic) transistors and circuits, among other devices. In some cases, one or more devices within the optoelectronic substrate (the device 5100) may be coupled to one or more devices in the separate device substrate 1950 after the bonding process of block 5014, for example, to collectively define a pixel circuit or other optoelectronic circuit.

Figure 50:
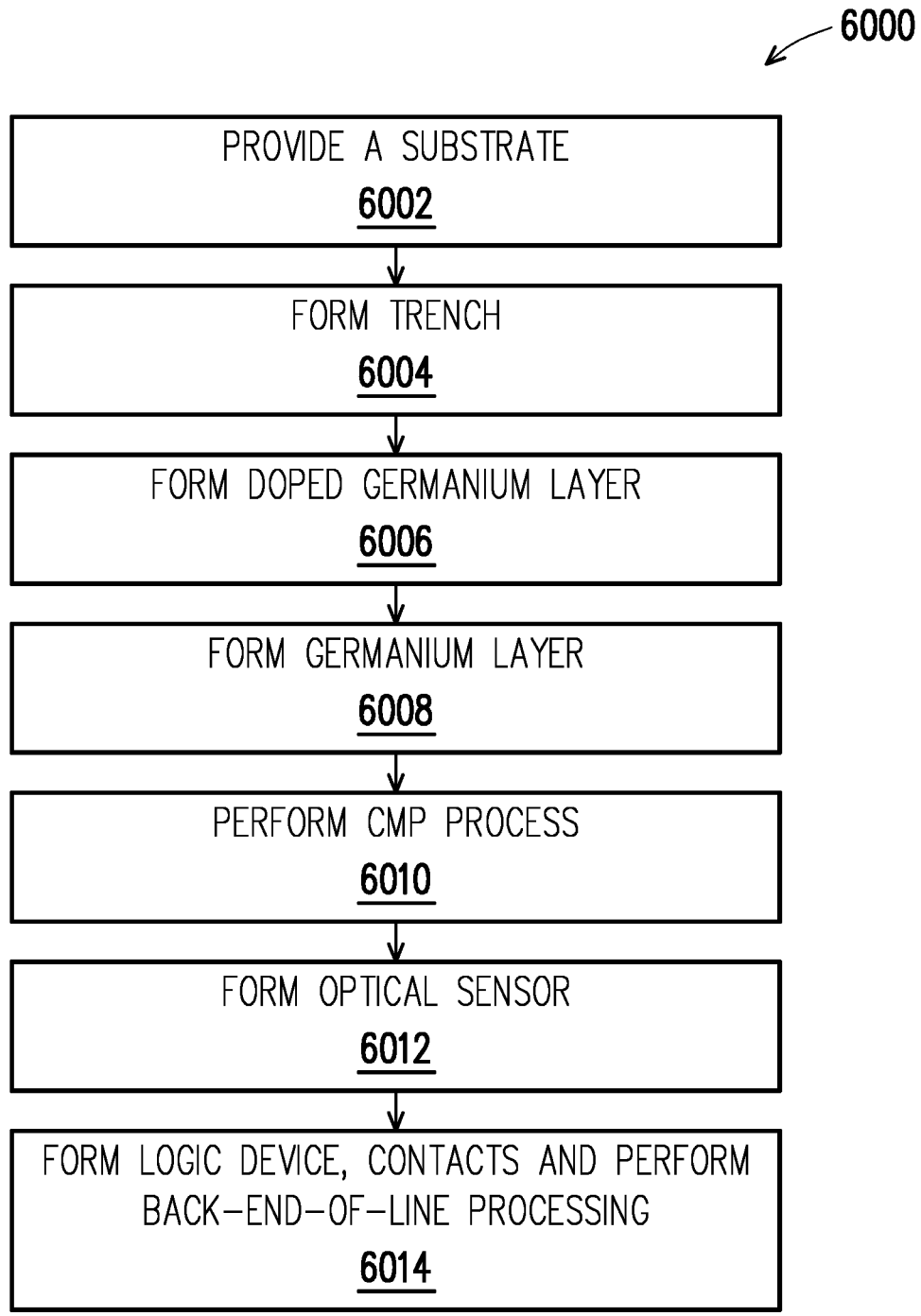

Referring now to FIG. 50, illustrated is a method 6000 of fabricating a semiconductor device 6100 including a Ge-based optical sensor, in accordance with some embodiments. The method 6000 is discussed below with reference to FIGS. 51-57, which provide cross-section views of the semiconductor device 6100, at various stages of fabrication, according to one or more steps of the method 6000. As previously noted, the method 6000 in certain respects mirrors the method 2000, discussed above. For example, in the illustrated embodiment, the method 6000 is the same as the method 2000 except instead of epitaxially growing a doped Si layer in the trench (block 2006 of method 2000), the method 6000 includes epitaxial growth of a doped Ge layer in the trench (block 6006 of the method 6000). Thus, for clarity of discussion, the method 6000 is only very discussed briefly. Also, for the sake of clarity of discussion, various reference numerals and/or letters used above in the discussion of the method 2000 are repeated in the discussion of the method 6000, when referring to similar features.

The method 6000 begins at block 6002 where a substrate is provided. Referring to the example of FIG. 51, in an embodiment of block 6002, the substrate 2202 is provided, as described above. The substrate 2202 also includes an optoelectronic region 2204 (pixel region) and a logic region 2206.

The method 6000 then proceeds to block 6004 where a trench is formed. With reference to the example of FIG. 52, in an embodiment of block 6004, the trench 2302 is formed within the optoelectronic region 2204, as described above. The patterned HM layer 2304 is also illustrated.

The method 6000 then proceeds to block 6006 where a doped germanium layer is formed. With reference to the example of FIG. 53, in an embodiment of block 6006, a doped germanium (Ge) layer 2507 is formed within the trench 2302 (e.g., including along sidewall and bottom surfaces of the trench 2302). The doped Ge layer 2507, in some examples, may include an epitaxially grown Ge layer. More generally, in some embodiments, the doped Ge layer 2507 is formed by ALD, CVD, MBE, MOCVD, and/or other suitable growth processes. To provide the doping for the doped Ge layer 2507, an appropriate dopant species may be introduced into a process chamber during growth of the Ge layer (e.g., such as in an in situ doping process) to provide the doped Ge layer 2507. In some examples, the dopant species may include a P-type material (e.g., Group IIIA (e.g., boron (B), aluminum (Al), gallium (Ga), indium (In)), $BF_2$) and/or a Group VIIA material (e.g., fluorine (F), chlorine (Cl), bromine(Br)).

The doped Ge layer 2507 will be located proximate to a Ge—Si interface of the subsequently formed Ge PD, as described below. In some embodiments, the P-type material used to form the doped Ge layer 2507 may be used to change a carrier concentration of the Ge PD (e.g., at least along the bottom portion of the Ge PD proximate to the Ge—Si interface), such that the Ge—Si interface is optimized and electrons in Si are substantially blocked from entering the Ge layer. In some cases, the Group VIIA material used to form the doped Ge layer 2507 may be used to neutralize trapped charges within the Ge PD which may be trapped by defects (e.g., dangling bonds) along the bottom portion of the Ge PD proximate to the Ge—Si interface such that the Ge—Si interface is optimized and electrons in Si are substantially blocked from entering the Ge layer.

The method 6000 then proceeds to block 6008 where a germanium layer is formed. With reference to the example of FIG. 54, in an embodiment of block 6008, after formation of the doped Ge layer 2507 along sidewall and bottom surfaces of the trench 2302, the Ge layer 2602 is formed (as described above) within the trench 2302 and over the doped Ge layer 2507. In some examples, the Ge layer 2602 includes an intrinsic Ge layer.

The method 6000 then proceeds to block 6010 where a CMP process is performed. With reference to the example of FIG. 55, in an embodiment of block 6010, a CMP process is performed after formation of the Ge layer 2602. The CMP process serves to remove excess portions of the Ge layer 2602 and planarize a top surface of the device 6100. In some embodiments, the CMP process of block 6010 may also serve to remove the HM layer 2304, as shown. As a result of the CMP process, a top surface of the substrate 2202 (e.g., adjacent to the trench 2302), a top surface of the Ge layer 2602, and top surfaces of portions of the doped Ge layer 2507 along sidewall surfaces of the trench 2302 are substantially co-planar (level) with each other.

The method 6000 then proceeds to block 6012 where an optical sensor is formed. With reference to the example of FIG. 56, in an embodiment of block 6012, an optical sensor 2803 is formed in the optoelectronic region 2204 within the Ge layer 2602. In some embodiments, the optical sensor 2803 may include a Ge optical sensor such as a Ge photodiode (PD). The optical sensor 2803 may include the N-type region 2808 (cathode) and the P-type region 2810 (anode) formed within the Ge layer 2602. The N-type region 2808 and the P-type region 2810 may be formed in substantially the same manner as described above. In addition, the optical sensor 2803 may include a P—I—N Ge PD (or simply a P—N Ge PD).

In various embodiments, a total current through the optical sensor 2803 (Ge PD) is the sum of the dark current and the photocurrent. However, in accordance with some embodiments, the doped Ge layer 2507, disposed proximate to the Ge—Si interface, serves to effectively block current (electrons) from the substrate 2202 (e.g., such as Si) from entering the Ge PD (e.g., including the Ge layer 2602). As a result, the dark current component of the total current through the optical sensor 2803 is reduced, and performance of the optical sensor 2803 is improved.

The method 6000 then proceeds to block 6014 where a logic device is formed, contacts are formed, and BEOL processing is performed. With reference to the example of FIG. 57, in an embodiment of block 6014, logic devices 2804, 2806 are formed within the logic region 2206, as described above.

In at least some examples, an ion implantation process used to form the N-type source/drain regions 2812 may simultaneously form the N-type region 2808 within the Ge layer 2602. Also, in some embodiments, an ion implantation process used to form the P-type source/drain regions 2814 may simultaneously form the P-type region 2810 within the Ge layer 2602. In some examples, separate ion implantation processes may be performed for the N-type source/drain regions 2812 and the N-type region 2808, and separate ion implantation processes may be performed for the P-type source/drain regions 2814 and the P-type region 2810.

Figure 57:
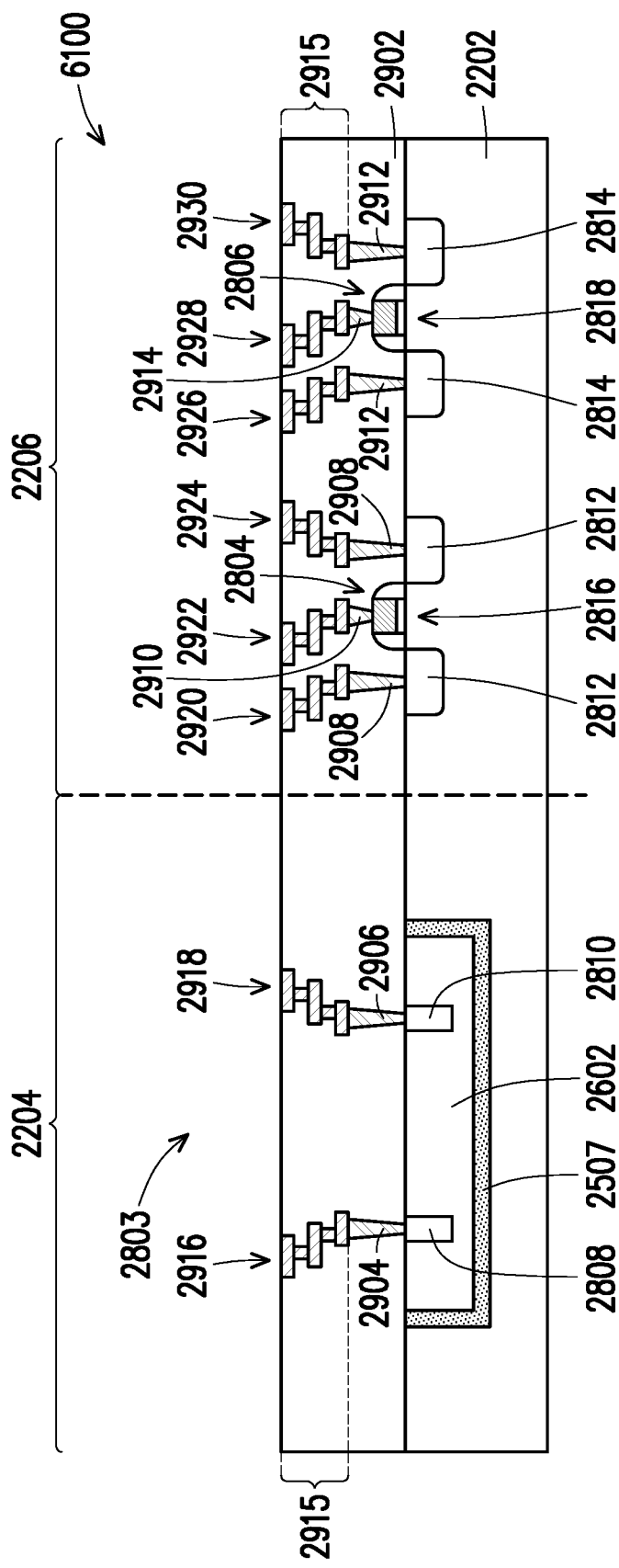

In a further embodiment of block 6014, and still with reference to the example of FIG. 57, the dielectric layer 2902 is formed over the substrate 2202 and over each of the optical sensor 2803 within the optoelectronic region 2204 and the logic devices 2804, 2806 within the logic region 2206. The dielectric layer 2902 may be patterned to form openings within which metal layers may be deposited to provide electrical contact to underlying substrate features, as described above. After forming the contacts to the underlying substrate features (e.g., including the metal layers 2904, 2906, 2908, 2910, 2912, 2914), further BEOL processing may be performed. In some embodiments, the further BEOL processing may include formation of the MLI region 2915, which includes the portions 2916, 2918, 2920, 2922, 2924, 2926, 2928, and 2930, as described above.

Figure 58:
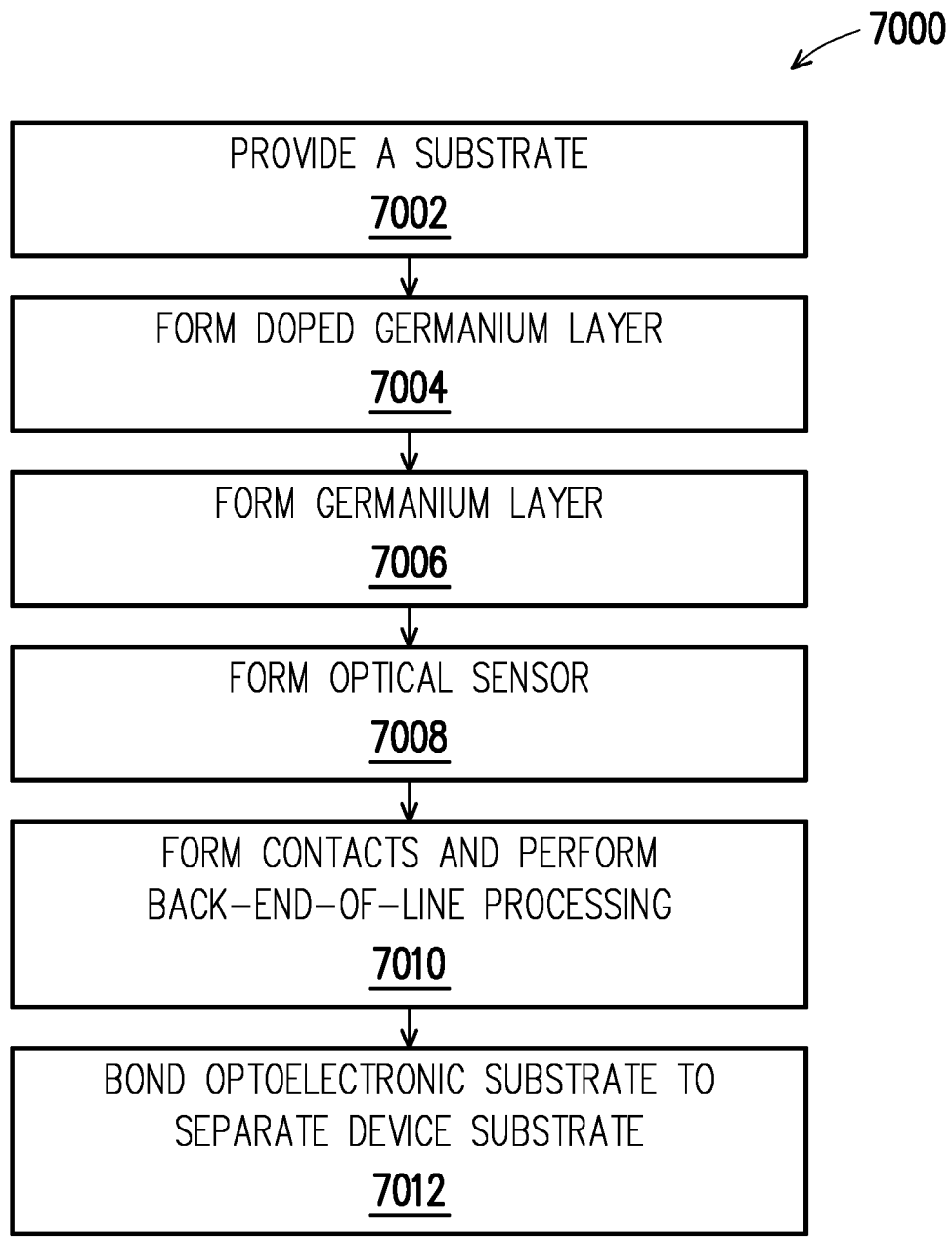
Figure 63:
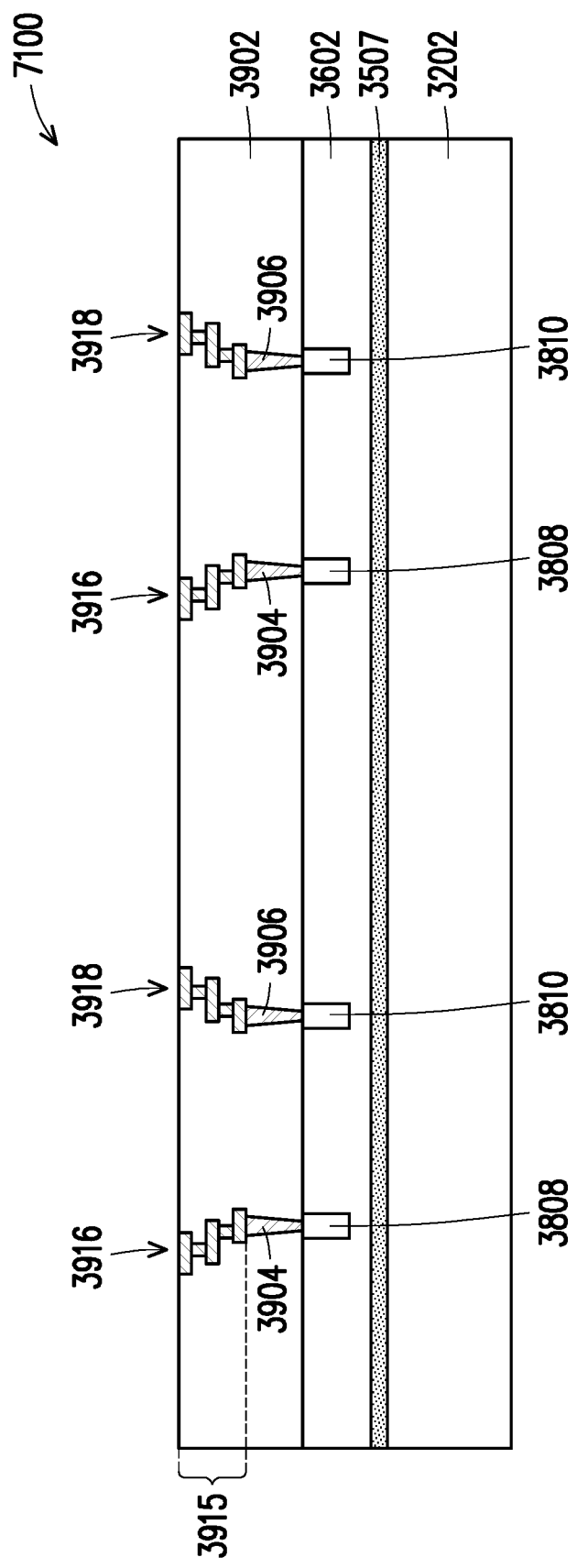
Figure 64:
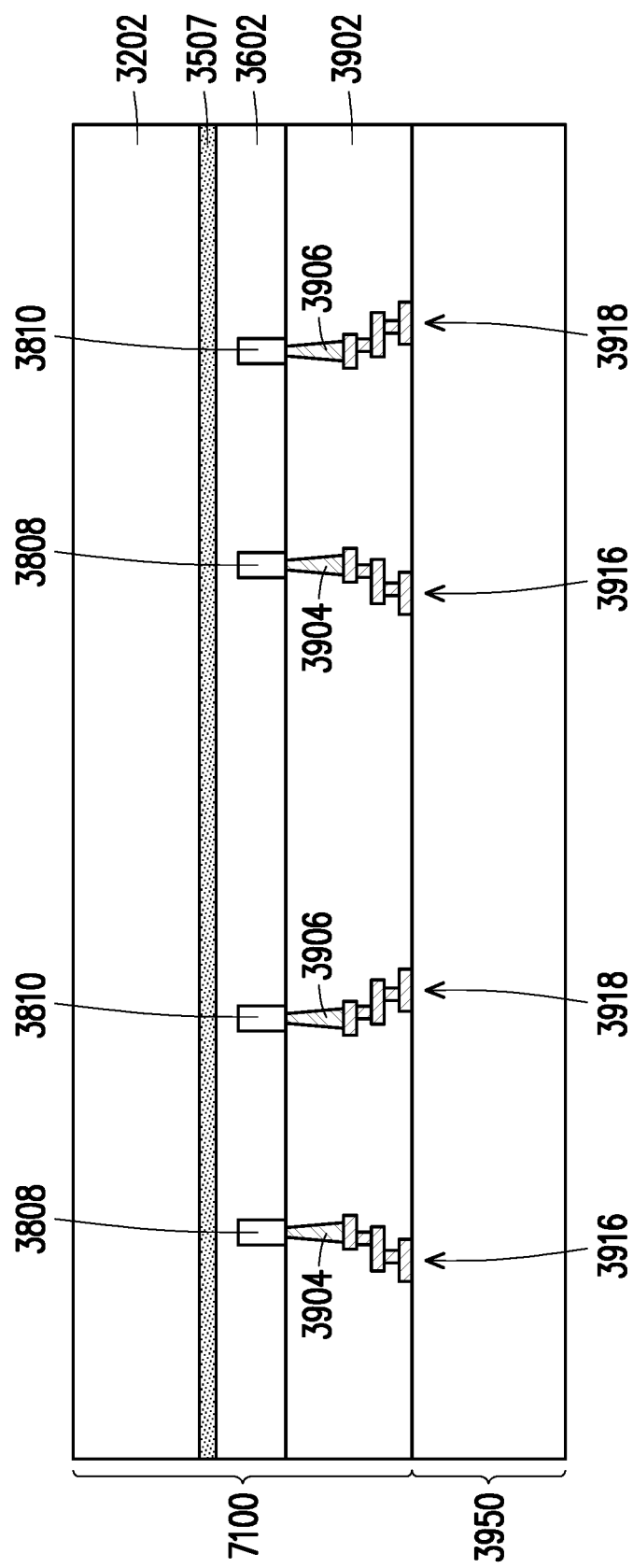

Referring now to FIG. 58, illustrated is a method 7000 of fabricating a semiconductor device 7100 including a Ge-based optical sensor, in accordance with some embodiments. The method 7000 is discussed below with reference to FIGS. 59-64, which provide cross-section views of the semiconductor device 7100, at various stages of fabrication, according to one or more steps of the method 7000. As previously noted, the method 7000 in certain respects mirrors the method 3000, discussed above. For example, in the illustrated embodiment, the method 7000 is the same as the method 3000 except instead of epitaxially growing a doped Si layer over a substrate (block 3004 of method 3000), the method 7000 includes epitaxial growth of a doped Ge layer over the substrate (block 7004 of the method 7000). Thus, for clarity of discussion, the method 7000 is only very discussed briefly. Also, for the sake of clarity of discussion, various reference numerals and/or letters used above in the discussion of the method 3000 are repeated in the discussion of the method 7000, when referring to similar features.

The method 7000 begins at block 7002 where a substrate is provided. Referring to the example of FIG. 59, in an embodiment of block 7002, the substrate 3202 is provided, as described above. In some embodiments, the substrate 3202 of the device 7100 may include a dedicated optoelectronic substrate including one or more optoelectronic devices (e.g., such as photodiodes) associated with one or more imaging pixels. To be sure, in at least some embodiments, the substrate 3202 may also include one or more logic devices and/or circuits.

The method 7000 then proceeds to block 7004 where a doped germanium layer is formed. With reference to the example of FIG. 60, in an embodiment of block 7004, a doped germanium (Ge) layer 3507 is formed over the substrate 3202. The doped Ge layer 3507, in some examples, may include an epitaxially grown Ge layer. More generally, in some embodiments, the doped Ge layer 3507 is formed by ALD, CVD, MBE, MOCVD, and/or other suitable growth processes. To provide the doping for the doped Ge layer 3507, an appropriate dopant species may be introduced into a process chamber during growth of the Si layer (e.g., such as in an in situ doping process) to provide the doped Ge layer 3507. In some examples, the dopant species may include a P-type material (e.g., Group IIIA (e.g., boron (B), aluminum (Al), gallium (Ga), indium (In)), BF$_2$) and/or a Group VIIA material (e.g., fluorine (F), chlorine(Cl), bromine(Br)).

The doped Ge layer 3507 will be located proximate to a Ge—Si interface of the subsequently formed Ge PD, as described below. In some embodiments, the P-type material used to form the doped Ge layer 3507 may be used to change a carrier concentration of the Ge PD (e.g., at least along the bottom portion of the Ge PD proximate to the Ge—Si interface), such that the Ge—Si interface is optimized and electrons in Si are substantially blocked from entering the Ge layer. In some cases, the Group VIIA material used to form the doped Ge layer 3507 may be used to neutralize trapped charges within the Ge PD which may be trapped by defects (e.g., dangling bonds) along the bottom portion of the Ge PD proximate to the Ge—Si interface such that the Ge—Si interface is optimized and electrons in Si are substantially blocked from entering the Ge layer.

The method 7000 then proceeds to block 7006 where a germanium layer is formed. With reference to the example of FIG. 61, in an embodiment of block 7006, after formation of the doped Ge layer 3507 over the substrate 3202, the Ge layer 3602 is formed (as described above) over the doped Ge layer 3507. In some examples, the Ge layer 3602 includes an intrinsic Ge layer. In some embodiments, a CMP process may be optionally performed to planarize and/or thin the Ge layer 3602.

The method 7000 then proceeds to block 7008 where an optical sensor is formed. With reference to the example of FIG. 62, in an embodiment of block 7008, one or more optical sensors 3803 are formed within the Ge layer 3602. In some embodiments, the one or more optical sensors 3803 may include Ge optical sensors such as a Ge photodiodes (PDs). Each of the one or more optical sensors 3803 may include the N-type region 3808 (cathode) and the P-type region 3810 (anode) formed within the Ge layer 3602, in substantially the same manner as described above. In addition, the one or more optical sensors 3803 may include a P—I—N Ge PD (or simply a P—N Ge PD).

In various embodiments, a total current through the one or more optical sensors 3802 (Ge PDs) is the sum of the dark current and the photocurrent. However, in accordance with some embodiments, the doped Ge layer 3507, disposed proximate to the Ge—Si interface, serves to effectively block current (electrons) from the substrate 3202 (e.g., such as Si) from entering the Ge PD (e.g., including the Ge layer 3602). As a result, the dark current component of the total current through the one or more optical sensors 3803 is reduced, and performance of the one or more optical sensors 3803 is improved.

The method 7000 then proceeds to block 7010 where contacts are formed and BEOL processing is performed. With reference to the example of FIG. 63, in an embodiment of block 7010, the dielectric layer 3902 is formed over the substrate 3202 and over of the one or more optical sensors 3803. The dielectric layer 3902 may be patterned to form openings within which metal layers may be deposited to provide electrical contact to underlying substrate features, as described above. After forming the contacts to the underlying substrate features (e.g., including the metal layers 3904, 3906), further BEOL processing may be performed. In some embodiments, the further BEOL processing may include formation of the MLI region 3915, which includes the portions 3916 and 3918, as described above.

The method 7000 then proceeds to block 7012 where the optoelectronic substrate is bonded to a separate device substrate. With reference to the example of FIG. 64, in an embodiment of block 7012, the device 7100 (which includes the optoelectronic substrate) is bonded to the separate device substrate 3950, as described above, which may include core (logic) transistors and circuits, among other devices. In some cases, one or more devices within the optoelectronic substrate (the device 7100) may be coupled to one or more devices in the separate device substrate 3950 after the bonding process of block 7012, for example, to collectively define a pixel circuit or other optoelectronic circuit.

While the examples above described various methods of doping the Ge—Si interface, for example, by implanting a dopant species within Si or Ge at a Ge—Si interface of a Ge PD, or by epitaxially growing a doped Si layer or a doped Ge layer at the Ge—Si interface of the Ge PD, such examples are not meant to be limiting, and other embodiments may similarly fall within the scope of the present disclosure. For example, in some cases and for a given Ge PD, the Ge—Si interface may include (i) both an implanted Si layer and an implanted Ge layer, (ii) both a doped epitaxial Si layer and a doped epitaxial Ge layer, (iii) an implanted Si layer and a doped epitaxial Si layer, (iv) an implanted Ge layer and a doped epitaxial Ge layer, (v) an implanted Si layer and a doped epitaxial Ge layer, (vi) an implanted Ge layer and a doped epitaxial Si layer, or any other suitable combination of ion-implanted layers and doped epitaxial layer. In addition, in various embodiments, the ion-implanted Si layer may be formed such that it abuts the Ge—Si interface or is spaced a distance away from the Ge—Si interface. Similarly, in some examples, the ion-implanted Ge layer may be formed such that is abuts the Ge—Si interface or is spaced a distance away from the Ge—Si interface.

The various embodiments described herein offer several advantages over the existing art. It will be understood that not all advantages have been necessarily discussed herein, no particular advantage is required for all embodiments, and other embodiments may offer different advantages. For example, embodiments discussed herein include structures and methods for passivating interfaces between various semiconductor layers to reduce dark current and improve device performance. In some embodiments, the passivated interface includes a Ge—Si interface of a Ge PD. In various embodiments, passivation of the Ge—Si interface may be accomplished by doping the Ge—Si interface, for example, by way of ion implantation of Ge or Si at the Ge—Si interface, or by epitaxial growth of a doped Si layer or a doped Ge layer at the Ge—Si interface. In some embodiments, the dopant species used for doping the Ge—Si interface may include a P-type material (e.g., Group IIIA (e.g., boron (B), aluminum (Al), gallium (Ga), indium (In)), $BF_2$) or a Group VIIA material (e.g., fluorine (F), chlorine (Cl), bromine(Br)). By introducing one or more of these dopant species into the Ge—Si interface, in accordance with one or more of the methods described herein, the Ge—Si interface can be optimized to substantially prevent electrons in the Si layer from entering the Ge layer (including the Ge PD). As a result, the issue of leakage current and dark current in Ge-based sensors is significantly mitigated. In at least some examples, the leakage current/dark current of the Ge-based sensor is reduced/improved by about 10%.

Thus, one of the embodiments of the present disclosure described a method including providing a substrate having a pixel region and a logic region. In some embodiments, the method further includes forming a trench within the pixel region. In various examples, and after forming the trench, the method further includes forming a doped semiconductor layer along sidewalls and along a bottom surface of the trench. In some embodiments, the method further includes forming a germanium layer within the trench and over the doped semiconductor layer. In some examples, and after forming the germanium layer, the method further includes forming an optical sensor within the germanium layer.

In another of the embodiments, discussed is a method including providing a substrate and forming a germanium layer over the substrate. In some embodiments, and after forming the germanium layer, the method further includes forming a doped layer along a bottom portion of the germanium layer, where the forming the doped layer includes performing an ion implantation process into the germanium layer. In some examples, and after forming the doped layer, the method further includes forming an optical sensor within the germanium layer.

In yet another of the embodiments, discussed is a semiconductor device including a silicon substrate having a pixel region and a logic region adjacent to the pixel region. In some embodiments, the semiconductor device further includes a germanium layer formed in a trench within the Si substrate disposed within the pixel region, where a Ge—Si interface is defined along sidewalls and along a bottom surface of the trench, and where a sensor is disposed within the Ge layer. In some cases, the semiconductor device further includes a doped region disposed proximate to the Ge—Si interface, where the doped region substantially blocks electrons within the Si substrate from entering the Ge layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a substrate including a pixel region and a logic region;
    forming a trench within the pixel region;
    after forming the trench, forming a doped semiconductor layer along sidewalls and along a bottom surface of the trench;
    forming an undoped germanium layer within the trench and over the doped semiconductor layer, wherein the undoped germanium layer substantially fills the trench; and
    after forming the undoped germanium layer, forming an optical sensor within the undoped germanium layer.

2. The method of claim 1, wherein the forming the doped semiconductor layer includes performing an ion implantation process into the sidewalls and the bottom surface of the trench.

3. The method of claim 2, further comprising prior to performing the ion implantation process, forming an oxide layer over the sidewalls and the bottom surface of the trench.

4. The method of claim 3, further comprising prior to forming the undoped germanium layer, removing the oxide layer.

5. The method of claim 2, wherein the ion implantation process forms a doped silicon (Si) layer along the sidewalk and the bottom surface of the trench.

6. The method of claim 1, wherein the forming the doped semiconductor layer includes epitaxially growing a doped Si layer along the sidewalls and the bottom surface of the trench.

7. The method of claim 1, wherein the forming the doped semiconductor layer includes epitaxially growing a doped germanium (Ge) layer along the sidewalls and the bottom surface of the trench.

8. The method of claim 1, wherein the doped semiconductor layer includes at least one of a P-type material and Group VIIA material.

9. The method of claim 8, wherein the P-type material includes boron (B), aluminum (Al), gallium (Ga), indium (In) and $BF_2$.

10. The method of claim 8, wherein the Group VIIA material includes fluorine (F), chlorine(Cl), and bromine (Br).

11. A method, comprising:
    providing a substrate;
    forming a germanium layer over the substrate;
    after forming the germanium layer, forming a doped layer along a bottom portion of the germanium layer, the doped layer spaced a distance from an interface between the germanium layer and the substrate, wherein the forming the doped layer includes performing an ion implantation process into the germanium layer; and
    after forming the doped layer, forming an optical sensor within the germanium layer.

12. The method of claim 11, further comprising prior to performing the ion implantation process, forming an oxide layer over germanium layer.

13. The method of claim 12, further comprising prior to forming the optical sensor, removing the oxide layer.

14. The method of claim 11, further comprising after forming the optical sensor, forming contacts and multilayer interconnect features coupled to the optical sensor.

15. The method of claim 14, further comprising after forming the contacts and multilayer interconnect features, bonding the substrate including the optical sensor to a separate device substrate.

16. The method of claim 11, wherein the doped layer includes at least one of a P-type material and Group VIIA material.

17. The method of claim 11, further comprising prior to forming the germanium layer, forming a trench within a pixel region of the substrate and forming the germanium layer within the trench.

18. A semiconductor device, comprising:
- a silicon (Si) substrate including a pixel region and a logic region adjacent to the pixel region;
- a germanium (Ge) layer formed in a trench within the Si substrate disposed within the pixel region, wherein a Ge—Si interface is defined along sidewalls and along a bottom surface of the trench, and wherein a sensor is disposed within the Ge layer, the sensor including an anode and a cathode embedded within the Ge layer; and
- a doped region separate from the anode and the cathode, wherein the doped region is disposed proximate to, and spaced a distance from a portion of the Ge—Si interface defined along the bottom surface of the trench, and wherein the doped region substantially blocks electrons within the Si substrate from entering the Ge layer.

19. The semiconductor device of claim 18, wherein the doped region is disposed on a germanium side of the Ge—Si interface or on a silicon side of the Ge—Si interface.

20. The semiconductor device of claim 18, wherein the doped region includes at least one of a P-type material and Group VIIA material, wherein the P-type material includes boron (B), aluminum (Al), gallium (Ga), indium (In) and $BF_2$, and wherein the Group VIIA material includes fluorine (F), chlorine(Cl), and bromine(Br).

* * * * *